United States Patent [19]
Horiguchi et al.

[11] Patent Number: 5,179,539
[45] Date of Patent: Jan. 12, 1993

[54] LARGE SCALE INTEGRATED CIRCUIT HAVING LOW INTERNAL OPERATING VOLTAGE

[75] Inventors: Masashi Horiguchi, Kawasaki; Masakazu Aoki, Tokorozawa; Kiyoo Itoh, Higashikurume; Yoshinobu Nakagome, Hachioji; Norio Miyake, Higashimurayama; Takaaki Noda, Kodaira; Jun Etoh, Hachioji; Hitoshi Tanaka, Tachikawa; Shin'ichi Ikenaga, Koganei, all of Japan

[73] Assignee: Hitachi, Ltd., Hitachi Vlsi Engineering Corporation, Tokyo, Japan

[21] Appl. No.: 865,677

[22] Filed: Apr. 8, 1992

Related U.S. Application Data

[60] Continuation of Ser. No. 621,991, Dec. 4, 1990, abandoned, which is a division of Ser. No. 323,966, Mar. 15, 1989, Pat. No. 4,994,688.

[30] Foreign Application Priority Data

May 25, 1988 [JP] Japan .................. 63-125742
Dec. 2, 1988 [JP] Japan .................. 63-304152
Jan. 27, 1989 [JP] Japan .................. 1-16148

[51] Int. Cl.$^5$ .................. G11C 11/40; H03K 3/01
[52] U.S. Cl. .................. 365/226; 307/396.8
[58] Field of Search .................. 365/226; 307/296.2, 307/296.4, 296.5, 296.6, 296.8

[56] References Cited

U.S. PATENT DOCUMENTS

| | | | |
|---|---|---|---|
| 3,975,648 | 8/1976 | Tobey, Jr. et al. | 307/296.8 |
| 4,100,437 | 7/1978 | Hoff, Jr. | 307/296.8 |
| 4,260,909 | 4/1981 | Dumbri et al. | 365/228 X |

OTHER PUBLICATIONS

Kiyoo Itoh, et al., "FAM 18.6: An Experimental 1Mb DRAM with On-Chip Voltage Limiter", from ISSCC Digest of Technical Papers, Feb. 1984, pp. 282-283.

Masahide Takada, et al., "FAM 19.6: a 4Mb DRAM with Half Internal-Voltage Bitline Precharge", from ISSCC Digest of Technical Papers, Feb. 1986, pp. 270-271.

Tohru Furuyama, et al., "FAM 19.7: An Experimental 4Mb CMOS DRAM", from ISSCC Digest of Technical Papers, Feb. 1986, pp. 272-273.

Tohru Furuyama, et al., "A New On-Chip Voltage Converter for Submicrometer High-Density DRAM's", from IEEE Journal of Solid-State Circuits, vol. SC-22, No. 3, Jun. 1987, pp. 437-441.

Paul R. Gray, et al., Analysis and Design of Analog Integrated Circuits, 2nd Ed., John Wiley and Sons, Inc., specifically, "Chapter 9: Frequency Response and Stability on Feedback Amplifiers".

Mitsumasa Koyanagi, et al., "A 5-V Only 16-kbit Stacked-Capacitor MOS RAM", from IEEE Journal of Solid-State Circuits, vol. SC-15, No. 4, Aug. 1980, pp. 661-666.

Katsuhiro Shimohigashi, et al., "WAM 1.4: A 65ns DRAM with a Twisted Driveline Sense Amplifier", from ISSCC Digest of Technical Papers, Feb. 1987, pp. 18-19.

*Primary Examiner*—Joseph A. Popek
*Attorney, Agent, or Firm*—Fay, Sharpe, Beall, Fagan, Minnich & McKee

[57] ABSTRACT

Practical structures of an ultra large scale semiconductor integrated (ULSI) circuit especially a dynamic random access memory of 16 M bits or more are involved. The ULSI circuit uses internal operating voltages and how to construct a reference voltage generating circuit and a voltage limiter circuit in the ULSI circuit is a matter of importance. The operation of the reference voltage generating circuit and voltage limiter circuit can be stabilized, characteristics of these circuits are improved, and layout of these circuits as applied to memory cell array, peripheral circuits and the like can be improved. Improved methods of testing these circuits are provided.

21 Claims, 54 Drawing Sheets

F I G. 16A
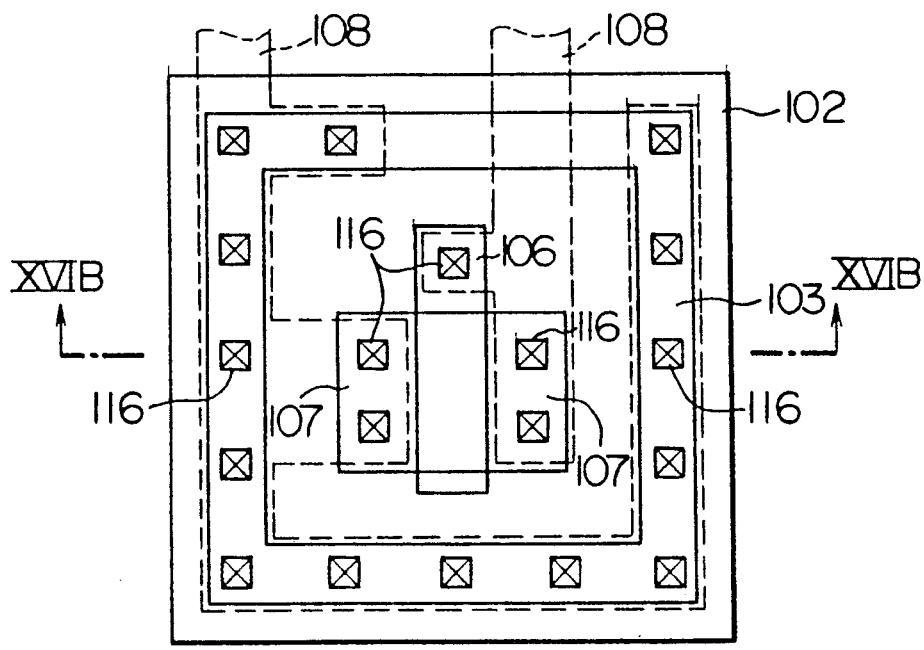
F I G. 16B
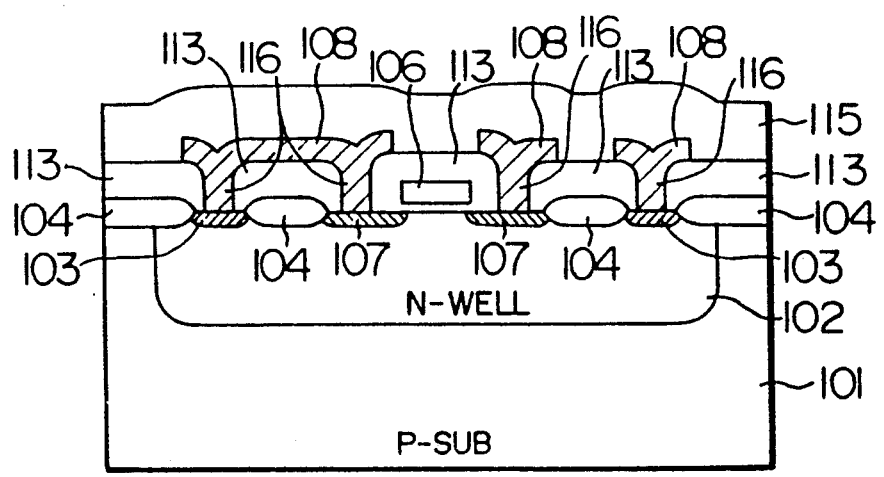

F I G. 22
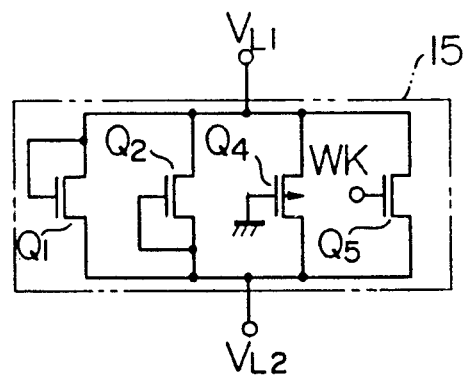
F I G. 23
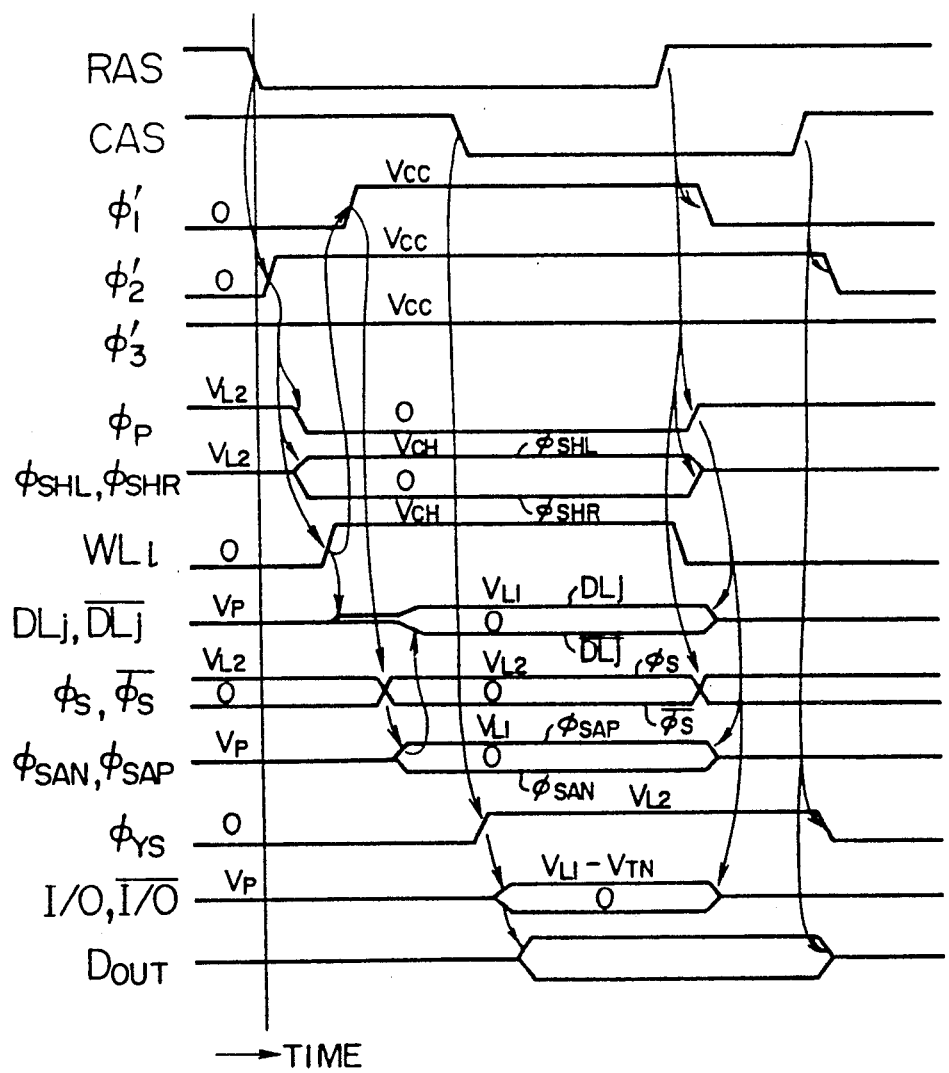

F I G. 24
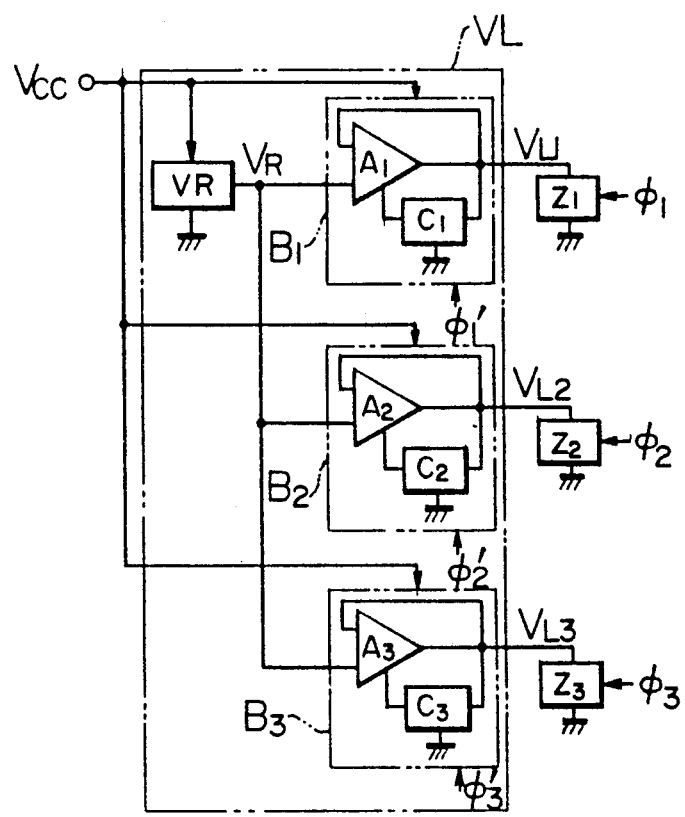
F I G. 25
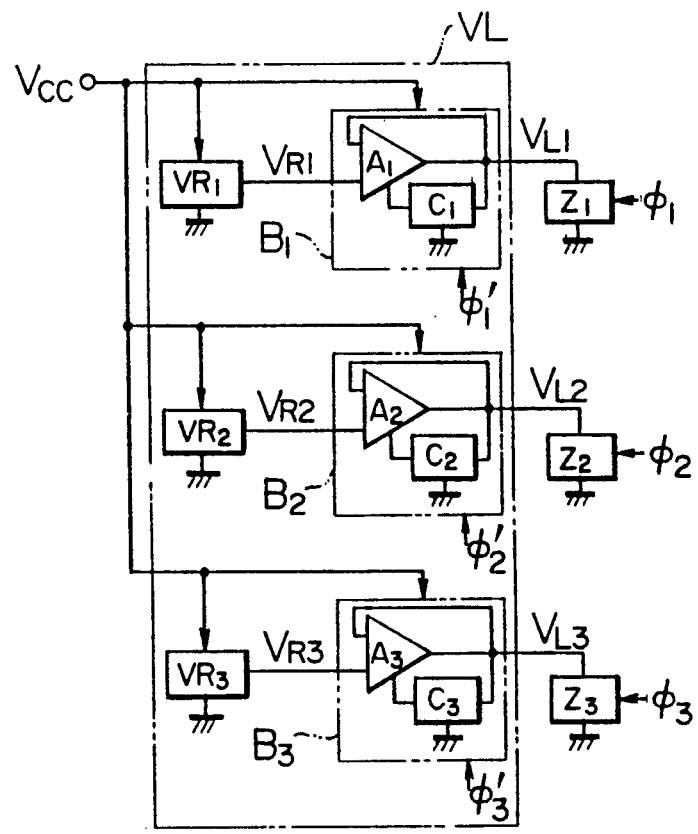

F I G. 29
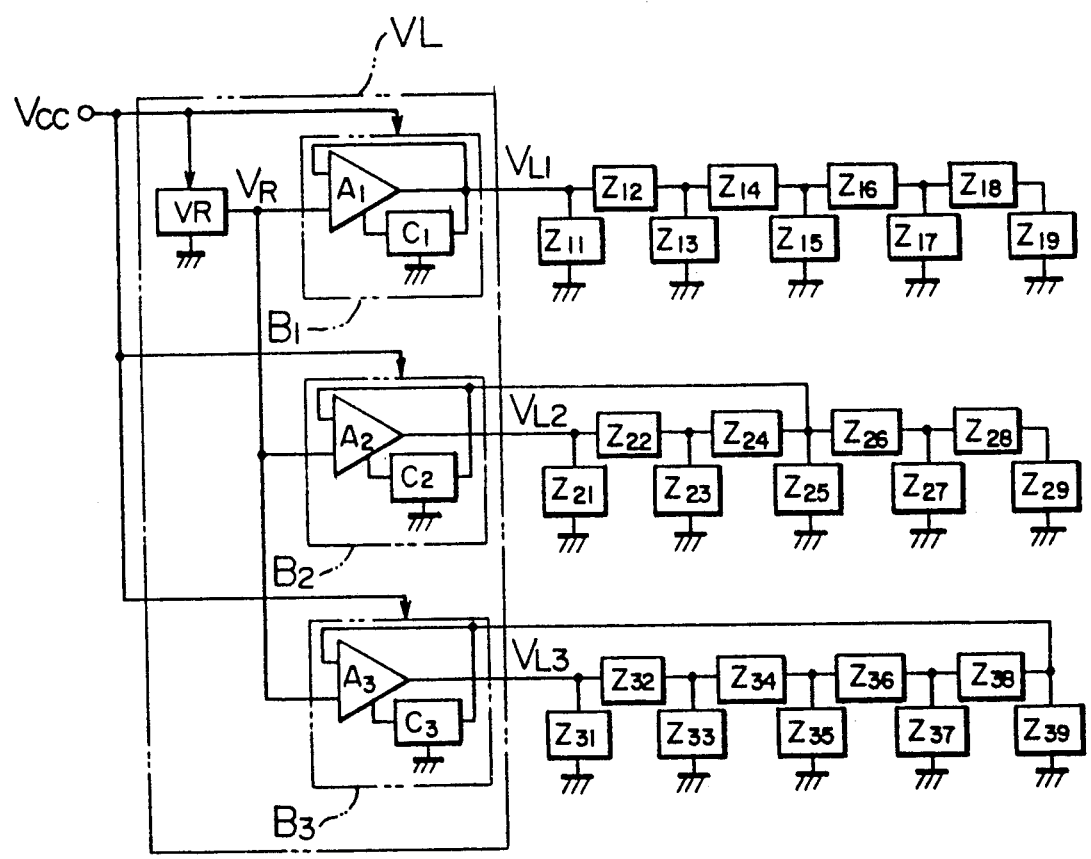

F I G. 30A
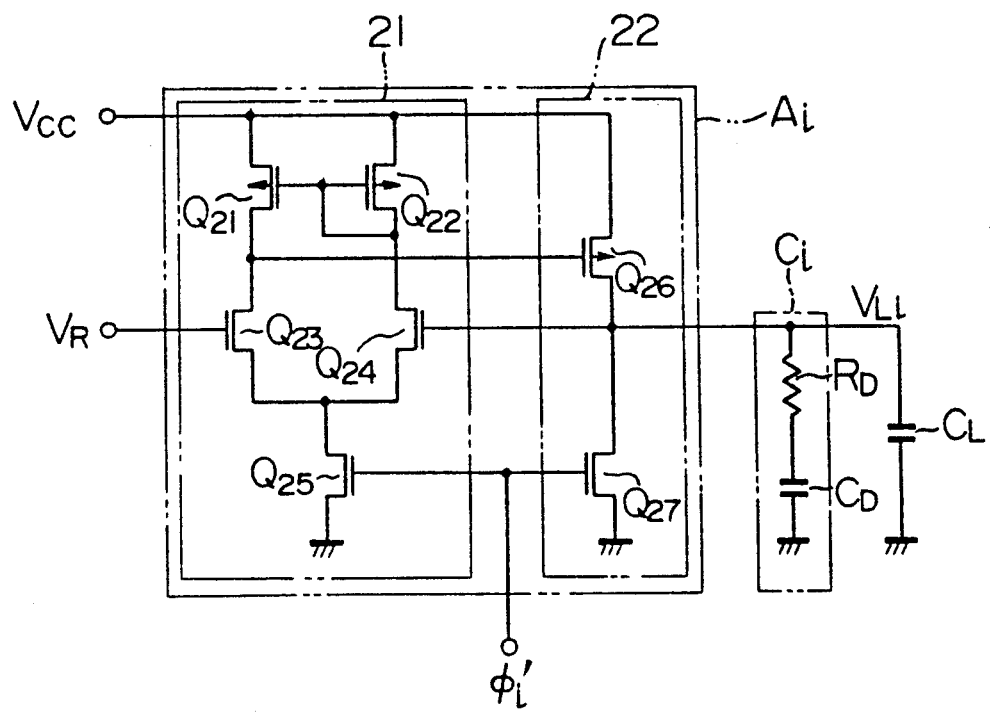
F I G. 30B
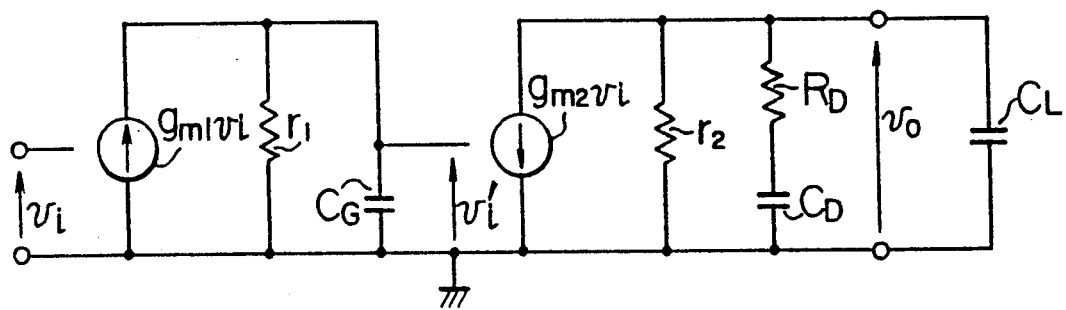

F I G. 44

| ADDR SIGNAL | $a_L$ | "0" | "1" |
|---|---|---|---|
| | $\overline{a_L}$ | "1" | "0" |
| | | ⎍--Vcc | ⎍--Vcc |
| | | ⎍--V_L / 0 | ———0 |
| | | ———0 | ⎍--V_L / 0 |

FIG. 48

| $a_L(\bar{a}_L)$ | 0 | 1 | 0 | 1 |
|---|---|---|---|---|
| $a_J(\bar{a}_J)$ | 0 | 0 | 1 | 1 |
| $\phi_T$ | ⊓ | ⊓ | ⊓ | ⊓ |
| $\phi_{P1}$ | ⊓ | — | — | — |
| $\phi_{P2}$ | — | ⊓ | — | — |
| $\phi_{P3}$ | — | — | ⊓ | — |
| $\phi_{P4}$ | — | — | — | ⊓ |
| $\phi_{P5}$ | ⊓ | — | — | — |
| $\phi_{P6}$ | — | ⊓ | — | — |
| $\phi_{P7}$ | — | — | ⊓ | — |
| $\phi_{P8}$ | — | — | — | ⊓ |
| $\phi_T$ | $V_{CC}$ --⊓-- 0 | | | |
| $\phi_{Pk}$ (k=1~8) | $V_L$ --⊓-- 0 | | | |

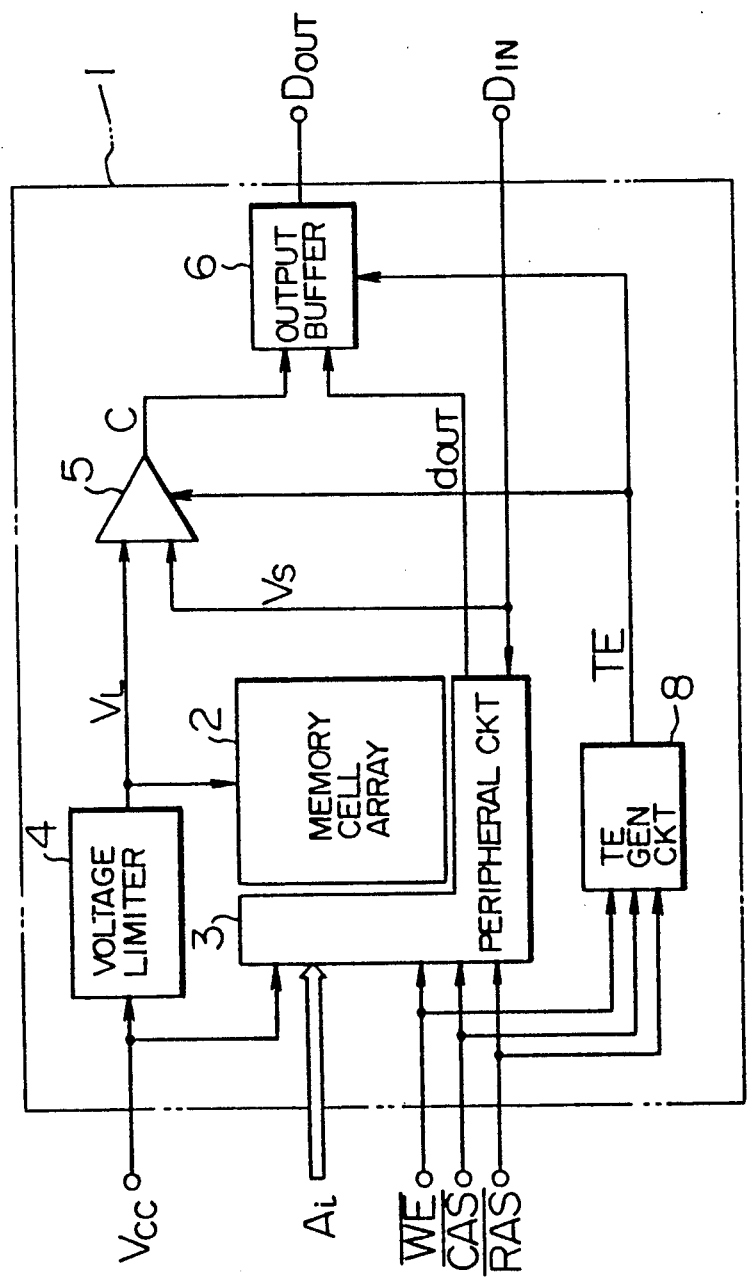
F I G. 52

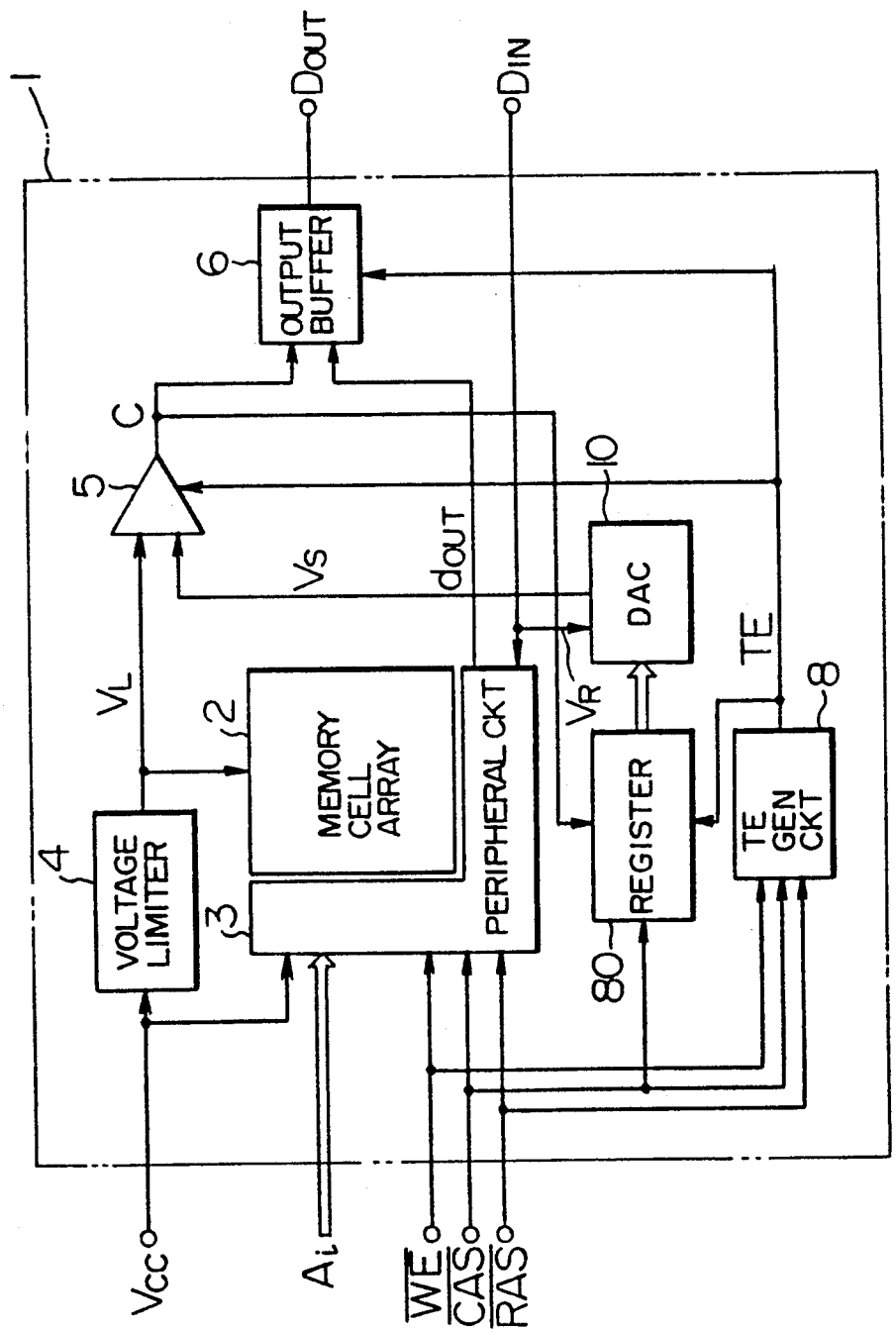
F I G. 59

LARGE SCALE INTEGRATED CIRCUIT HAVING LOW INTERNAL OPERATING VOLTAGE

This application is a continuation application of U.S. Ser. No. 07/621,991, filed Dec. 4, 1990, now abandoned which is a divisional application of U.S. Ser. No. 07/323,966, filed Mar. 15, 1989, now U.S. Pat. No. 4,994,688.

BACKGROUND OF THE INVENTION

This invention relates to an ultra large scale integrated (ULSI) circuit of low internal operating voltage which has a memory capacity of, for example, 16 M bits or more and more particularly to improvements in the construction and characteristics of a voltage limiter circuit and a reference voltage generator which are used in the above type of ULSI circuit, methods of testing the ULSI circuit incorporating the voltage limiter circuit and reference voltage generator, and the layout of actual ULSI circuits.

This invention is particularly concerned with a reference voltage generator of semiconductor device capable of generating stable voltage which less changes under the influence of external power supply voltage and temperatures.

Occasionally, the semiconductor integrated circuit needs a stable reference voltage which less changes with external power supply voltage and temperatures. This may be mentioned in connection with voltage limiters of LSI circuits as described in, for example, ISSCC Digest of Technical Papers, pp. 282-283, Feb. 1984, ISSCC Digest of Technical Papers, pp. 270-271, Feb. 1986 and ISSCC Digest of Technical Papers, pp. 272-273, Feb. 1986. Particularly, the last literature describes that in a memory LSI circuit such as DRAM (Dynamic Random Access Memory), a voltage lower than external power supply voltage is generated by means of a circuit (voltage limiter) formed on an LSI chip and is used as power supply for the memory LSI circuit. Such an internal power supply voltage must be a stable voltage which less changes under the influence of the external power supply voltage and temperature for the sake of making memory operation stable and to this end, a stable reference voltage is required. Further, an LSI circuit having a built-in analog circuit often requires stable reference voltages used as voltages for reference of comparison.

A reference voltage generator complying with the above requirements has been proposed as disclosed in, for example, U.S. Pat. Nos. 3,975,648 or 4,100,437. FIG. 1A of the present application illustrates the proposed circuit. Specifically, this circuit utilizes the difference in threshold voltage between an N-channel enhancement type MOSFET (hereinafter simply referred to as EMOS) and an N-channel depletion type MOSFET (hereinafter simply referred to as DMOS) to produce a stable voltage. In FIG. 1A, $Q_{91}$ designates an EMOS, $Q_{90}$, $Q_{92}$ and $Q_{93}$ designate DMOS's, $V_{CC}$ designates an external power supply of positive voltage and $V_{BB}$ designates an external power supply of negative voltage. The difference between a threshold voltage of EMOS and that of DMOS equals an output voltage $V_R$ as will be seen from the following operational description of this circuit.

Given that current flowing through $Q_{90}$ and $Q_{91}$ is $I_{90}$ and current flowing through $Q_{92}$ and $Q_{93}$ is $I_{91}$, the following four equations stand when all of the four MOSFET's operate in their saturation regions:

$$I_{90} = \frac{\beta_{90}}{2} (-V_{TD})^2 \quad (1)$$

$$I_{90} = \frac{\beta_{91}}{2} (V_{99} - V_{TE})^2 \quad (2)$$

$$I_{91} = \frac{\beta_{92}}{2} (V_{99} - V_R - V_{TD})^2 \quad (3)$$

$$I_{91} = \frac{\beta_{93}}{2} (-V_{TD})^2 \quad (4)$$

where $V_{99}$ is voltage at a node 99, $V_{TE}$ is threshold voltage of the EMOS where $V_{TE} > 0$, $V_{TD}$ is threshold voltage of the DMOS where $V_{TD} < 0$, and $\beta_{90}$, $\beta_{91}$, $\beta_{92}$ and $\beta_{93}$ are conductance coefficients of $Q_{90}$, $Q_{91}$, $Q_{92}$ and $Q_{93}$, respectively. From equations (1) to (4), there results $$V_R = V_{TE} - \left(1 + \sqrt{\frac{\beta_{90}}{\beta_{91}}} - \sqrt{\frac{\beta_{93}}{\beta_{92}}}\right) V_{DT}. \quad (5)$$

It constants of each MOSFET are determined such that $\beta_{90}$ and $\beta_{93}$ are sufficiently small or $\beta_{90}/\beta_{91} = \beta_{93}/\beta_{92}$ is satisfied, $$V_R = V_{TE} - V_{TD} \quad (6)$$

is obtained, indicating that a voltage equal to the difference in threshold voltage between the EMOS and DMOS is produced as output voltage $V_R$ and this voltage does not depend on the external power supply voltages $V_{CC}$ and $V_{BB}$.

In recent years, high integration of semiconductor devices has made progress and concomitant scale-down of the semiconductor devices has raised a problem that their breakdown voltage is degraded. This problem can be solved by decreasing power supply voltage applied to the semiconductor device but this measure is not always preferred when the external interface is taken into consideration. Under the circumstances, a method has been proposed wherein while the level of power supply voltage externally applied remains unchanged as compared to the prior art (for example, 5 V for TTL (Transistor Transistor Logic) compatible type), an internal power supply of a lower voltage than that level (for example, 3 V) is formed in a semiconductor device. For example, IEEE Journal of Solid-State Circuits, Vol. SC-22, No. 3, pp. 437-441, June 1987 describes an instance where this method is applied to a DRAM and a circuit (voltage limiter circuit) for generating an internal power supply from an external power supply.

FIG. 1B is a circuit diagram of the voltage limiter circuit described in the above literature. As shown, a voltage limiter circuit $V_L$ comprises a reference voltage generator VR and a driver B. Connected to the voltage limiter circuit VL is a load Z or a circuit which operates using output voltage $V_L$ of the voltage limiter as power supply. The reference voltage generator VR provides a stable voltage $V_R$ which less changes under the influence of external power supply voltage $V_{CC}$ and temperatures. The driver B generates a voltage $V_L$ which is of the same level as that of $V_R$ and which has great drivability, and it comprises a differential amplifier DA including transistors $Q_{106}$ to $Q_{111}$ and an output MOS transistor $Q_{112}$. The differential amplifier DA has two input terminals of which one is connected to $V_R$, with the output voltage $V_L$ being fed back to the other input terminal and this circuit operates to permit the output voltage $V_L$ to follow the input voltage $V_R$. The drivability of the output voltage $V_L$ is determined depending on the channel width of the output MOS transistor $Q_{112}$. Accordingly, by designing the transistor $Q_{112}$ such that it has a channel width commensurate with current consumption, stable internal power supply voltage $V_L$ can be supplied to the load.

SUMMARY OF THE INVENTION

With the above prior art techniques in mind, the present inventors have studied thoroughly a specific ultra large scale integrated circuit (for example, an LSI circuit in terms of a DRAM of 16 M bits or more) to find problem points to be described hereinafter in greater detail. Principally, there are problems involved in the reference voltage generator, problems involved in the voltage limiter circuit and problems involved in testing these circuits.

Firstly, the prior art shown in FIG. 1A has a disadvantage that the EMOS and DMOS have different properties and their characteristics are difficult to match. For simplicity of explanation, the previous description has been given on the assumption that the EMOS and DMOS have the same characteristics but actually, they greatly differ from each other in characteristics such as conductance coefficient $\beta$, temperature dependency $d\beta/dT$ of conductance coefficient $\beta$ and temperature dependency $dV_t/dT$ of threshold voltage. This results from the fact that the difference in threshold voltage between EMOS and DMOS is required to be extremely large for the reasons to be described below.

The EMOS must be rendered soundly non-conductive when gate/source voltage is 0 (zero) V. To this end, the threshold voltage $V_{TE}$ must be set to a considerably high value (for example, $V_{TE} \geq 0.5$ V) when taking irregularity in manufacture and sub-threshold characteristics into consideration. The DMOS, on the other hand, may sometimes be used for a current source as is suggested by equations (1) and (4) and in order to suppress irregularity in current value, absolute value of the threshold voltage $V_{TD}$ of the DMOS must be set to a considerably high value (for example, $V_{TD} \leq 1.5$ V). Consequently, $V_{TE} - V_{TD}$ is considerably large (for example, $V_{TE} - V_{TD} \geq 2$ V), indicating that impurity profile in channel region of MOSFET greatly differs for the EMOS and DMOS. This leads to the aforementioned mismatch in characteristics of the MOSFET's.

An object of this invention is to provide a reference voltage generator which does not use the depletion type FET to solve the above problems.

According to the invention, to accomplish the above object, two enhancement type FET's having different threshold voltages are used, and currents at a constant ratio are passed through these FET's to produce a potential difference which is taken out as reference voltage.

Since the two enhancement type FET's having different threshold voltages are used without resort to any depletion type FET, it is possible to make the difference in threshold voltage between FET's sufficiently small (in principle, the difference may be unlimitedly small). Therefore, as compared to the prior art, characteristics of the two FET's can be matched with each other more easily and a stabler reference voltage can be obtained.

Turning to the prior art voltage limiter circuit shown in FIG. 1B, a first problem of this circuit is that stability of operation of the circuit is not taken into consideration. In general, unless the amplifier in feedback loop of the driver B shown in FIG. 1B is designed to have sufficient phase margin, the operation of this amplifier becomes unstable. This will be explained with reference to FIG. 2.

When the amplifier has, under no feedback, a frequency/gain characteristic and a frequency/phase characteristic as graphically shown in FIG. 2, the phase margin is defined by a numerical value of margin of lagging phase with respect to 180° at a frequency at which the gain is 0 dB. If the phase margin is negative, the feedback amplifier will oscillate and even if positive, the operation will become unstable when the phase margin is small. Generally speaking, the phase margin must be 45° or more in order to ensure stable operation. To meet this requirement, the gain must be 0 dB or less at the second bending point (pole) $P_2$ on the frequency/gain characteristic where the gradient changes from 6 dB/oct to 12 dB/oct. The voltage limiter circuit fills the role of supplying a stable internal power supply voltage to the internal circuit and it should of course be prevented from oscillation and unstable operation.

As a countermeasure against this problem, various methods for compensation have been proposed as disclosed in, for example, Paul R. Gray and Robert G. Mayer: Analysis and Design of Analog Integrated Circuits, 2nd Ed., John Wiley and sons Inc. However, problems to be described below are encountered in applying compensation to actual voltage limiter circuits, of semiconductor apparatus. The circuit acting as the load on the voltage limiter circuit is an internal circuit of an actual semiconductor apparatus and contains a variety of electrical elements including capacitor, resistor, inductor and non-linear element or combination thereof. In addition, the load is not invariable with time but sometimes changes depending on operation mode of the semiconductor apparatus. For example, current drawn to the load greatly differs for the semiconductor apparatus in operating status and the semiconductor apparatus in standby status. This causes the bias condition for the output stage of the driver B shown in FIG. 1B to change and as a result, the frequency characteristic of the whole amplifier also changes. For the purpose of ensuring stable operation of the voltage limiter circuit, the amplifier having sophisticated properties as above must always be operated stably. The prior art compensation technique alone is insufficient for this purpose.

A second problem of the prior art voltage limiter circuit is that layout and wiring on the semiconductor chip are not taken into consideration. Especially, the prior art fails to take into consideration layout of the voltage limiter circuit and wiring of output voltage $V_L$ which are required when a plurality of circuits are operated by the internal power supply voltage $V_L$.

The present inventors have found the following problems encountered in applying the prior art circuit to semiconductor memories. To explain, reference should be made to FIGS. 3 and 4 illustrating examples of application of the prior art circuit to a semiconductor memory. Referring to FIG. 3, 1 generally designates a semiconductor memory chip, 3 designates a peripheral circuit, 7 the driver of the voltage limiter circuit (with omission of the reference voltage generator of the voltage limiter circuit), 14a to 14d pulse generating circuits and 2a to 2d memory cell arrays (memory mats) each constructed of fine MOS transistors.

The memory mat using fine elements should be operated with the internal power supply voltage $V_L$. The driver 7 and pulse generating circuits 14a to 14d are used to this end. The driver 7 generates the internal power supply voltage $V_L$ and the pulse generating circuits 14a to 14d generate pulses $\phi_{P1}$ to $\phi_{P4}$ of amplitude $V_L$, respectively. In this example, only one driver 7 is provided for the four pulse generating circuits 14a to 14d. Therefore, in order for each pulse generator to be supplied with the internal power supply voltage $V_L$ generated from the voltage limiter circuit, there needs wiring of a long conductor extending from upper side to lower side of the semiconductor chip, with the result that parasitic impedance associated with the wiring conductor increases and is prone to cause noise. An expedient of decreasing the impedance by increasing the conductor width can be realized only at the cost of an increased area occupied by the wiring conductor on the chip.

Another example of FIG. 4 is to avoid this disadvantage of the prolonged wiring conductor in FIG. 3 by providing drivers 7a, 7b, 7c and 7d in association with the individual pulse generators. With this construction, the length of the wiring between voltage limiter circuit and pulse generator can be decreased but there need voltage limiter circuits which are identical in number (four in this example) with the pulse generators. Consequently, area occupied by the voltage limiter circuits and current consumption are increased as compared to the example of FIG. 3. The occupation area by the voltage limiter circuits and power consumption increase in proportion to an increase in the number of the pulse generators and this imposes serious problems on semiconductor apparatus intending in essentiality high integration and low power consumption.

A third problem of the prior art voltage limiter circuit is that the operation speed of CMOS (Complementary Metal Oxide Semiconductor) circuit is not taken into consideration. This problem will be explained by way of a DRAM manufactured by having a good command of the most advanced fine processing technique.

Reference should be made to FIG. 5 illustrating part of an N-well type CMOS DRAM circuit. In this circuit, the memory cell array is formed on a P-type semiconductor substrate. The sense amplifier has N-channel MOS transistors and P-channel MOS transistors, and the N well corresponding to the substrate of the P-channel MOS transistors is connected to power supply voltage.

As discussed in ISSCC, FAM 18.6, 1984, P 282, increasing the degree of integration of the DRAM by reducing the size of the MOS transistor leads to a problem that ability to withstand stress is degraded because of hot carriers in the MOS transistor. As a countermeasure, it is conceivable to decrease, in consideration of the ability to withstand stress, only power supply voltage used for the memory cell array which is required to be fine for improving the degree of integration. For example, this may be achieved by supplying an operating voltage $V_L$ lower than external power supply voltage $V_{CC}$ in absolute value to the memory cell array including sense amplifiers, and the external power supply voltage $V_{CC}$ in the peripheral circuit (such as X-decoder and Y-decoder) of the DRAM. Thus, in FIG. 5, a voltage supply line connected to the source of the P-channel MOS transistor of the sense amplifier is maintained at $V_L$ and a voltage supply line to the peripheral circuit is maintained at $V_{CC}$.

However, the above decreasing of the operating voltage of the memory cell array in the CMOS DRAM has proved to decrease operating speeds remarkably. Detailed analysis has clarified that back gate bias effect of the P-channel MOS transistor causes an increase in threshold voltage which in turn causes a decrease in operating speed. Where potential at the source of the P-channel MOS transistor formed in the N well within the P-type substrate is the internal power supply voltage $V_L$ and potential at the N well (back gate of the P-channel MOS transistor) is the external power supply voltage $V_{CC}$, a back gate bias of $V_{CC} - V_L$ is applied to the P-channel MOS transistor, thus raising the threshold voltage of this transistor.

For a P-channel MOS transistor having a gate length of 1.2 $\mu$m and a gate width of 10 $\mu$m, the threshold voltage is plotted relative to the difference (back gate bias) between back gate (N well) voltage and source voltage, as shown in FIG. 6. In this example, when a back gate bias of 2 V is applied, the threshold voltage increases by about 0.35 V. Given that the power supply voltage $V_{CC}$ takes a value typically used in the existing LSI circuits and the operating voltage $V_L$ is set to 3 V, an increase in threshold voltage of 0.35 V exceeds 10% of the operating voltage and directly degrades the operating speed.

Another object of this invention is to provide a voltage limiter circuit which can solve the aforementioned first problem and operate stably.

Still another object of the invention is to provide a voltage limiter circuit which can solve the aforementioned second problem and permit low noise, small occupation area and low power consumption.

Still another object of the invention is to a CMOS LSI (Large Scale Integrated) circuit which can solve the aforementioned third problem and can be of high speed and high reliability.

According to the invention, to solve the first problem, the driver of the voltage limiter circuit is divided into a plurality of driver circuits in accordance with the type of load when the voltage limiter circuit is used to drive many types of loads, and each driver circuit is applied with compensation. When the type and size of load change with time depending on operation mode of the semiconductor apparatus, circuit constants of the driver circuit and compensation circuit are changed in accordance with individual operation modes. Alternatively, separate driver circuits are provided for individual operation modes, and the output of each driver circuit is connected to provide a voltage limiter circuit output voltage to the load.

According to the invention, the second problem can be solved by disposing a single voltage limiter circuit and a plurality of load circuits such as pulse generators using the output of the voltage limiter circuit as power supply in close relationship, and permitting the plurality of load circuits commonly using the single voltage limiter circuit to be placed in selected/non-selected condition by using a control signal such as address signal.

According to the invention, the third problem can be solved by making voltage of back gate (well) of the MOS transistor formed in the well equal to operating voltage supplied to the source of the MOS transistor, in the CMOS LSI circuit.

By dividing the driver into a plurality of driver circuits in accordance with the type of load when the voltage limiter circuit is required to drive many types of loads and applying each driver circuit with compensation, optimum compensation complying with the type of load can be obtained. Further, by changing circuit constants of the driver circuit and compensation circuit in accordance with operation modes of the semiconductor apparatus and by providing separate driver circuits for individual operation modes and connecting the output of each driver circuit to provide a voltage limiter circuit output voltage to the load, optimum compensation complying with the change of the load can be obtained. Based on the above advantages, the voltage limiter circuit can be provided which can operate stably.

By disposing a single voltage limiter circuit and a plurality of load circuits such as pulse generators using the output of the voltage limiter circuit as power supply in close relationship, impedance of a wiring conductor between the voltage limiter circuit and load circuit can be minimized to suppress level of generated noise. Also, by permitting the plurality of load circuits commonly using the single voltage limiter circuit to be placed in selected/non-selected condition by using a control signal such as address signal, the number of voltage limiter circuits can be reduced. Accordingly, occupation area by the circuit and power consumption can be reduced. The voltage limiter circuit is required to drive only one of the driver circuits which is put in selected condition. Therefore, in spite of the fact that the voltage limiter circuit is commonly used by the driver circuits, the voltage limiter circuit need not have increased current drivability.

In the CMOS LSI circuit, by making the MOS transistor formed in the well have well voltage equal to internal power supply voltage $V_L$, an increase in threshold voltage due to back gate bias effect can be prevented.

Still another object of this invention is to provide an actually applicable structure of ultra large scale integrated circuit.

Still another object of the invention is to provide an actually applicable layout of ultra large scale integrated circuit.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 16A is a diagram showing a first embodiment of structure of a MOSFET used in the reference voltage generator according to the invention.

FIG. 16B is a sectional view taken on the line a—a' of FIG. 16A.

FIG. 22 is a circuit diagram of an embodiment of a connection circuit used in the FIG. 13 embodiment.

FIG. 23 is a diagram showing waveforms for explaining the operation of the FIG. 13 embodiment.

FIG. 24 is a circuit diagram of a first embodiment of a voltage limiter according to the invention.

FIG. 25 is a circuit diagram of a modification of the FIG. 24 embodiment.

FIG. 29 is a circuit diagram of a fourth embodiment of the voltage limiter circuit according to the invention.

FIG. 30A is a circuit diagram of a first embodiment of an arrangement of feedback circuit and compensation circuit according to the invention.

FIG. 30B is an equivalent circuit of the FIG. 30A embodiment.

FIG. 44 is a diagram showing operation timings in the FIG. 43 embodiment.

FIG. 48 is a diagram for explaining the operation of the FIG. 47 embodiment.

FIG. 52 is a block diagram of a first embodiment of an inspection circuit according to the invention.

FIG. 59 is a block diagram of a fourth embodiment of the inspection circuit according to the invention.

DESCRIPTION OF THE PREFERRED EMBODIMENTS

The invention will now be described by way of example with reference to the accompanying drawings.

For better understanding of the invention, the description is divided into first, second and third groups which will be explained in this order. In each group, applications to actual ultra large scale integrated circuits will be described but as can be understood by those skilled in the art, this does not signify that these groups are quite independent of each other. Namely, if the groups can technically be practiced in combination, such combinations may obviously be involved in the present invention. Further, it should be understood by those skilled in the art that techniques of the first, second and third groups do not exclude from each other but may be used in combination to attain combinational effects as is clear from the description set forth hereinafter.

Group 1

The invention will now be described by referring to embodiments of the first group. The following description will be given on the assumption that positive reference voltage is generated but obviously negative reference voltage may also be generated by inverting the polarity of transistors used.

Figure 7A:
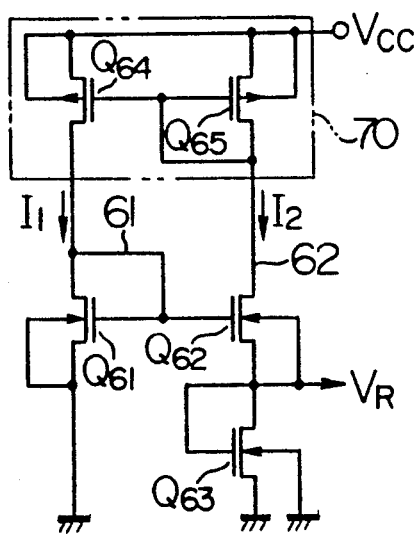
FIG. 7A is a circuit diagram of a first embodiment of a reference voltage generator according to the invention.

FIG. 7A is a circuit diagram showing a first embodiment of the reference voltage generator. This circuit comprises N-channel MOSFET's $Q_{61}$ to $Q_{63}$ and P-channel MOSFET's $Q_{64}$ and $Q_{65}$. The external power supply feeds positive voltage $V_{CC}$. Of the N-channel MOSFET's, $Q_{62}$ and $Q_{63}$ are enhancement type FET's having a standard threshold voltage $V_{TE}$ (hereinafter simply referred to as EMOS's) and $Q_{61}$ is an enhancement type FET having a threshold voltage $V_{TEE}$ higher than $V_{TE}$ (hereinafter simply referred to as EEMOS). This circuit operates as will be described below.

The P-channel MOSFET's $Q_{64}$ and $Q_{65}$ commonly share their gates and sources to form a so-called current mirror circuit 70. Therefore, these MOSFET's operate such that the ratio between drain current $I_1$ of $Q_{64}$ and drain current $I_2$ of $Q_{65}$ is constant. The current ratio (mirror ratio) is determined by the ratio between constants of $Q_{64}$ and those of $Q_{65}$. Given that constants are the same for $Q_{61}$ to $Q_{63}$ and these FET's operate in saturation region, the following three equations stand:

$$I_1 = \frac{\beta_{EE}}{2}(V_1 - V_{TEE})^2 \tag{7}$$

$$I_2 = \frac{\beta_E}{2}(V_1 - V_R - V_{TE})^2 \tag{8}$$

$$I_2 = \frac{\beta_E}{2}(V_R - V_{TE})^2 \tag{9}$$

where $\beta_{EE}$ is conductance coefficient of the EEMOS ($Q_{61}$), $\beta_E$ is conductance coefficient of EMOS's $Q_{62}$ and $Q_{63}$) and $V_1$ is voltage at a node 61.

From equations (7) to (9), there result $$V_1 = 2 V_R \tag{10}$$

$$V_R = \frac{V_{TEE} - x V_{TE}}{2 - x} \tag{11}$$

where $$x = \sqrt{\frac{\alpha \beta_E}{\beta_{EE}}} \tag{12}$$

and $\alpha$ is the mirror ratio of the current mirror circuit 70, indicating that $I_1:I_2 = \alpha:1$. Especially, when constants are the same for $Q_{64}$ and $Q_{65}$, $\alpha = 1$ stands and given that $\beta_{EE} \approx \beta_E$ $$V_R = V_{TEE} - V_{TE} \tag{13}$$

stands. Thus, the difference between threshold voltages of the EEMOS and EMOS provides a reference voltage $V_R$ which does not depend on external power supply voltage $V_{CC}$ and is stable. In place of $V_R$, $V_1(=2 V_R)$ may be used as reference voltage.

This reference voltage generator features that characteristics of the MOSFET's can be matched with each other more easily as compared to the prior art. In order for $Q_{61}$ to $Q_{63}$ to operate in saturation region, $V_{TEE} \geq 2 V_{TE}$ or $V_{TEE} - V_{TE} \geq V_{TE}$ is simply required. This is because as compared to the prior art, the threshold voltage difference $V_{TEE} - V_{TE}$ is smaller (for example, 0.7 V) and the difference in impurity profile in channel region between the MOSFET's can be smaller.

In the circuit of this embodiment, the difference in temperature dependency $dV_T/dT$ of threshold voltage between the MOSFET's can be reduced to make the reference voltage immune to temperatures. The temperature dependency can be reduced further by adjusting the mirror ratio $\alpha$ in a manner described below.

By differentiating equation (11) by temperature T, $$\frac{dV_R}{dT} = \frac{1}{2-x} \cdot \frac{dV_{TEE}}{dT} - \frac{x}{2-x} \cdot \frac{dV_{TE}}{dT} \tag{14}$$

is obtained. Therefore, by setting the mirror ratio o such that $dV_{TEE}/dT = x \cdot dV_{TE}/dT$ stands, the temperature dependency of reference voltage $dV_R/dT$ can be made to be zero.

The channel length of the MOSFET used in the circuit of the present embodiment is preferred to be long to some extent. For example, even if other circuits in the semiconductor apparatus use MOSFET's having a channel length of about 1 $\mu$m, it is preferable that the MOSFET's used in the present circuit have a channel length of, for example, 5 $\mu$m or more exceeding the former channel length. For simplicity of explanation, equations (7) to (9) are set up on the assumption that the drain current in saturation region depends on only the gate/source voltage, but actually the drain current changes slightly, depending on the drain/source voltage. The longer the channel length, the smaller the rate of this change in drain current (drain conductance) becomes and stability of the reference voltage can be improved. Further, the long channel length is also desired for the purpose of suppressing the change of threshold voltage due to short channel effect.

Figure 7B:
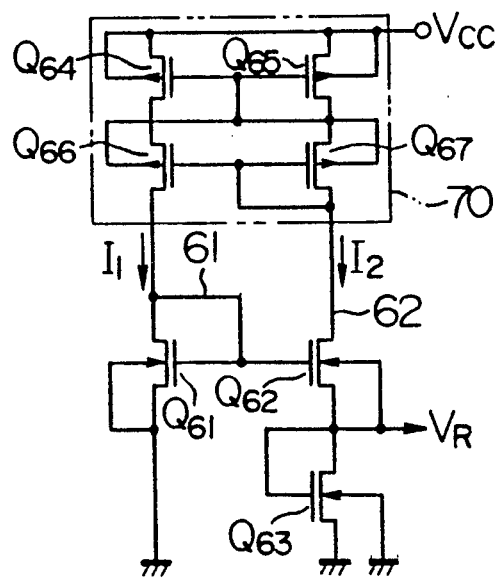
FIGS. 7B to 7D are circuit diagrams of modifications of the FIG. 7A embodiment.
Figure 7C:
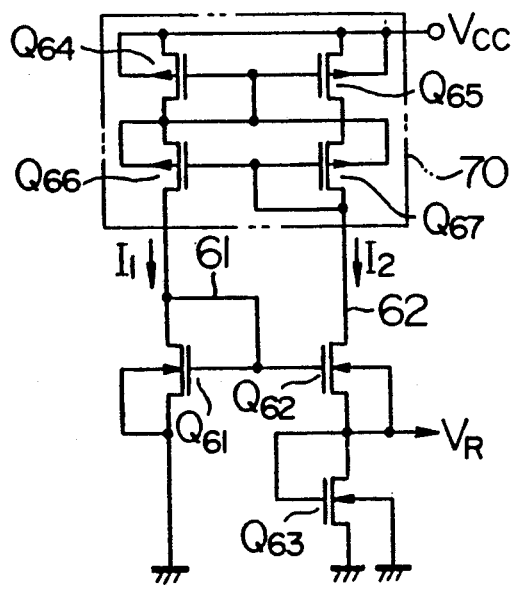

In circuits of FIGS. 7A to 7C, the back gates of MOSFET's $Q_{61}$ to $Q_{63}$ for generation of the reference voltage are connected to the sources of these MOSFET's, respectively, but they may be connected to the common substrate terminal. Considering that the threshold voltage of MOSFET changes with back gate voltage, the connection to the source is preferred to avoid this effect.

Figure 7D:
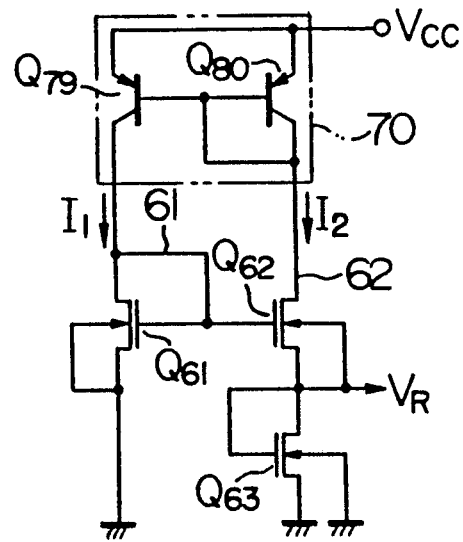

Here, a supplemental description will be given of the current mirror circuit used in this invention. The number of MOSFET's used for the current mirror circuit is not limited to two as in the case of the FIG. 7A embodiment. Thus, the FIG. 7A embodiment may be modified as shown in FIGS. 7B and 7C. The current mirror circuit in the FIG. 7B modification is of the type called cascode and the current mirror circuit in the FIG. 7C modification is of the type called Wilson. These types of mirror circuits have excellent mirror characteristics. More particularly, while the mirror ratio $\alpha$ slightly changes as the drain/source voltages of $Q_{64}$ and $Q_{65}$ change in the current mirror circuit shown in FIG. 7A, this change can be suppressed in the current mirror circuit shown in FIG. 7B or 7C. Therefore, the modifications of FIGS. 7B and 7C can set the mirror ratio more accurately and provide a stabler reference voltage, as compared to the FIG. 7A embodiment. The embodiment of FIG. 7A may also be modified as shown in FIG. 7D. In this modification, the current mirror circuit uses bipolar transistors in place of MOSFET's. In the following description, the current mirror circuit shown in FIG. 7A will mainly be referred to for simplicity of explanation but the use of the current mirror circuit shown in FIG. 7B, 7C or 7D may of course lie in the framework of the invention.

Figure 8:
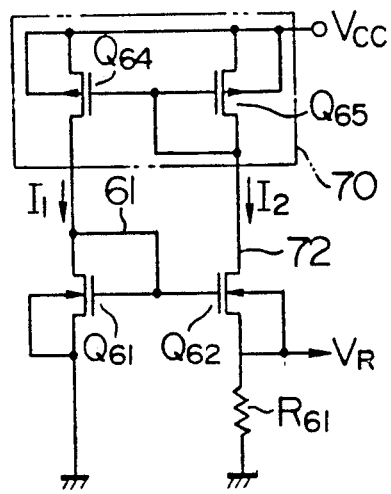
FIG. 8 is a circuit diagram of a second embodiment of the reference voltage generator according to the invention.

FIG. 8 shows a second embodiment of the reference voltage generator according to the invention. In the second embodiment, the MOSFET $Q_{63}$ of the first embodiment (FIG. 7A) is replaced with a resistor $R_{61}$. Given that constants are the same for $Q_{61}$ and $Q_{62}$ and these MOSFET's operate in saturation region, the following three equations stands:

$$I_1 = \frac{\beta_{EE}}{2}(V_1 - V_{TEE})^2 \quad (15)$$

$$I_2 = \frac{\beta_E}{2}(V_1 - V_R - V_{TE})^2 \quad (16)$$

$$I_2 = \frac{V_R}{R_{61}} \quad (17)$$

For the mirror ratio $\alpha = 1$ and $\beta_{EE} \approx \beta_E$, equations (15), (16) and (17) reduce to $$V_R = V_{TEE} - V_{TE} \quad (18)$$

indicating that the difference in threshold voltage between EEMOS and EMOS is obtained as reference voltage $V_R$.

This embodiment features that the difference in threshold voltage between EEMOS and EMOS can be reduced further (in principle, reduced unlimitedly), as compared to the FIG. 7A embodiment. Therefore, characteristics of the MOSFET's can be matched with each other more easily. However, considering that the ordinary MOS process permits, in general, occupation area by MOSFET to be smaller than that by resistor, the FIG. 7A embodiment is preferred to the FIG. 8 embodiment if the threshold voltage being large to some extent is acceptable.

Figure 9A:
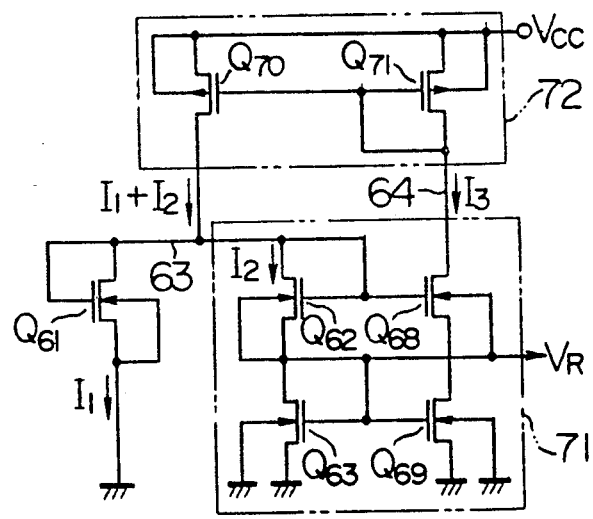
FIG. 9A is a circuit diagram of a third embodiment of the reference voltage generator according to the invention.

FIG. 9A shows a third embodiment of the reference voltage generator according to the invention. In this embodiment, the ratio between currents $I_1$ and $I_2$ is kept being constant in a different manner from that in FIG. 7 embodiment. The current mirror circuit 70 operates to directly keep the ratio between currents $I_1$ and $I_2$ constant in the FIG. 7A embodiment but in the present embodiment, a set of current mirror circuits 71 and 72 cooperate to indirectly keep the mirror ratio constant. More particularly, the current mirror circuit 71 comprised of four N-channel MOSFET's (being of cascode type) operates to keep the ratio between $I_2$ and $I_3$ constant and at the same time the current mirror circuit 72 comprised of two P-channel MOSFET's operates to keep the ratio between $I_3$ and $(I_1 + I_2)$ constant. As a result, the ratio between $I_1$ and $I_2$ is kept being constant. For example, where the mirror ratio of the circuit 71 is $I_2:I_3 = -1:1$ and the mirror ratio of the circuit 72 is $I_3:(I_1+I_2) = 1:2$, $I_1:I_2 = 1.1$ is obtained.

This embodiment features that the drain/source voltage of $Q_{62}$ is substantially fixed. In the FIG. 7A embodiment, voltage at the drain (mode 62) of $Q_{62}$ approximates $V_{DD} - |V_{TP}|$, where $V_{TP}$ is threshold voltage of the P-channel MOSFET, and this drain voltage changes as the external power supply voltage $V_{CC}$ changes. A change in drain voltage caused drain conductance to change the drain current and invites a change in reference voltage $V_R$. Contrary to this, in the present embodiment, the drain voltage of $Q_{62}$ is maintained at 2 $V_R$ and therefore a reference voltage immune to the change of $V_{CC}$ can be obtained.

Figure 9B:
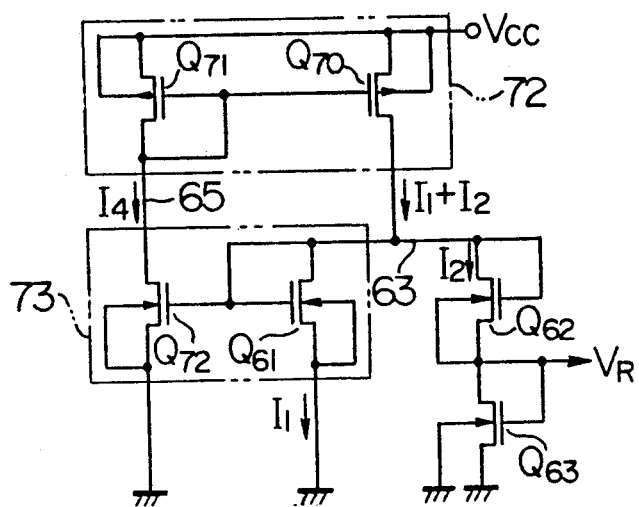
FIG. 9B a circuit diagram of a fourth embodiment of the reference voltage generator according to the invention.

FIG. 9B shows a fourth embodiment of the reference voltage generator. This embodiment is to the same effect as the FIG. 9A embodiment. In the circuit shown in FIG. 9B, a current mirror circuit 73 comprised of two EEMOS's keeps the ratio between $I_2$ and $I_4$ constant and a current mirror circuit 72 comprised of two P-channel MOSFET's keeps the ratio between $I_4$ and $(I_1 + I_2)$ constant, thereby keeping the ratio between $I_1$ and $I_2$ constant.

Figure 10A:
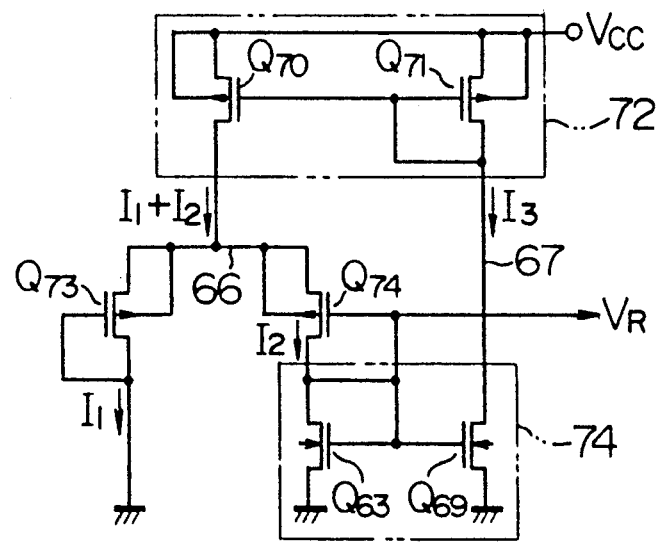
FIG. 10A is a circuit diagram of a fifth embodiment of the reference voltage generator according to the invention.
Figure 10B:
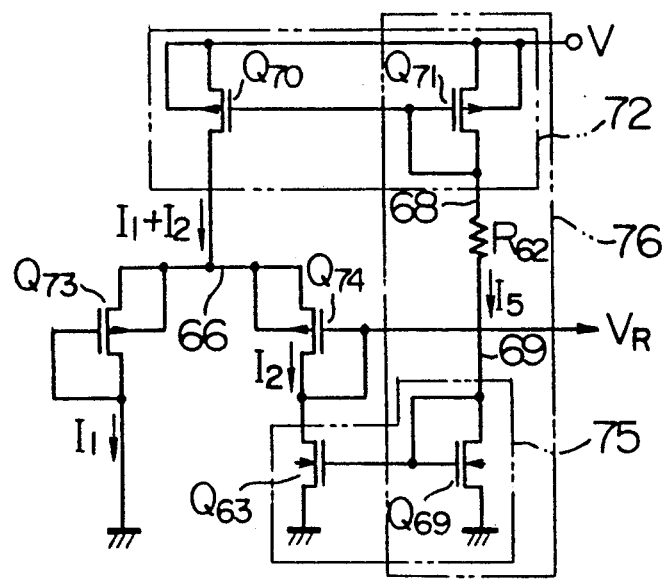
FIG. 10B is a circuit diagram of a sixth embodiment of the reference voltage generator according to the invention.

In the foregoing embodiments, the difference in threshold voltage between the N-channel MOSFET's is used as reference voltage but the difference in threshold voltage between P-channel MOSFET's may be used as reference voltage. FIGS. 10A and 10B show fifth and sixth embodiments of the reference voltage generator to this effect. In the fifth embodiment shown in FIG. 10A, $Q_{74}$ designates a P-channel MOSFET having a standard threshold voltage $V_{TP}$ and $Q_{73}$ a P-channel MOSFET having a threshold voltage $V_{TPE}$ which is lower, more strictly, larger in absolute value in negative direction than $V_{TP}$. Given that $Q_{74}$ and $Q_{73}$ operate in saturation region, the following two equations stand:

$$I_1 = \frac{\beta_{PE}}{2}(-V_3 - V_{TPE})^2 \quad (19)$$

$$I_2 = \frac{\beta_P}{2}(V_R - V_3 - V_{TP})^2 \quad (20)$$

where $V_3$ is voltage at a node 66 and $\Delta_{PE}$ and $\Delta_E$ are conductance coefficients of $Q_{73}$ and $Q_{74}$. For the mirror ratio $I_1:I_2 = 1:1$ and $\beta_{PE} \approx \beta_E$, equations (19) and (20) reduce to $$V_R = V_{TP} - V_{TPE} \quad (21)$$

indicating that the difference in threshold voltage between the P-channel MOSFET's is obtained as reference voltage $V_R$.

The fifth embodiment is suitable for incorporation into a semiconductor integrated circuit formed on a P-type substrate and requiring stable reference voltage. As described previously, the back gates of the MOSFET's for generation of the reference voltage are preferably connected to the sources of these MOSFET's, respectively. In the semiconductor integrated circuit on the P-type substrate, however, it is general practice that N-channel MOSFET's are formed directly on the substrate and their back gates are all connected to the common substrate terminal. Accordingly, as the substrate voltage changes, the threshold voltage of the N-channel MOSFET changes sympathetically. Contrary to this, P-channel MOSFET's are formed in N-type wells and therefore their back gates (wells) can be connected to their sources, respectively, so as to make their threshold voltages immune to the change of substrate voltage. Taking a DRAM, for instance, it is usual to use a P-type substrate and apply a voltage (typically, about $-3$ V), generated by a substrate voltage generator formed on the chip, to the substrate. This substrate voltage, however, tends to change with the change of the external power supply voltage and in accordance with the operation of the memory. The circuit of the fifth embodiment is particularly effective for such an instance. Conversely, in a semiconductor integrated circuit formed on an N-type substrate, the reference voltage generator circuit may preferably be used wherein the difference in threshold voltage between N-channel MOSFET's is obtained as reference voltage.

In the sixth embodiment shown in FIG. 10B, the difference in threshold voltage between P-channel MOSFET's is similarly used as reference voltage. This embodiment differs from the foregoing embodiments in that the operating point (operating current) is set in a different manner. The foregoing embodiments utilize a so-called self-bias type circuit according to which the operating point is automatically set within the reference voltage generator. In contrast, the circuit of the present embodiment comprises a circuit 76 dedicated to setting of operating point. Current $I_5$ flowing through the operating point setting circuit 76 is mainly determined by a resistor $R_{62}$ (replaceable with a MOSFET). Operating currents $I_1$ and $I_2$ of this reference voltage generator are determined by the current $I_5$ and a set of current mirror circuits 72 and 75. For example, where the mirror ratio of circuit 72 is $I_5:(I_1+I_2)=1:2$ and the mirror ratio of circuit 75 is $I_5:I_2=1:1$, $I_1=I_2=I_2$ is obtained.

The present circuit having the dedicated operating point setting circuit features that as compared to the self-bias type circuit, the change of operating point due to irregularity of devices can be lessened and hence irregularity in current consumption can be lessened.

Figure 11:
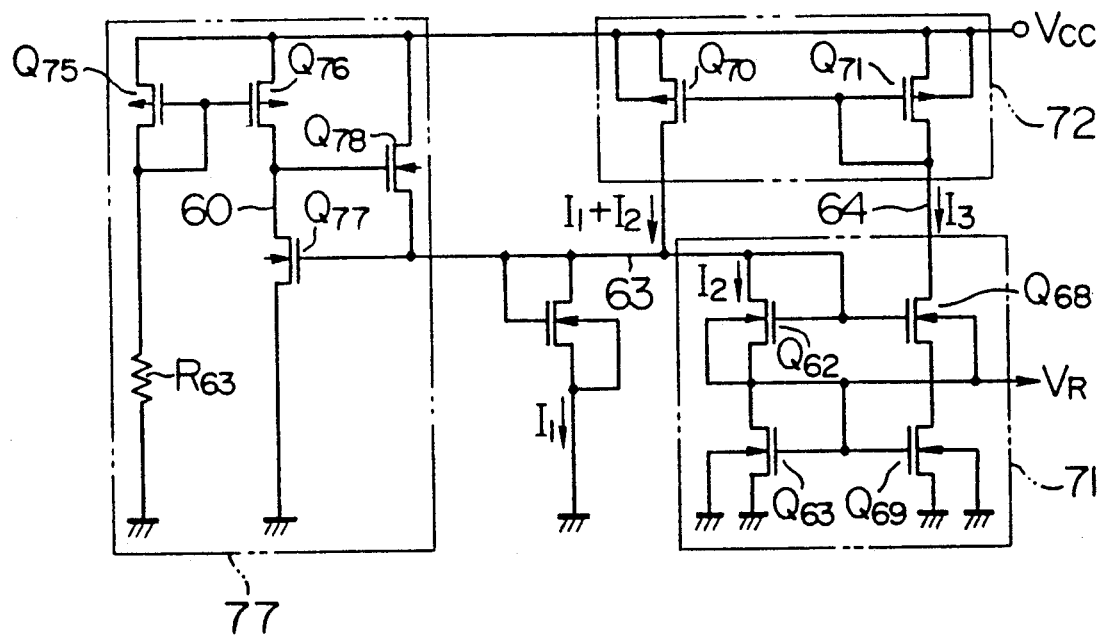
FIG. 11 is a circuit diagram of a seventh embodiment of the reference voltage generator according to the invention.

Preferably, a start circuit may be added to the self-bias type circuit. The start circuit can serve to prevent the self-bias type circuit from falling in an undesirably stable point. To explain this connection by referring to, for example, the FIG. 9A circuit, at a desirably stable point, the reference voltage $V_R$ is normally generated and under this condition, voltage $V_3$ at node 63 is $V_3 = -2 \ V_R$ and voltage $V_4$ at node 64 is $V_4 \approx V_{CC} - |V_{TP}|$. However, in addition to the above stable point, there is another stable point at which $I_1 = I_2 = 0$ and under this condition $V_3 = 0$, $V_4 = V_{CC}$ and $V_R = 0$ stand. FIG. 11 shows a seventh embodiment of the reference voltage generator wherein a start circuit 77 is added to a reference voltage generating circuit (FIG. 9A circuit) to prevent it from falling in the latter stable and $Q_{76}$ and a resistor $R_{63}$ (replaceable with a MOSFET) form a current source. When the reference voltage generating circuit (FIG. 9A circuit in this embodiment) is at the undesirably stable point, $V_3 = 0$ stands and in the start circuit, an EEMOS $Q_{77}$ is rendered non-conductive and a node 60 is charged with the current source. Then, $Q_{78}$ is rendered conductive to raise voltage at the node 63, thereby causing the reference voltage generating circuit to escape from the undesirably stable point. Subsequently, when the reference voltage generating circuit reaches the desirably stable point, $V_3$ exceeds $V_{TEE}$ to render $Q_{77}$ conductive and the voltage at the node 60 lowers. As a result, $Q_{78}$ is rendered non-conductive and the start circuit does not affect the operation of the reference voltage generating circuit any more.

The reference voltage generator according to the foregoing embodiments may be applied to DRAM's as will be described hereinafter.

Figure 12:
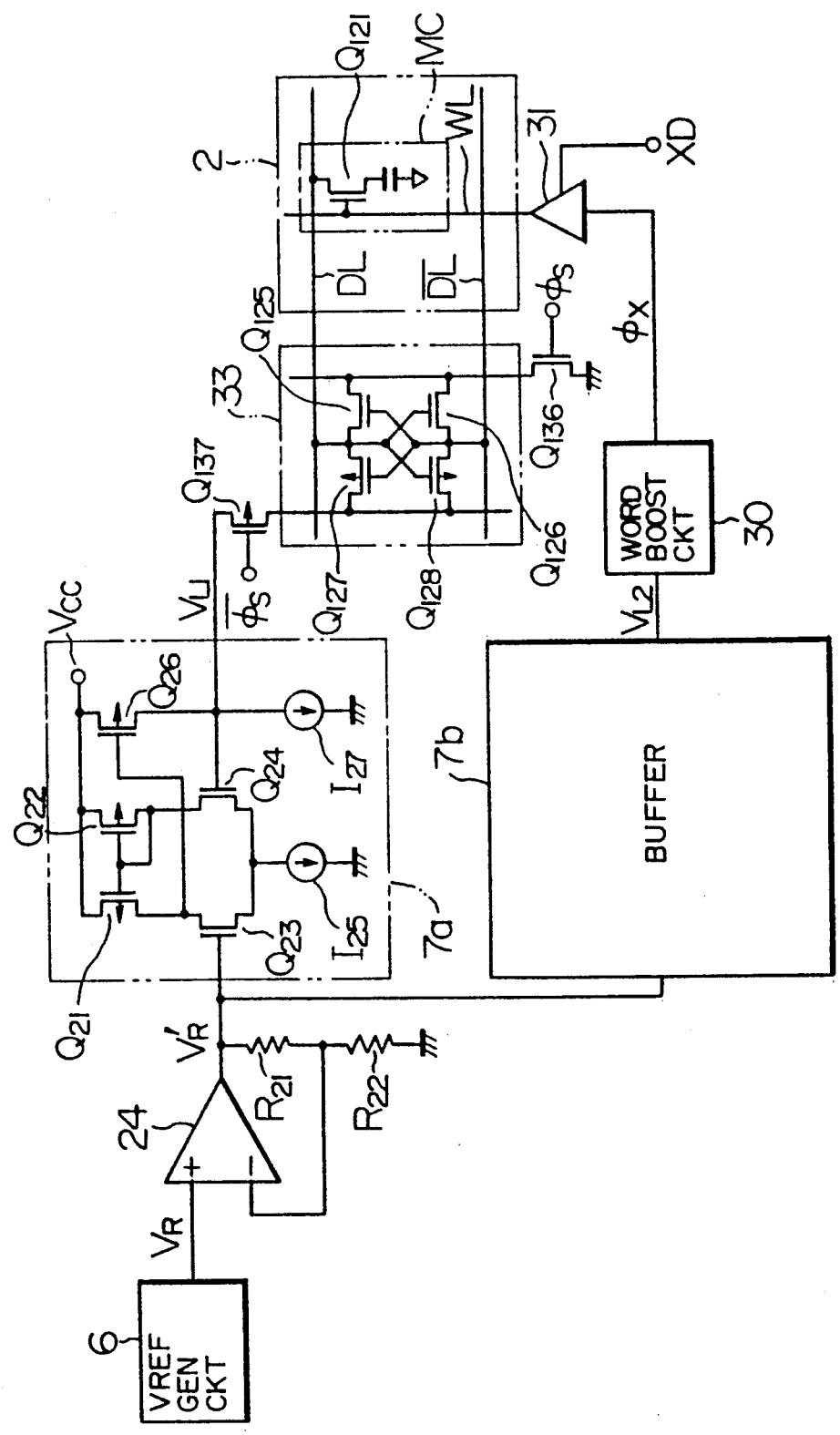
FIG. 12 is a circuit diagram of a first embodiment of an application arrangement according to the FIG. 13 is a circuit diagram of a second embodiment of the application arrangement according to the invention.

FIG. 12 shows a first embodiment of an application arrangement according to the invention, particularly, a first embodiment of a DRAM comprising on-chip voltage limiter used for operating a memory array at an internal voltage $V_L$ (generally representing $V_{L1}$ and $V_{L2}$) lower than external power supply voltage $V_{CC}$. Referring to FIG. 12, reference numeral 6 designates the reference voltage generator according to the invention, 24 a differential amplifier, 7a and 7b buffers, 30 a word (line) boost circuit, 2 a memory array having memory cells MC arranged in matrix, 33 a sense amplifier and 31 a word driver.

The differential amplifier 24 and two resistors $R_{21}$ and $R_{22}$ form a circuit which generates from the output voltage $V_R$ of the reference voltage generator 6 an operating voltage $V_R'$ for the memory array given by equation (22):

$$V_{R'} = \frac{R_{21} + R_{22}}{R_{22}} V_R \qquad (22)$$

Since the difference in threshold voltage between FET's is used as reference voltage $V_R$ as described previously, the reference voltage $V_R$ is not always suited as operating voltage for the memory array. Therefore, $V_R$ is converted into $V_R'$ by means of that circuit. For example, where $V_R = 1$ V and $V_R = 3$ V, $R_{21}:R_{22}=2:1$ is set up. Fine adjustment or so-called trimming of $V_R'$ can be permitted by making $R_{21}$ and $R_{22}$ variable. A method of trimming as described in, for example, the previously-described U.S. patents may be employed.

The buffers 7a and 7b are adapted to promote current drivability of $V_R'$. The buffer 7a comprises a differential amplifier including MOSFET's $Q_{21}$ to $Q_{24}$ and a current source $I_{25}$ and an output stage including a MOSFET $Q_{26}$ and a current source $I_{27}$. The construction of the buffer 7b is the same as that of the buffer 7a and is not illustrated. Since, in the buffer, feedback is applied from the output stage to the input of the differential amplifier, the buffer operates such that output voltage $V_{L1}$ or $V_{L2}$ follows the input voltage $V_R'$. Thus, the output voltage $V_{L1}$ or $V_{L2}$ can have great drivability without changing its value. The output voltage $V_{L1}$ is used to drive a sense amplifier 33 and the output voltage $V_{L2}$ is used to drive the word line.

In this embodiment, technique called word boost is used which makes the word line voltage higher than the operating voltage (in this example, $V_{L1}$) for the memory array. Therefore, the word line boost circuit 30 is provided. Fed to the circuit 30 is not the external power supply voltage $V_{CC}$ but the internal power supply voltage $V_{L2}$. Accordingly, the $V_{L2}$ is boosted to provide a word line drive signal $\phi_x$. The word driver 31 receives the word line drive signal $\phi_x$ and a decoder output signal XD to drive a word line WL.

The sense amplifier 33 used in this embodiment is an ordinary CMOS sense amplifier comprising P-channel MOSFET's $Q_{125}$ and $Q_{126}$ and N-channel MOSFET's $Q_{127}$ and $Q_{128}$. The sense amplifier 33 is started to operate by turning on a MOSFET $Q_{136}$ with $\phi_S$ of high level and turning on a MOSFET $Q_{137}$ with $\overline{\phi_S}$ of low level. The source of $Q_{137}$ is connected to not the external power supply $V_{CC}$ but the internal power supply $V_{L1}$ and therefore, when the circuit 33 is operated, the high level side of data line assumes $V_{L1}$ and the low level side thereof assumes earth potential. In other words, the amplitude of data line is suppressed to $V_{L1}$.

Figure 13:
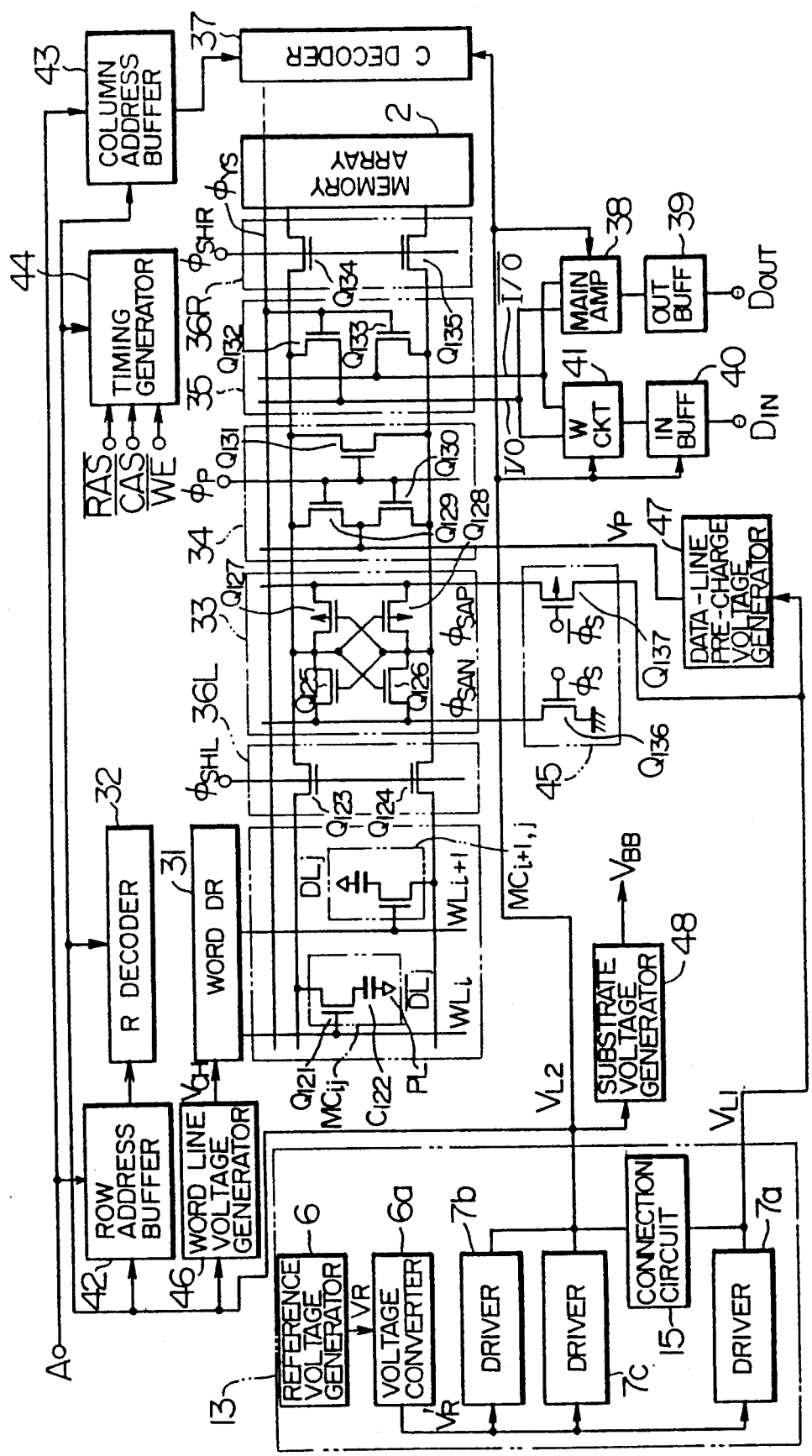
Figure 14:
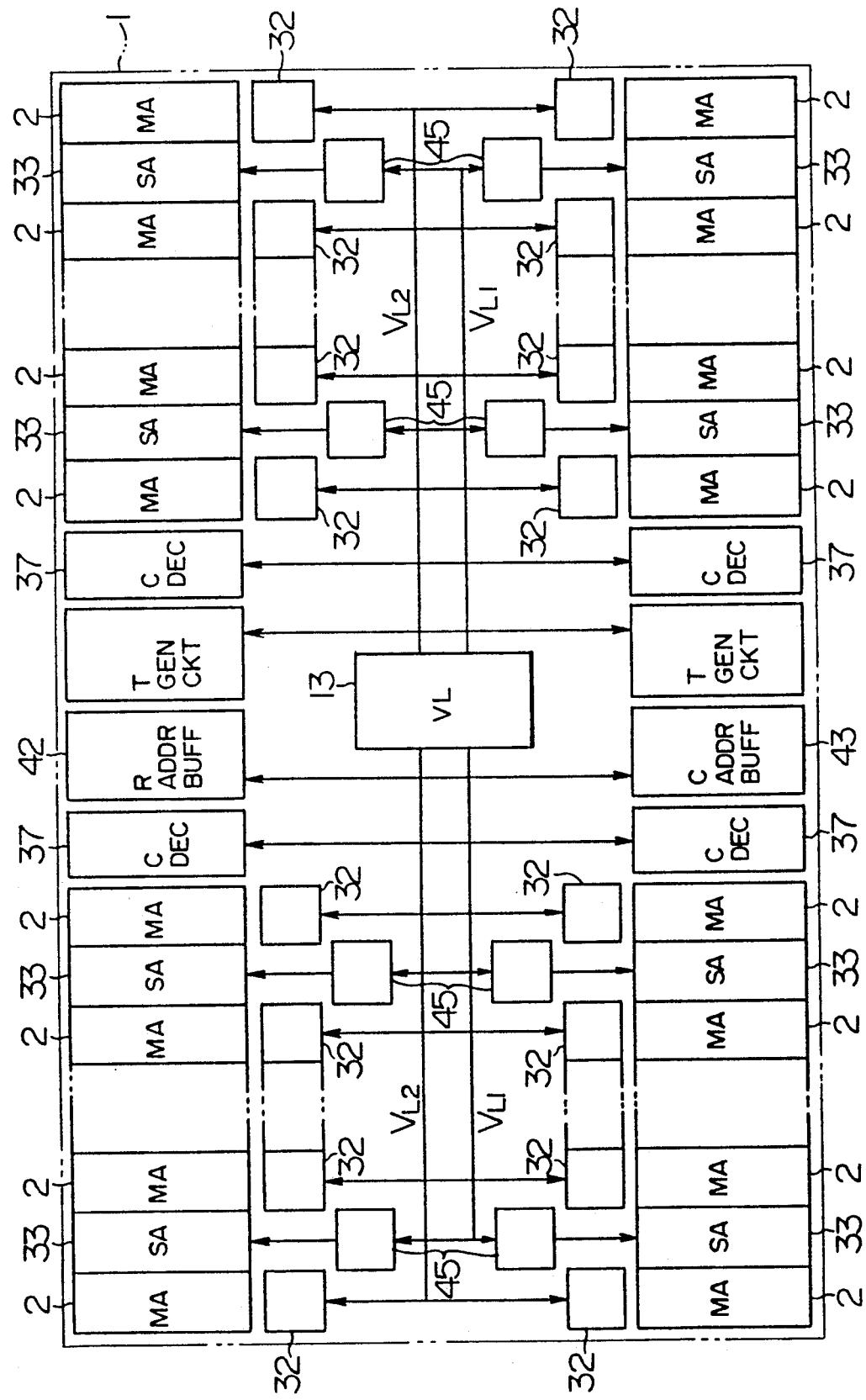
FIG. 14 is a diagram showing a layout in the chip in the FIG. 13 embodiment.
Figure 15:
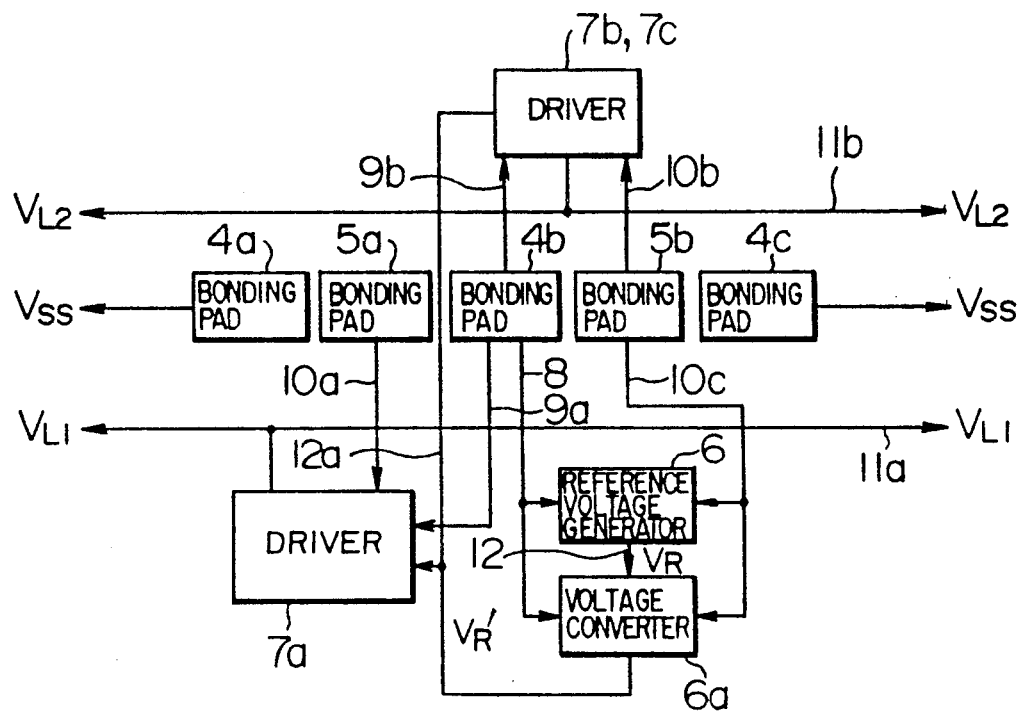
FIG. 15 is a diagram showing a detailed layout of a voltage limiter used in the FIG. 13 embodiment.

A second embodiment of the DRAM to which the invention is applied will now be described. FIG. 13 is a circuit diagram of a DRAM of 16 M bits to which the invention is applied, FIG. 14 shows a layout in the chip, FIG. 15 shows a detailed layout of a voltage limiter 13. The layouts are illustrated with omission of some of circuits for simplicity of explanation. In these figures, 1 designates a semiconductor chip, 2 a memory array, 31 a word driver, 32 a row decoder, 33 a sense amplifier, 34 a data line pre-charge circuit, 35 a data line selection circuit, 36L and 36R switch circuits, 37 a column decoder, 38 a main amplifier, 39 a data output buffer, 40 a data input buffer, 41 a write circuit, 42 a row address buffer, 43 a column address buffer, 44 a timing generator, 45 a sense amplifier drive signal generator, 46 a word line voltage generator, 47 a data line pre-charge voltage generator, and 48 a substrate voltage generator. The voltage limiter circuit 13 includes the reference voltage generator 6 according to the foregoing embodiments, a voltage converter 6a, drivers 7a, 7b and 7c, bonding pads 4a, 4b and 4c for ground $V_{SS}$, and bonding pads 5a and 5b for external power supply voltage $V_{CC}$. The reference voltage generator 6 generates voltage $V_R$ (1.1 V herein) stabilized against external power supply voltage $V_{CC}$ (5 V herein) and the voltage converter 6a converts the voltage $V_R$ into $V_{R'}$ (3.3 V herein). The drivers are responsive to $V_{R'}$ to generate power supply voltage $V_{L1}$ for memory array and power supply voltage $V_{L2}$ for peripheral circuits. In this embodiment, the $V_{L1}$ and $V_{L2}$ are both of a voltage level of 3.3 V.

This embodiment of FIG. 13 has a first feature that the voltage limiter circuit is also applied to the peripheral circuits. The $V_{L1}$ is supplied to the circuits 45 and 47 and the $V_{L2}$ to the circuits 32, 37, 38, 40, 41, 42, 43, 44, 46 and 48. Thus, excepting the data output buffer 39, all of the circuits are driven with the internal power supply voltage $V_{L1}$ or $V_{L2}$. By operating even the peripheral circuits at the stabilized voltage $V_{L1}$ lower than the external power supply voltage $V_{CC}$, power consumption in the peripheral circuits can be reduced and their operation can be stabilized.

A second feature of this embodiment is that the voltage limiter circuit 13 is disposed centrally of the semiconductor chip. This disposition can reduce voltage drop due to impedance of wiring conductors 11a and 11b for internal power supply voltages $V_{L1}$ and $V_{L2}$. Consequently, stability and speed-up of the operation of the circuits fed with $V_{L1}$ and $V_{L2}$ can be ensured.

A third feature of this embodiment resides in the manner of wiring ground conductors. A short ground wiring conductor 8 is dedicated to the reference voltage generator and voltage converter. Ground wiring conductors 9a and 9b are laid for the drivers. Of the bonding pads 4a, 4b and 4c, the bonding pad 4b associated with component circuits of the limiter is provided independently of the bonding pads 4a and 4c associated with other circuits in the chip. With this disposition, noise generated on the ground wiring conductors by current flow due to the operation of the component circuits can be prevented from adversely affecting other circuits. Especially, when noises are generated on the ground wiring conductors for the reference voltage generator and voltage converter, these noises cause the levels of the internal power supply voltages $V_{L1}$ and $V_{L2}$ to change and this change affects almost all of circuits in the chip. Therefore, it is preferable that the length of the wiring conductor 8 be minimized and this conductor 8 be separated from other ground wiring conductors. The most preferable way of achieving this design is to dispose the bonding pad for wiring conductor 8 independently of the bonding pads for other conductors but wiring conductors may otherwise be distributed separately from a common bonding pad. Although not shown in the illustration, a ground wiring conductor associated with the memory array may preferably be separated from other wiring conductors because when the sense amplifier of the DRAM operates for amplification, many data lines (typically having a capacitance of several of thousands of pF in total) undergo simultaneous charging/discharging to generate a large noise on that ground wiring conductor.

A fourth feature of this embodiment resides in the manner of wiring power supply conductors. Of the bonding pads 5a and 5b for external power supply voltage $V_{CC}$, the pad 5a is associated with the memory array and the pad 5b is associated the peripheral circuits, and they are provided independently of each other. And, the driver 7a for the memory array is disposed near the bonding pad 5a and the drivers 7b and 7c are disposed near the bonding pad 5b. With this disposition, voltage drops on power supply wiring conductors 10a and 10b can be reduced. Typically, the voltage drops, unless excessive, can be absorbed by the drivers but excessively large voltage drops can not be absorbed by the drivers, decreasing the internal power supply voltage $V_{L1}$ or $V_{L2}$. For prevention of this disadvantage, impedance of the wiring conductors 10a and 10b is desired to be minimized as in the case of the present embodiment. Like the ground conductor pads, separate disposition of the power supply conductor pads associated with the peripheral circuit and memory array is employed in order that noise generated on the power supply wiring conductors by current flow due to the operation of the component circuits can be prevented from adversely affecting other circuits. In this embodiment, the reference voltage generator and voltage converter are fed from the common bonding pad 5b but obviously, they may be fed from separate bonding pads.

Although not shown in the illustration, a ground wiring conductor and a power supply wiring conductor which are associated with the data output buffer may preferably be separated from those associated with other components because when the data output buffer operates, the external load (typically having a capacitance of several of hundreds of pF) undergoes charging/discharging to generate a large noise on the ground and power supply wiring conductors associated with the data output buffer directly fed from the external power supply $V_{CC}$.

Details of each component of the FIG. 13 DRAM will now be described.

Firstly, the reference voltage generator 6 will be described. The reference voltage generator may be realized with any one of the circuits shown in FIGS. 7A to 11. As described previously, the MOSFET's used in the reference voltage generator have back gates preferably connected to their sources, respectively, for the purpose of minimizing the influence of the change of substrate potential. Taking the circuits of FIGS. 10A and 10B, for instance, the difference in threshold voltage between the P-channel MOSFET's is obtained as reference voltage $V_R$. In this case, P-channel MOSFET's having a structure exemplified in FIGS. 16A and 16B may be used as $Q_{73}$ and $Q_{74}$. Thus, FIG. 16A shows a first embodiment of layout of the $Q_{73}$ or $Q_{74}$, and FIG. 16B is a sectional view taken on the line a—a' of FIG. 16A. In these figures, 101 designates a P-type semiconductor substrate, 102 an N-type well, 103 an N+ diffusion layer, 107 a P+ diffusion layer, 104 a SiO₂ isolation region, 106 a gate made of polycrystalline silicon or metal, 113 an inter-layer insulating film, 108 a wiring layer, 115 a passivation film, and 116 a contact hole. The source diffusion layer (corresponding to the left-hand P+ diffusion layer in FIG. 16B) is connected to the N well by the wiring layer 108. This junction corresponds to the node 66 in the circuits of FIGS. 10A and 10B. The structure shown in FIGS. 16A and 16B may be prepared through ordinary CMOS process.

Figure 17A:
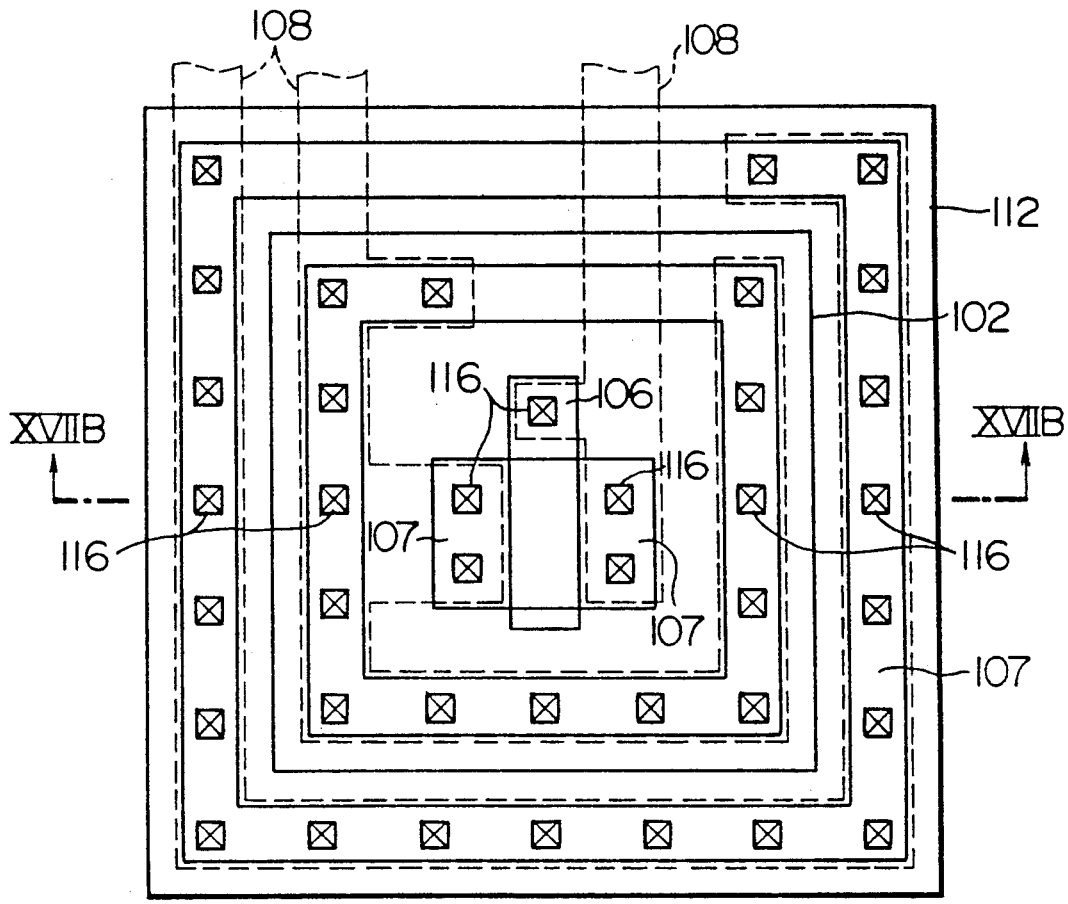
FIG. 17A is a diagram showing a second embodiment of structure of the MOSFET used in the reference voltage generator according to the invention.
Figure 17B:
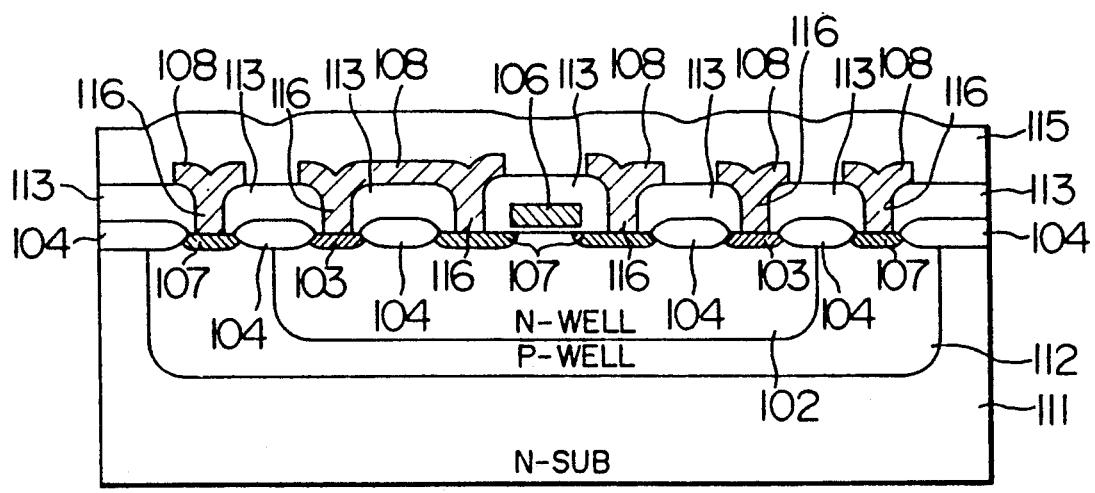
FIG. 17B is a sectional view taken on the line b—b' of FIG. 17A.

FIGS. 17A and 17B show a second embodiment of structure of the $Q_{73}$ or $Q_{74}$. In these figures, 111 designates an N-type substrate and 112 a P-type well. As best seen in FIG. 17B, the well has a two-layer structure whereby by fixing potential of the outer well 112 to, for example, ground, the substrate 111 and the back gate (inner well) 102 of MOSFET can be shielded from each other electrostatically. Consequently, the back gate can be protected from noise interference otherwise affecting through parasitic capacitance between the back gate and substrate, thereby eliminating the effect of the change of substrate potential substantially completely. The substrate 111 may be connected to, for example, the external power supply $V_{CC}$. The structure can be prepared at relatively low costs through a process of ordinary CMOS process added with one step of forming a well and can attain promoted effects.

In the circuits of FIGS. 7A to 9B and FIG. 11, the difference in threshold voltage between the N-channel MOSFET's $Q_{61}$ and $Q_{62}$ is obtained as reference voltage. An N-channel MOSFET having a structure wherein conductivity types are opposite to those in the structure, well and diffusion layers of FIGS. 16A and 16B or FIGS. 17A and 17B may be used as the $Q_{61}$ or $Q_{62}$.

The paired MOSFET's for generation of the reference voltage ($Q_{73}$ and $Q_{74}$ in the circuits of FIGS. 10A and 10B or $Q_{61}$ and $Q_{62}$ in the circuits of FIGS. 7A to 9B and FIG. 11) desirably have layout patterns which are geometrically congruent to each other and disposed in the same direction in order to minimize the influence of irregularity in manufacture process. For example, the arrangement of contact holes formed above the source/drain diffusion layer is made to be the same for the paired MOSFET's so that these MOSFET's may be affected equally by the diffusion layer resistance. Further, the direction of channel is made to be the same for the paired MOSFET's so that these MOSFET's may not be affected by the difference in mobility between different crystal plane directions.

Figure 18:
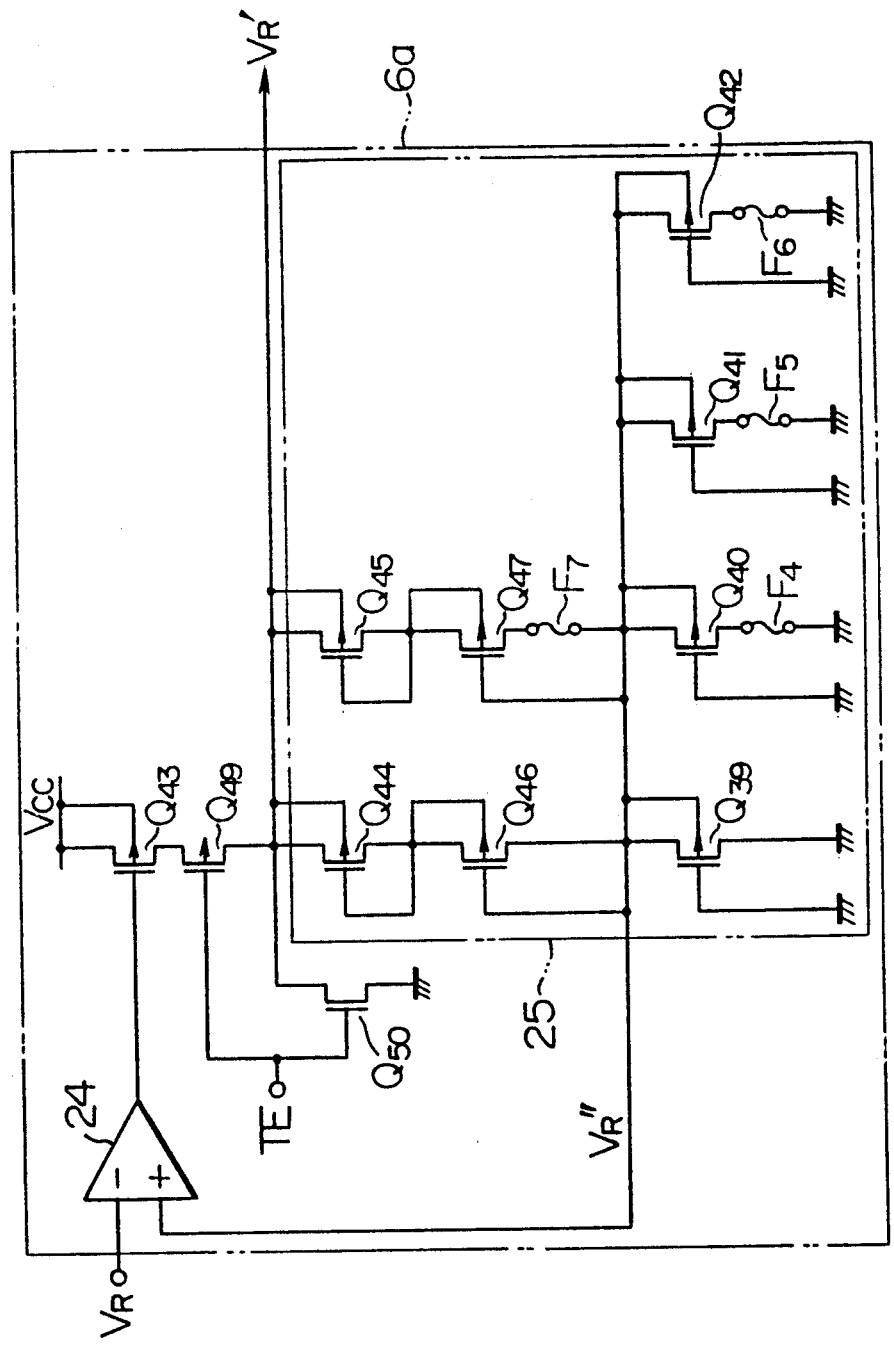
FIG. 18 is a circuit diagram of an embodiment of voltage converter used in the FIG. 13 embodiment.

Next, the voltage converter 6a will be described. FIG. 18 shows an embodiment of the voltage converter. Referring to FIG. 18, reference numeral 24 designates a differential amplifier, 25 a trimming circuit, $Q_{39}$ to $Q_{47}$ and $Q_{49}$ P-channel MOSFET's and $F_4$ to $F_7$ fuses. Embodiments of the trimming circuit will be described later with reference to FIGS. 35, 37 and 39A and should be referred to here for better understanding of the FIG. 18 embodiment of the voltage converter. The voltage converter generates a voltage $V_R'$ which is constant number times the reference voltage $V_R$. This converter also permits fine adjustment (trimming) of voltage necessary for compensating irregularity in $V_R$ due to manufacture process.

The differential amplifier 24 has one input terminal to which $V_R$ is applied and the other input terminal to which a voltage $V_R''$, determined by dividing $V_R'$ by the MOSFET's $Q_{44}$ to $Q_{47}$ and $Q_{39}$ and $Q_{42}$, is applied. Assuming that the differential amplifier 24 has a sufficiently large gain, the output voltage $V_R'$ is given by $$V_R' = \frac{R_{T1} + R_{T2}}{R_{T2}} \cdot V_R$$

where $R_{T1}$ is resistance of a resistor equivalent to a circuit comprised of $Q_{44}$ to $Q_{47}$ and $R_{T2}$ is resistance of a resistor equivalent to a circuit comprised of $Q_{39}$ to $Q_{42}$. For adjustment of $V_R'$, the fuses are fused to change $R_{T1}$ and $R_{T2}$. As described previously, since standard values of $V_R$ and $V_R'$ are 1.1 V and 3.3 V, respectively, $R_{T1}$ $R_{T2}=2:1$ is held when the fuses are not fused. For $V_R$ 1.1 V, the $R_{T2}$ is increased by fusing the fuses $F_4$ to $F_6$ and for $V_R < 1.1$ V the $R_{T1}$ is increased by fusing the fuse $F_7$, thus ensuring that the $V_R'$ can be so adjusted as not to greatly deviate from the standard value.

The MOSFET's $Q_{49}$ and $Q_{50}$ are adapted to set up $V_R'=0$ V in test mode. Specifically, a signal TE assumes the $V_{CC}$ level in the test mode to turn on the MOSFET $Q_{50}$, thereby making the output voltage $V_R'$ zero volt.

The circuit shown in FIG. 18 is advantageous over the circuit described in U.S. Pat. No. 4,100,437 in that the occupation area by the former circuit prepared through ordinary MOS process is smaller. To explain, in contrast to the circuit described in the U.S. patent wherein resistors are used as elements for dividing the output voltage $V_R'$, the circuit of FIG. 18 uses the MOSFET's for the same purpose. In order to reduce current consumption in the circuit, the element for voltage division must have a sufficiently large equivalent resistance (about several of hundreds of k$\Omega$). The elements having a large equivalent resistance can be prepared through ordinary MOS process in a smaller area by MOSFET's than by resistors. With the MOSFET's used as the voltage division elements, however, characteristics of the $V_R'$ are expected to change as the threshold voltages of these MOSFET's change. This disadvantage can be obviated by making the channel width and channel length of each MOSFET large enough to suppress irregularity, connecting the back gate to the source to avoid the influence of the change of substrate voltage and selecting a method of fusing the fuses in expectation of irregularity in the threshold voltages. For minimization of the influence of the change of substrate voltage, each of the MOSFET's used for trimming may preferably have the structure shown in FIGS. 16A and 16B or FIGS. 17A and 17B.

Figure 19:
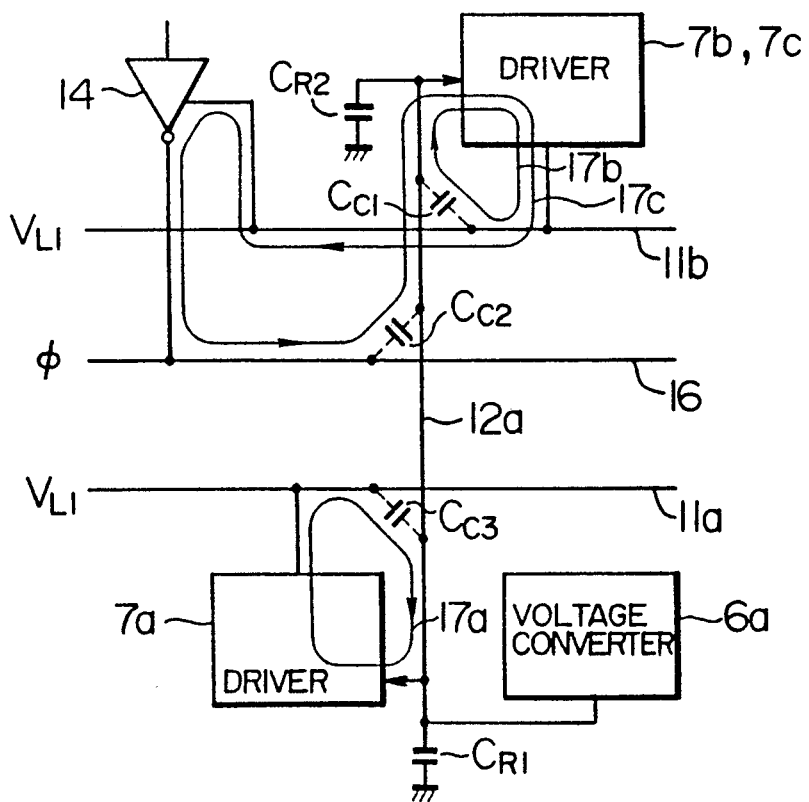
FIG. 19 is a circuit diagram useful to explain the operation of the voltage limiter circuit.

Preferably, capacitors of large capacitance may be connected between ground and terminals for reference voltages $V_R$ and $V_R'$. These capacitors are effective to reduce impedance against high frequency components of the reference voltages $V_R$ and $V_R'$, so as to bypass high frequency noise. Especially where a wiring conductor 12a for $V_R'$ is forced to intersect with other wiring conductors as shown in FIG. 15, the provision of the above capacitors is effective to stabilize the operation or prevent oscillation of the voltage limiter circuit. The reasons for this will be described with reference to FIG. 19.

The drivers 7a and 7b are responsive to $V_R'$ to produce voltages $V_{L1}$ and $V_{L2}$ of large current drivability. When the wiring conductors for $V_{L1}$ and $V_{L2}$ per se or a wiring conductor 16 for the output (which assumes voltage level $V_{L2}$) of the circuit such as pulse generator 14 driven by the power supply of $V_{L2}$ intersects with the wiring conductor 12a for $V_R'$, feedback loops 17a to 17c are set up through parasitic capacitors $C_{C1}$ to $C_{C3}$. If the gain of the loop is larger than 1 (0 dB), the circuit of interest oscillates and even for the gain being smaller than 1 (one) the operation of the circuit becomes unstable if the margin is small. This critical condition can be curred by inserting, between $V_R'$ and ground, compensation capacitors $C_{R1}$ and $C_{R2}$ of sufficiently larger capacitance than that of the parasitic capacitors $C_{C1}$ to $C_{C3}$ to make the gain of the loop sufficiently small (for example, $-10$ dB or less).

Figure 20A:
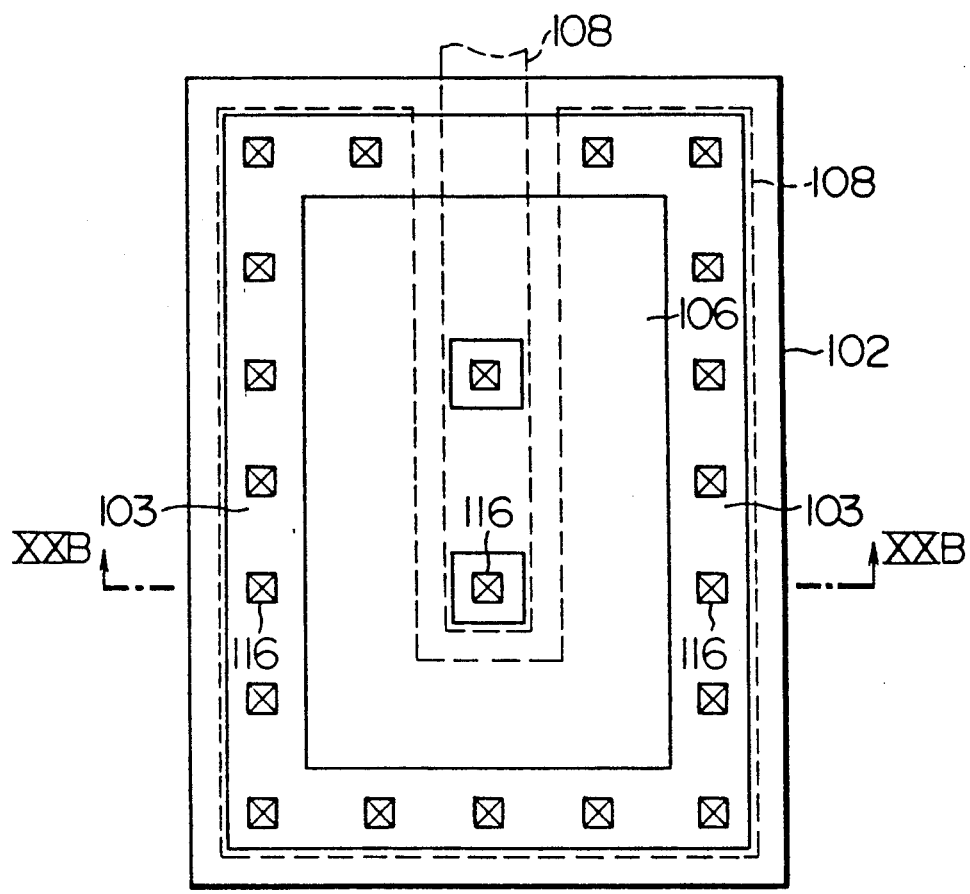
FIG. 20A is a diagram showing an embodiment of structure of a compensation capacitor explained in connection with FIG. 19.
Figure 20B:
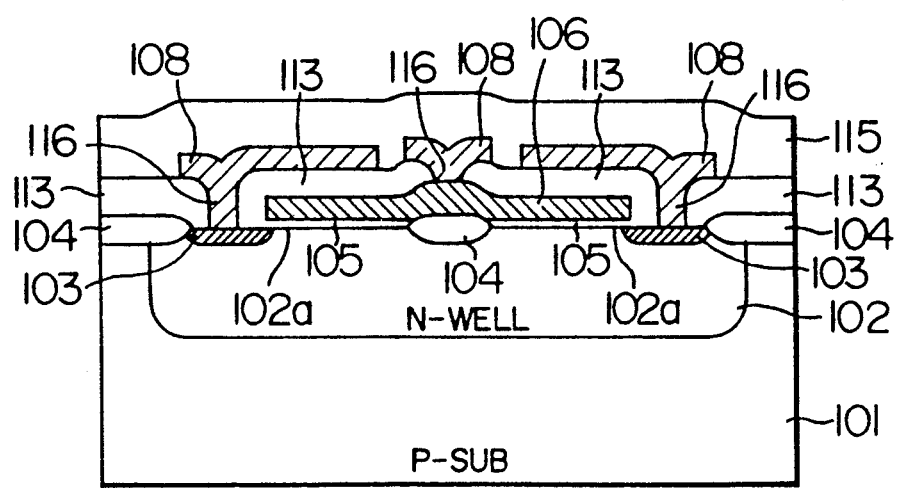
FIG. 20B is a sectional view taken on the line c—c' of FIG. 20A.

FIGS. 20A and 20B show an embodiment of a structure of the compensation capacitor. FIG. 20A particularly shows a layout of the capacitor $C_{R1}$ or $C_{R2}$ and FIG. 20B is a sectional view taken on the line C—C' of FIG. 20A. Referring to FIGS. 20A and 20B, 101 designates a P-type semiconductor substrate, 102 an N-type well, 103 an N+ diffusion layer, 104 a SiO$_2$ isolation region, 105 a gate insulating film, 106 a gate made of polycrystalline silicon or metal, 113 an inter-layer insulating film, 108 a wiring layer, 115 a passivation film and 116 a contact hole. Like ordinary MOS capacitors, the capacitor $C_{R1}$ or $C_{R2}$ is formed between the gate 106 and substrate surface 102a which sandwich the gate insulating film. This capacitor uses the thin gate insulating film as capacitor insulating film and hence it has a large capacitance to advantage even when its area is relatively small. However, this capacitor is different from the ordinary MOS capacitor in that it has a threshold voltage (flat band voltage) which is negative on account of the N well underlying the gate. Accordingly, this capacitor has a feature that as far as voltage in one direction is being applied to make the gate side positive, its capacitance remains almost unchanged. The procedure necessary for preparing the capacitor comprises a well formation step, an isolation region formation step, a gate insulating film formation step, a gate formation step, a diffusion layer formation step and a wiring step. All of the steps are included in the ordinary CMOS process and therefore, in the case of semiconductor apparatus manufactured through CMOS process, no additional step is required for preparation of the capacitor $C_{R1}$ or $C_{R2}$.

Figure 21A:
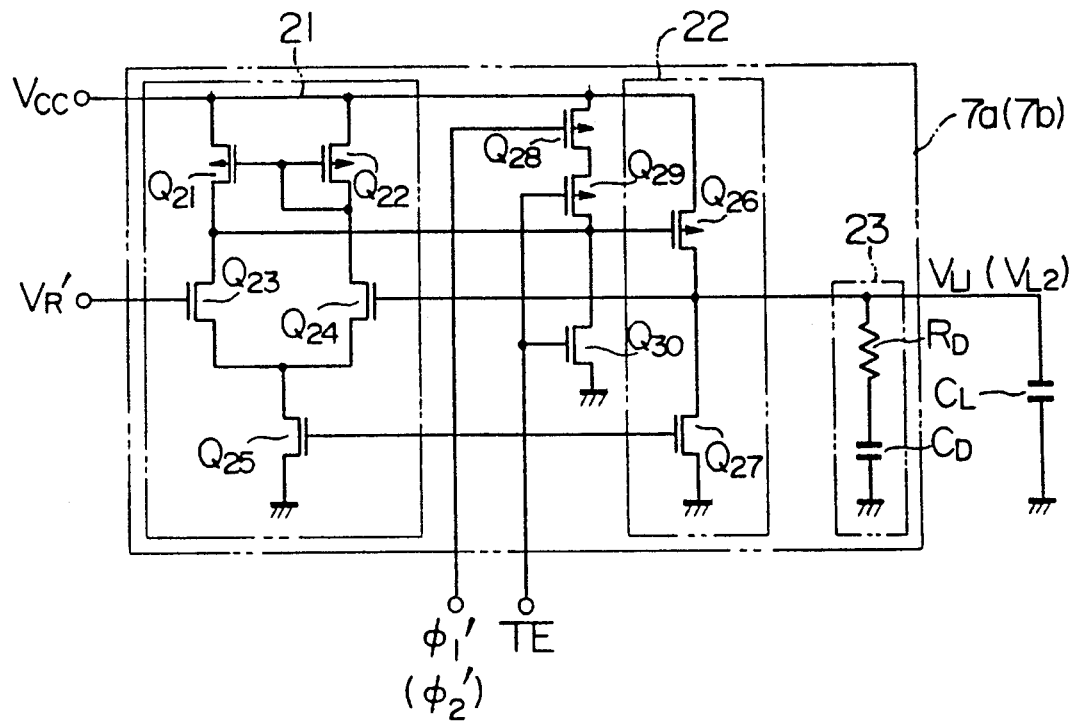
FIG. 21A is a circuit diagram of an embodiment of a driver used in the FIG. 13 embodiment.

FIG. 21A shows an embodiment of the driver 7a or 7b. Referring to FIG. 21A, the driver comprises a differential amplifier 21 including MOSFET's $Q_{21}$ to $Q_{25}$ and an output stage 22 including MOSFET's $Q_{26}$ and $Q_{27}$. The load (memory array or peripheral circuit) on the driver is equivalent to a capacitor $C_L$. The differential amplifier 21 has one input terminal to which reference voltage $V_R'$ is applied and the other input terminal to which $V_{L1}$ (or $V_{L2}$) is fed back. Accordingly, this circuit operates such that the $V_{L1}$ (or $V_{L2}$) follows the $V_R$. The driver also has a so-called compensation circuit 23 for stabilizing the operation of a feedback amplifier comprised of the differential amplifier 21 and output stage 22. MOSFET's $Q_{28}$ to $Q_{30}$ are adapted to maintain the output of the driver at high impedance when the driver is in deactivated status and to maintain the output voltage $V_{L1}$ (or $V_{L2}$) at $V_{CC}$ level in test mode. More particularly, a test signal TE is at low level and an activation signal $\phi_1'$ (or $\phi_2'$) is at low level during deactivated status, with the result that the gate of $Q_{26}$ assumes the $V_{CC}$ level and the output of the driver assumes a high impedance. At that time, the $Q_{25}$ and $Q_{27}$ are rendered non-conductive and consequently, power consumption in the circuit can be reduced. During test mode, the TE assumes the $V_{CC}$ level, the gate of $Q_{26}$ assumes the low level and the $V_{CC}$ is directly delivered.

Figure 21B:
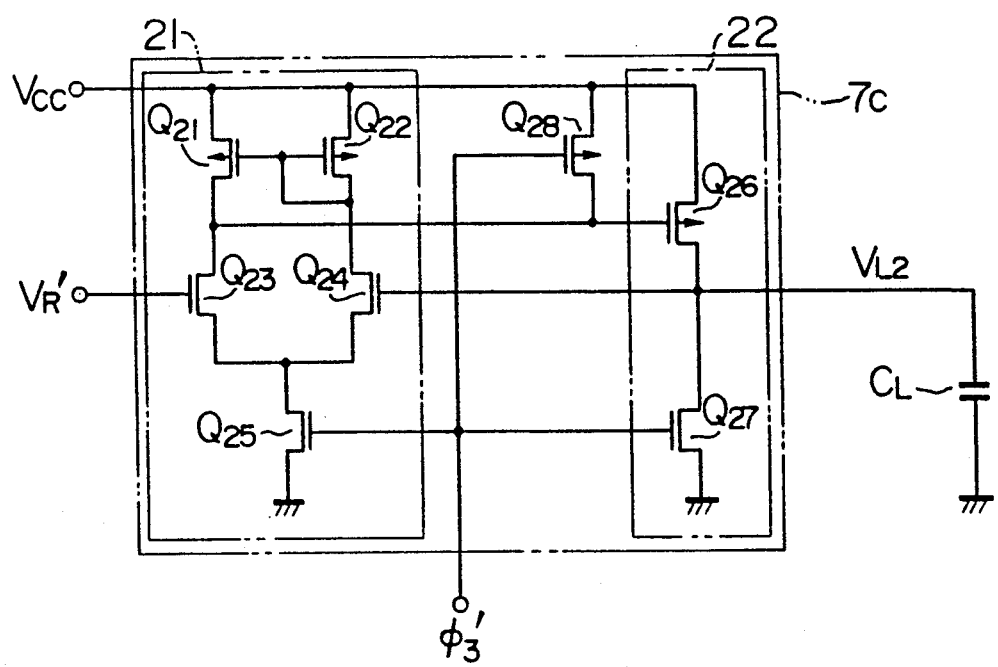
FIG. 21B is a circuit diagram of an embodiment of another driver used in the FIG. 13 embodiment.

FIG. 21B shows an embodiment of the driver 7C. The output of this circuit also assumes a high impedance when an activation signal $\phi_3'$ is at low level. The driver 7C connected in parallel with the driver 7b can utilize the compensation circuit of the driver 7b and has no compensation circuit.

As described previously, the driver 7a serves to provide $V_{L1}$ and the drivers 7b and 7C serve to provide $V_{L2}$. In normal status, the driver 7C is always activated but the drivers 7a and 7b are activated only when the memory is in operation. Accordingly, the activation signal $\phi_3'$ is always at $V_{CC}$ level but the activation signals $\phi_1$ and $\phi_2'$ assume the $V_{CC}$ level in accordance with the operation timing of the memory to be detailed later. In test mode, all of the activation signals $\phi_1'$, $\phi_2'$ and $\phi_3'$ assume the low level and the test signal TE assumes the $V_{CC}$ level. Then, both of the $V_{L1}$ and $V_{L2}$ equal $V_{CC}$. This equality is advantageous when memory operation (for example, dependency of access time upon power supply voltage) is examined by applying external power supply voltage directly to the memory. The reasons for this will be described below. Immediately after turn-on of the power supply, all of the activation signals $\phi_1'$, $\phi_2'$ and $\phi_3'$ are preferably validated so as to expedite the rise of $V_{L1}$ and $V_{L2}$. As will be described later, the voltage $V_{L2}$ is used to generate word line voltage $V_{CH}$ and substrate voltage $V_{BB}$. Therefore, by validating the $\phi_2'$ when voltage levels of $V_{CH}$ and $V_{BB}$ deviate from standard values, stability of the voltages $V_{CH}$ and $V_{BB}$ can be promoted. It should also be noted that the high level of the activation signals $\phi_1'$, $\phi_2'$ and $\phi_3'$ and test signal TE is set to not $V_{L2}$ but $V_{CC}$ with the view of rendering the P-channel MOSFET's $Q_{28}$ and $Q_{29}$ soundly nonconductive.

The drivers 7a and 7b must have large current drivability because they are required to drive a large capacitance of load (several of hundreds to several of thousands of pF) when the memory is in operation. Especially, the driver 7a is required to drive many data lines when the sense amplifier is operating for amplification. For example, given that capacitance per data line is 0.3 pF and the number of data lines is 8192, the total capacitance amounts up to 2500 pF. Under the circumstances, the MOSFET $Q_{26}$ used in the output stage of the driver 7a or 7b has a channel width and a channel length which measure, for example, about 3000 µm and 1.2 µm, respectively. The driver 7C on the other hand suffices by having current drivability necessary for compensating leakage current when the memory is in standby status, and about 100 µm channel width and about 1.2 µm channel length of its output MOSFET suffice.

Returning to FIG. 13, a connection circuit 15 is adapted to adjust the potential difference between $V_{L1}$ and $V_{L2}$ such that an excessively large difference is suppressed. With the potential difference between $V_{L1}$ and $V_{L2}$ being excessively large, there arises a problem that mismatch occurs in transmission/reception of signals between the memory array and peripheral circuit. FIG. 22 shows an embodiment of the connection circuit. Referring to FIG. 22, the connection circuit has N-channel MOSFET's $Q_1$, $Q_2$ and $Q_5$ and a P-channel MOSFET $Q_4$. Given that each N-channel MOSFET has a threshold voltage $V_{TN}$, the $Q_1$ is turned on when $V_{L1} - V_{L2} > V_{TN}$ and the $Q_2$ is turned on when $V_{L2} - V_{L1} > V_{TN}$. In this manner, the difference between $V_{L1}$ and $V_{L2}$ can be suppressed to below $V_{TN}$. Applied to the gate of the $Q_5$ is a signal WK which assumes the high level only immediately after turn-on of the power supply. This is particularly effective to prevent occurrence of potential difference when time constant of a load on $V_{L1}$ greatly differs from that of a load on $V_{L2}$. Even when any one of the $Q_1$, $Q_2$ and $Q_5$ is turned off, the MOSFET $Q_4$ of relatively small conductance is rendered conductive in order that $V_{L1} = V_{L2}$ can stand during, for example, standby status of the memory.

In the memory array 2 shown in FIG. 13, so-called one transistor/one capacitor type dynamic memory cells MCij each comprising a MOSFET $Q_{121}$ and a capacitor $C_{122}$ are arranged at intersections of word lines WLi and data lines DLj. Although only two word lines and only a pair of data lines are depicted in FIG. 13, a great number of word lines and data lines are laid in vertical and horizontal directions. One end plate of the capacitor $C_{122}$ is connected to a DC power supply. The DC power supply may be of a desired voltage level but from the standpoint of breakdown voltage of the capacitor $C_{122}$, its voltage level may preferably be $\frac{1}{2}$ of operating voltage of the memory array, that is, $V_{L1}/2$.

The word driver 31 is a circuit which receives the output signal of the word line voltage generator 46 to drive a selected word line. In this embodiment, the so-called word boost scheme is employed wherein the word line voltage is set to be higher than the memory operating voltage (here, $V_{L1} = 3.3$ V). This scheme can permit a large storage voltage of the memory cell to advantage. Voltage $V_{CH}$ generated from the word line voltage generator 46, where $V_{CH} > V_{L1}$, is therefore supplied to a selected word line.

The sense amplifier 33 is adapted to amplify a small signal on data line and it comprises a flip-flop including N-channel MOSFET's $Q_{125}$ and $Q_{126}$ and a flip-flop including P-channel MOSFET's $Q_{127}$ and $Q_{128}$. When MOSFET's $Q_{136}$ and $Q_{137}$ are turned on by high level of a signal $\phi_S$ and low level of a signal $\overline{\phi}_S$, the sense amplifier is activated.

The data line pre-charge circuit 34 is adapted to set each data line to a predetermined voltage $V_P$ prior to reading the memory cell. MOSFET's $Q_{129}$ to $Q_{131}$ are turned on by applying thereto a pre-charge signal $\phi_P$, so that voltages on data lines DLj and $\overline{DL}j$ equal $V_P$. The data line pre-charge voltage $V_P$ may be of a desired level but from the standpoint of decreasing data line charge/discharge current, its level may preferably be $\frac{1}{2}$ of operating voltage of the memory array, that is, $V_{L1}/2$.

The data line selection circuit 35 receives an output signal $\phi_{YS}$ from the column decoder 37 to connect a selected pair of data lines to input/output lines I/O and $\overline{I/O}$ through MOSFET's $Q_{132}$ and $Q_{133}$. In this embodiment, a so-called multi-division data line technique is employed wherein the output signal $\phi_{YS}$ of the single column decoder 37 located at one end is distributed to a plurality of data line selection circuits. This technique is effective to reduce the area to be occupied by the column decoder.

In this embodiment, a so-called shared sense amplifier and shared I/O technique is also employed wherein the lefthand and righthand memory arrays commonly share the sense amplifier 33, data line pre-charge circuit 34 and data line selection circuit 35. Since the components 33, 34 and 35 are commonly shared, the area to be occupied by then can be reduced. For selective use of the lefthand and righthand memory arrays, the switch circuit 36L controllable by a switch signal $\phi_{SHL}$ is connected between the lefthand memory array and the components 33, 34 and 35, and the switch circuit 36R controllable by a switch signal $\phi_{SHR}$ is connected between the righthand memory cell and these components.

The main amplifier 38, data output buffer 39, data input buffer 40 and write circuit 41 are used for data input/output. When reading, data latched in the sense amplifier 33 is delivered to a data output terminal $D_{out}$ through the input/output line, main amplifier 38 and data output buffer 39. When writing, data inputted from a data input terminal $D_{in}$ is first set on the input/output line through the data input buffer 40 and write circuit 41 and then written in a memory cell through the data line selection circuit 35 and data line. As described previously, in this embodiment, the component circuits 38, 40 and 41 are driven with the internal power supply voltage $V_{L2}$ to minimize power consumption and stabilize operation. For the convenience of the external interface (TTL compatible herein), only the data output buffer 39 is driven with the external power supply voltage $V_{CC}$ of 5 V.

The row address buffer 42 and column address buffer 43 are responsive to an external address signal A to supply address signals to the row decoder 32 and column decoder 37, respectively. The timing generator 44 is responsive to external control signals $\overline{RAS}$, $\overline{CAS}$ and $\overline{WE}$ to generate timing signals necessary for operation of the memory. The component circuits are also driven with the internal power supply voltage $V_{L2}$ to reduce power consumption and stabilize operation.

As described previously, the word line voltage generator 46 generates the word line voltage $V_{CH}$ (about 5 V herein). This voltage is also used for the switch circuit as will be described later. The data line pre-charge voltage generator 47 produces the data line pre-charge voltage $V_P$ (1.65 V herein). The substrate voltage generator 48 produces the voltage $V_{BB}$ ($-2$ V herein) applied to the semiconductor substrate. The component circuits are fed not from the power supply of $V_{CC}$ but from the power supply of stabilized $V_{L1}$ or $V_{L2}$. This leads to the advantage that even when the $V_{CC}$ changes, the change of the output voltage is small.

Read operation of the FIG. 13 DRAM will now be described with reference to FIG. 23 illustrating operation waveforms.

During standby status ($\overline{RAS}$ and $\overline{CAS}$ being both at high level), the data line pre-charge signal $\phi_P$ and switch signals $\phi_{SHL}$ and $\phi_{SHR}$ are all at high level equalling $V_{L2}$, and the data lines DL and $\overline{DL}$ are set to $V_P$. In addition, the sense amplifier drive signals $\phi_{SAN}$ and $\phi_{SAP}$ and input/output lines I/O and $\overline{I/O}$ are pre-charged to $V_P$ by means of a pre-charge circuit not shown in FIG. 13. Under this condition, of the activation signals for the drivers of voltage limiter, only $\phi_3'$ assumes the high level equalling $V_{CC}$ but $\phi_1'$ and $\phi_2'$ assume the low level. Accordingly, only the driver 7C of small power consumption adapted for standby is activated or validated to maintain the level of the internal power supply voltage $V_{L2}$. At that time, the level of $V_{L1}$ is also maintained through the connection circuit 15. The drivers 7a and 7b of large current drivability but of large power consumption are deactivated or invalidated, thereby reducing power consumption during standby.

As the $\overline{RAS}$ falls to low level, the activation signal $\phi_2'$ for the peripheral circuit driver first assumes the high level equalling $V_{CC}$. As a result, the driver 7b of large current to be supplied to the peripheral circuits operative with the power supply voltage $V_{L2}$. Then, the pre-charge signal $\phi_P$ falls to low level equalling 0 (zero) V, the switch signal for the selected memory array ($\phi_{SHL}$ in FIG. 23) is boosted to $V_{CH}$ level, and the switch signal for the opposite side, unselected memory array ($\phi_{SHR}$ in FIG. 23) is decreased to 0 V. The switch signal $\phi_{SHL}$ is boosted for the following reasons. The amplitude of voltage for the sense amplifier is $V_{L1}$ as will be described later. If the level of $\phi_{SHL}$ remains to be $V_{L2}$, the amplitude of voltage for the data line decreases to $V_{L2}-V_{TN}$ and consequently the storage voltage of the memory cell also decreases to $V_{L2}-V_{TN}$, where $V_{TN}$ is threshold voltage of the N-channel MOSFET's $Q_{123}$ and $Q_{124}$. This problem can be prevented by boosting the $\phi_{SHL}$ to maintain the storage voltage of the memory cell.

Subsequently, when the row address buffer 42 and row decoder 32 are operated, one word line WLi is selected and the selected word line assumes voltage $V_{CH}$. Signal charges are read from individual memory cells on the word line WLi to individual data lines and potential on the data lines changes. Since the operation waveforms in FIG. 23 are depicted on the assumption that high potential nearly equalling $V_{L1}$ is stored in the capacitors of the memory cells, potential on the data line DLj is slightly raised and a potential difference takes place between DLj and $\overline{DLj}$.

Prior to operation of the sense amplifier, the activation signal $\phi_1'$ for the memory array driver assumes the high level equalling $V_{CC}$. As a result, the driver 7a is activated, permitting large current to be supplied to the sense amplifier drive signal generator 45 operative with the power supply voltage $V_{L1}$. Subsequently, the $\phi_S$ assumes high level equalling $V_{L2}$ and the $\overline{\phi_S}$ falls to low level equalling 0 V. Consequently, the MOSFET's $Q_{136}$ and $Q_{137}$ are rendered conductive, the $\phi_{SAN}$ is grounded through $Q_{136}$ and the $\phi_{SAP}$ is connected to $V_{L1}$ through $Q_{137}$, so that the small potential difference between the data lines DLj and $\overline{DLj}$ is amplified, with one of the data lines ($\overline{DLj}$ in FIG. 23) maintained at $V_{L1}$ and the other (DLj in FIG. 23) maintained at 0 V.

As the $\overline{CAS}$ falls to low level, the column address buffer 43 and column decoder 37 are operated to select one data line. As a result, the data line selection signal $\phi_{YS}$ assumes high level equalling $V_{L2}$ and a data line is connected to the input/output line through the data line selection circuit 35. Data latched in the sense amplifier 33 is delivered to the data output terminal $D_{out}$ through the input/output line, main amplifier 38 and data output buffer 39.

As the RAS recovers the high level, the word line WLi assumes low level and the $\phi_S$, $\overline{\phi_S}$, $\phi_{SHL}$, $\phi_{SHR}$ and $\phi_P$ recover the original levels. At that time, the activation signal $\phi_1'$ for the memory array driver assumes low level equalling 0 V, deactivating the driver 7a. As the $\overline{CAS}$ subsequently recovers the high level, the activation signal $\phi_2'$ for the peripheral circuit driver also assumes low level equalling 0 V, deactivating the driver 7b.

As is clear from the above description, the activation signals $\phi_1'$ and $\phi_2'$ assume the high level only at necessary timings. More specifically, the $\phi_1'$ assumes the high level during an interval of time which starts immediately before commencement of operation of the sense amplifier and ends when the $\overline{RAS}$ recovers the high level and the $\phi_2'$ assumes the high level as long as the $\overline{RAS}$ or $\overline{CAS}$ assumes the low level. In this manner, reduction of power consumption in the drivers 7a and 7b can be realized.

As described above, the reference voltage generator in accordance with the invention can dispense with the depletion type FET's and can provide the difference in threshold voltage between the enhancement type FET's as reference voltage. Since characteristics of the enhancement type FET's can be matched with each other more easily than matching of characteristics of the depletion type FET with characteristics of the enhancement type FET, the reference voltage stabler than that of the prior art can be obtained. Accordingly, when applied to, for example, the afore-mentioned voltage limiter of memory LSI circuit, the reference voltage generator can generate stabler internal power supply voltage.

Group 2

The invention will now be described by referring to embodiments of the second group. The following description will be given by referring to examples where the invention is mainly applied to semiconductor apparatus based on MOS technique but the invention may be applied to other semiconductor apparatus based on, for example, bipolar and BiCMOS techniques. Further, the external power supply voltage and internal power supply voltage will be described as being positive but the invention may also be applied when the voltage is negative, by inverting the polarity of transistors used.

The basic concept of the second group will first be described by referring to a first embodiment of a voltage limiter circuit as shown in FIG. 24. In FIG. 24, the voltage limiter circuit VL generates from external power supply voltage $V_{CC}$ internal power supply voltages $V_{L1}$ to $V_{L3}$ which will be represented hereinafter by $V_{Li}$ where i=1, 2 and 3. The voltage limiter circuit VL comprises a reference voltage generator VR and driver circuits $B_1$ to $B_3$ which will be represented hereinafter by $B_i$ where i=1, 2 and 3. The reference voltage generator VR generates a stable voltage $V_R$ which less changes with the external power supply voltage $V_{CC}$ and temperatures, and each driver circuit $B_i$ is responsive to the VR to generate a voltage $V_{Li}$ of large current drivability where i=1, 2 and 3. The driver circuit $B_i$ comprises a feedback amplifier $A_i$ where i=1, 2 and 3 and a compensation circuit $C_i$ where i=1, 2 and 3. Denoted by $Z_1$ to $Z_3$ are circuits in a semiconductor apparatus which serve as loads on the voltage limiter circuit VL. The load circuits $Z_1$ to $Z_3$ are operated by being fed with the voltages $V_{L1}$ to $V_{L3}$, respectively. The load circuits $Z_1$ to $Z_3$ are respectively controlled by timing signals $\phi_1$ to $\phi_3$. Timing signals $\phi_1'$ to $\phi_3'$ are synchronous with the timing signals $\phi_1$ to $\phi_3$, respectively.

A first feature of the FIG. 24 embodiment is that the load on the voltage limiter circuit is divided into three internal circuits (load circuits) $Z_1$ to $Z_3$, the driver in the voltage limiter circuit is also divided into three driver circuits $B_1$ to $B_3$ corresponding to the load circuits $Z_1$ to $Z_3$, and each of the driver circuits is applied with compensation. Generally, the circuit in semiconductor device contains a variety of elements such as capacitor, resistor, inductor, non-linear element or combination of them. These elements are distributed in the form of distributed constants on the semiconductor chip. Compensation needed for stable operation of the feedback amplifier having the sophisticated load is very difficult to achieve. By dividing the load into a plurality of internal circuits (load circuits) in accordance with type and size of the load as in the present embodiment, a feedback amplifier and compensation circuit suitable for each internal circuit can be designed relatively easily. With the optimum feedback amplifier and compensation circuit, stable operation of each driver circuit can be ensured.

Conceivably, the load can be divided, for example, in the following ways:

① A first way is to divide the load into resistive load and capacitive load, (2) A second way is to divide the load in accordance with the size (current consumption) of load, (3) A third way is to divide the load in accordance with operation timings in the voltage limiter circuit, and (4) A fourth way is to divide the load in accordance with physical locations in the semiconductor chip of the circuit.

In the case of the load division in accordance with physical locations, it is preferable that the driver circuits $B_1$ to $B_3$ be distributed as necessary.

A second feature of this embodiment is that each driver circuit $B_i$ is applied with the signal $\phi_i'$ synchronous with the timing signal $\phi_i$ for controlling each load circuit. Generally, current flowing through the circuit in semiconductor apparatus greatly changes depending on operation modes. As viewed from the power supply side, this signifies that load impedance changes. To comply with the change of load, the timing signal $\phi_i'$ is used in the present embodiment. Circuit constants of the feedback amplifier $A_i$ and compensation circuit $C_i$ are changed by the timing signal $\phi_i'$ so that their characteristics may always be adapted for operation mode of the load, thereby ensuring that the driver circuit can always be operated stably.

In this embodiment, all of the operating voltages $V_{L1}$ to $V_{L3}$ for the load circuits $Z_1$ to $Z_3$ have the same level. Therefore, the single reference voltage generator is provided and its output voltage $V_R$ is used in common for the driver circuits $B_1$ to $B_3$. When different operating voltages are used for different load circuits, the FIG. 24 embodiment may be modified into a voltage limiter circuit as shown in FIG. 25. In this modification, a plurality of reference voltage generators are provided. In an alternative, while a single reference voltage generator is provided, a voltage converter is built in each of the driver circuits $B_1$ to $B_3$.

Figure 26:
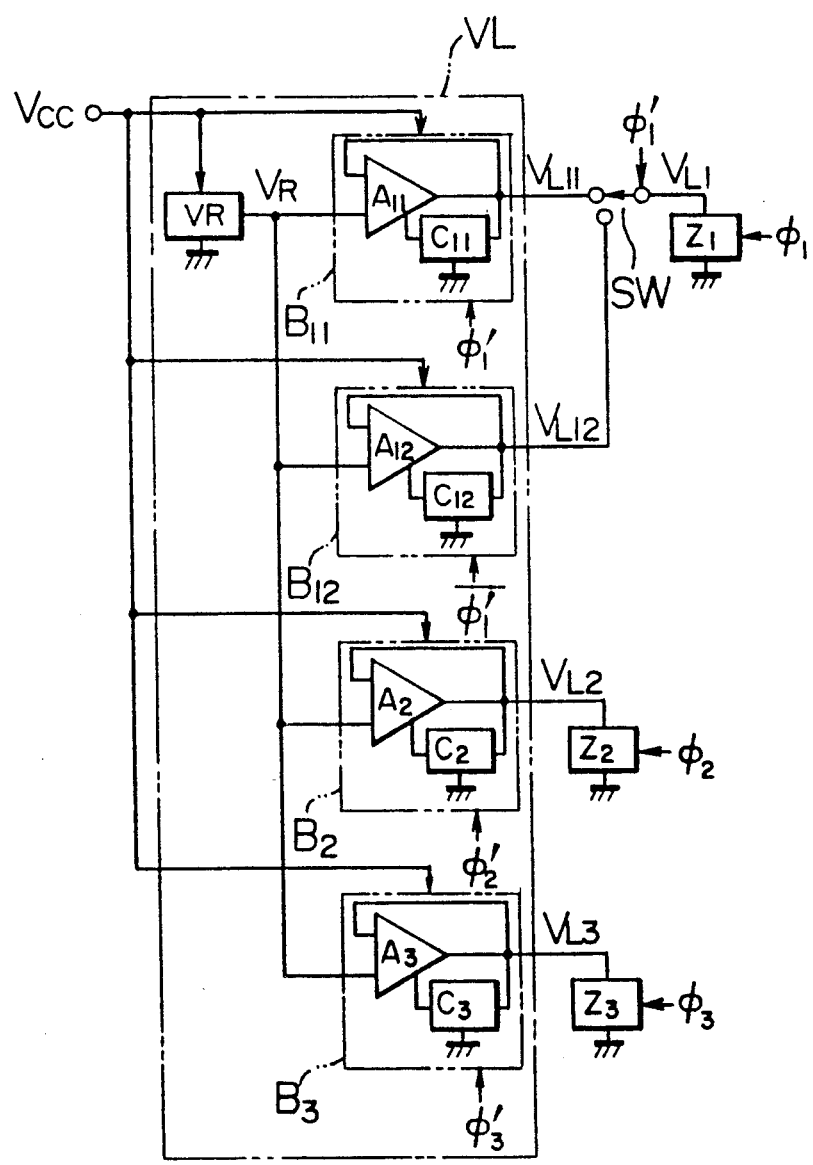
FIG. 26 is a circuit diagram of a second embodiment of the voltage limiter circuit according to the invention.

FIG. 26 shows a second embodiment of the voltage limiter circuit according to the invention. This embodiment features that a plurality of (two herein) driver circuits are provided in accordance with operation modes of one load circuit $Z_1$ and the outputs of the driver circuits are selectively connected to the load circuit by means of a switch SW. Driver circuits $B_{11}$ and $B_{12}$ are respectively applied with a timing signal $\phi_1'$ synchronous with the operation of the load circuit $Z_1$ and a signal $\overline{\phi}_1$, complement to the timing signal $\phi_1'$. One of output is selected by the switch SW and supplied to the load circuit $Z_1$. When the driver circuit $B_{11}$ is activated under application of high level of the $\phi_1'$ and the driver circuit $B_{12}$ is deactivated under application of low level of the $\overline{\phi}_1'$, the switch SW is transferred to $V_{L11}$. Conversely, when the driver circuit $B_{11}$ is deactivated under application of low level of the $\phi_1'$ and the driver circuit $B_{12}$ is activated under application of high level of the $\overline{\phi}_1'$, the switch SW is transferred to $V_{L12}$. Thus, either one of the two driver circuits $B_{11}$ and $B_{12}$ is used to supply internal power supply voltage $V_{L1}$ to the load circuit $Z_1$, with the other driver circuit disconnected from the load circuit $Z_1$.

In the FIG. 24 embodiment, circuit constants of the driver circuit are changed to comply with the change of the load. Occasionally, however, the load impedance greatly changes with operation modes and stable operations in a plurality of operation modes are difficult to achieve by merely changing the circuit constants. In such an event, the FIG. 26 embodiment may fulfill itself because each of the driver circuits $B_{11}$ and $B_{12}$ can be so designed as to be dedicated to one operation mode. For example, if current consumption greatly differs for the load circuit $Z_1$ in operating status and the load circuit $Z_1$ in standby status, then the design of the feedback amplifier and compensation circuit will be such that the driver circuit $B_{11}$ is allowed to operate stably when the load circuit $Z_1$ is in operating status and the driver circuit $B_{12}$ is allowed to operate stably when the load circuit $Z_1$ is in standby status.

In this embodiment, one driver circuit not in use is deactivated but this is not always necessary because the driver circuit not in use is disconnected from the load circuit by means of the switch. However, the deactivated status is desired for the sake of reducing power consumption. Further, the outputs of the driver circuits are selectively switched to the load circuit in the present embodiment but the driver circuit may be so designed as to has a high output impedance when deactivated, thereby making it possible to dispense with the switch.

When the driver is divided into the driver circuits as in the FIG. 24 embodiment, there is a possibility that the internal power supply voltages $V_{L1}$ to $V_{L3}$ differ from each other to provide a potential difference. If the potential difference between internal power supply voltages is large, mismatch between the load circuits or breakage of elements will occur when transmission/reception of signals is effected among the load circuits $Z_1$ to $Z_3$.

Figure 27:
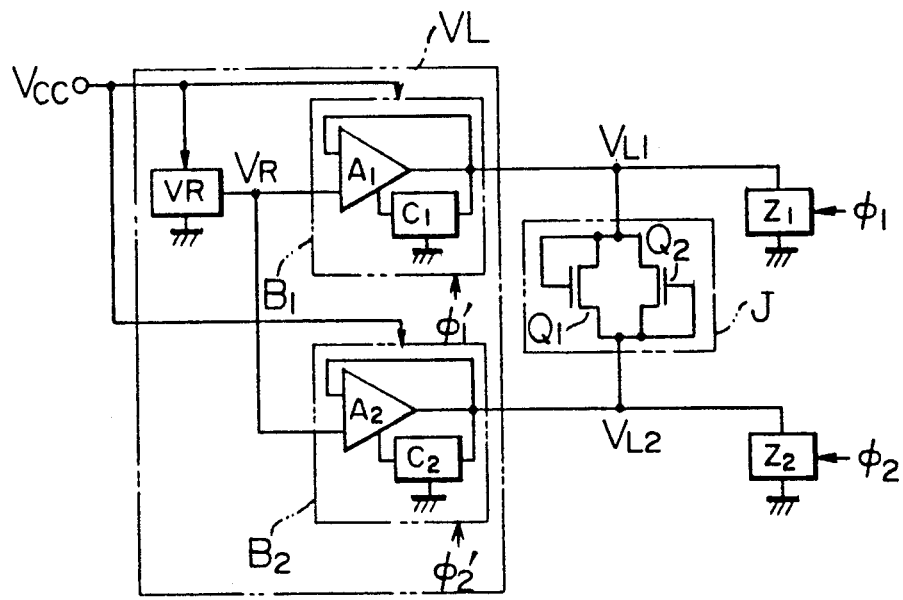
FIG. 27 is a circuit diagram of a third embodiment of the voltage limiter circuit according to the invention.

FIG. 27 shows a third embodiment of the voltage limiter circuit directed to prevention of the above problem. For simplicity of explanation, two driver circuits respectively associated with load circuits are illustrated in FIG. 27. In this embodiment, a circuit J including two N-channel MOS transistors $Q_1$ and $Q_2$ is connected between the two internal power supply voltages. Given that the MOS transistor has a threshold voltage $V_{TH}$, the $Q_1$ is turned on when $V_{L1}-V_{L2}>V_{TH}$ and the $Q_2$ is turned on when $V_{L2}-V_{L1}>V_{TH}$. Therefore, the potential difference between $V_{L1}$ and $V_{L2}$ is limited to below $V_{TH}$.

Figure 28A:
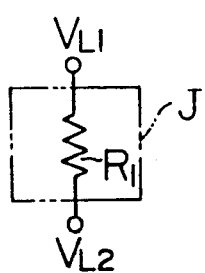
FIGS. 28A to 28E are circuit diagrams showing modifications of an interconnection circuit used in the FIG. 27 embodiment.
Figure 28B:
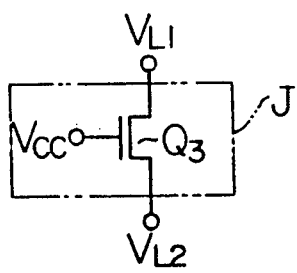
Figure 28C:
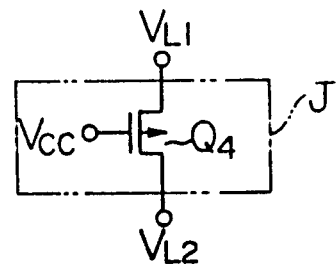
Figure 28D:
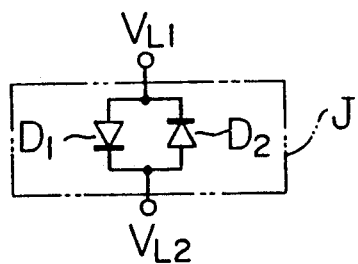
Figure 28E:
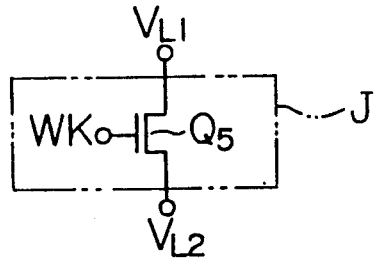

In place of the interconnection circuit J shown in FIG. 27, various interconnection circuits may be used to interconnect together the internal power supply voltages. FIGS. 28A to 28E show various modifications of the interconnection circuit J. Particularly, FIGS. 28A to 28C show examples of the simplest interconnection circuit comprising a resistor or $R_1$ or an element $Q_3$ or $Q_4$ equivalent to resistor. FIG. 28D shows an example of the interconnection circuit comprising diodes $D_1$ and $D_2$ connected in anti-parallel fashion. Since the diodes $D_1$ and $D_2$ in FIG. 28D functionally substitute for the MOS transistors $Q_1$ and $Q_2$ in FIG. 27, the potential difference between the internal power supply voltages can be so limited as not to exceed a predetermined value. Specifically, in the FIG. 28D example, the potential difference between $V_{L1}$ and $V_{L2}$ can be limited to below on-voltage of the diodes. FIG. 28E shows an example of the interconnection circuit comprising an N-channel MOS transistor $Q_5$. When high level of a signal WK is applied to the $Q_5$ immediately after turn-on of the power supply, the $V_{L1}$ connects to the $V_{L2}$ through the $Q_5$. This example is particularly effective to prevent occurrence of the potential difference between voltages $V_{L1}$ and $V_{L2}$ which rise at greatly different time constants. Obviously, the interconnection circuits shown in FIGS. 27 and FIGS. 28A to 28E may be used in combination.

The interconnection circuit may be applied effectively to a voltage limiter which does not undergo compensation.

In the embodiments of FIGS. 24 to 27, each load circuit is represented by a single impedance $Z_i$. However, in actual semiconductor apparatus, it is frequent that the load is distributed in the semiconductor chip. FIG. 29 shows a fourth embodiment of the voltage limiter circuit directed to distributed load elements. In this embodiment, an amplifier $A_i$ may undergo feedback from a midway portion or a remote end portion in the distributed load element network. More specifically, an amplifier $A_1$ undergoes feedback from a close end portion in a network of distributed load elements $Z_{11}$ to $Z_{19}$, an amplifier $A_2$ undergoes feedback from a central portion in a network of distributed load elements $Z_{21}$ to $Z_{29}$, and an amplifier $A_3$ undergoes feedback from a remote end portion in a network of distributed load elements $Z_{31}$ to $Z_{39}$. This feedback connection of the FIG. 29 embodiment is advantageous in that a decrease in the internal power supply voltage due to a wiring impedance can be compensated and the operation of a distributed load element remote from the driver circuit can be stabilized. Preferably, the connection to the input of the compensation circuit may start from the same portion as that for feedback (close end portion, central portion or remote end portion).

Next, embodiments of the feedback amplifier and the compensation circuit will now be described.

FIG. 30A shows a first embodiment of an arrangement of feedback circuit $A_i$ and phase compensation circuit $C_i$. Referring to FIG. 30A, a differential amplifier 21 includes MOS transistors $Q_{21}$ to $Q_{25}$ and an output stage 22 includes MOS transistors $Q_{26}$ and $Q_{29}$. The differential amplifier 21 has one input terminal to which a reference voltage $V_R$ is applied and the other input terminal to which a voltage $V_L$ from the output stage is fed back. The compensation circuit $C_i$ has a series connection of a resistor $R_D$ and a capacitor $C_D$. Without the application of feedback, the circuit arrangement of FIG. 30A can be represented by a small signal equivalent circuit as shown in FIG. 30B. For simplicity of explanation, the load is a single capacitor $C_L$. In the equivalent circuit, $gm_1$ is transmission conductance of the differential amplifier, $gm_2$ is transmission conductance of the output stage, $r_1$ is output resistance of the differential amplifier, $r_2$ is output resistance of the output stage and CG is input capacitance of the output stage (gate capacitance of $Q_{26}$).

Figure 31A:
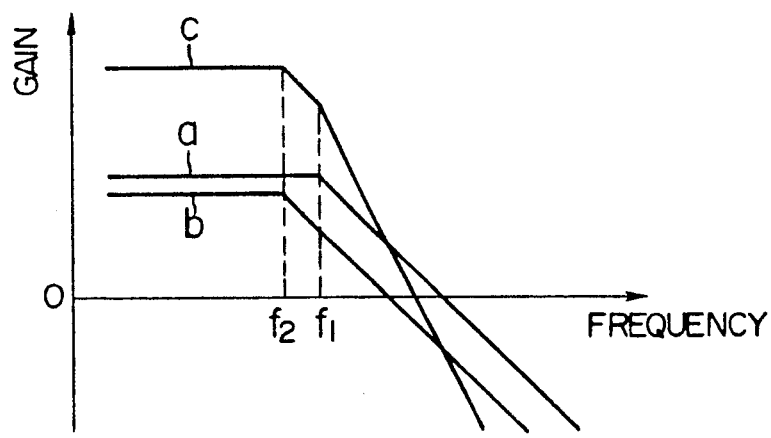
FIGS. 31A and 31B are graphs showing frequency characteristics of the FIG. 30A embodiment.

Frequency characteristics of this circuit arrangement will be described with reference to FIGS. 31A and 31B. Firstly, without the application of feedback, gain is related to frequency as graphically illustrated in FIG. 31A. In FIG. 31A, a is gain $v_i'/v_i$ of the differential amplifier 21, b is gain $v_o/v_i'$ of the output 22, and c is total gain $v_o/v_i$ of this circuit arrangement. As is seen in FIG. 31A, the gains a and b begin to decrease at the rate of 6 dB/oct at frequencies $f_1$ and $f_2$, respectively, where $$f_1 = \frac{1}{2\pi C_G r_1} \text{ and } f_2 = \frac{1}{2\pi C_L r_2} \text{ stand.}$$

Since in this example $f_1 > f_2$ is assumed, the total gain $C = v_o/v_i$ decreases at the rate of 6 dB/oct when the frequency exceeds $f_2$ but it decreases at the rate of 12 dB/oct when the frequency exceeds $f_1$. Thus, the frequencies $f_2$ and $f_1$ are so-called pole frequencies and as described previously, for stable operation of the feedback amplifier, the total gain must be 0 dB or less at the frequency point $f_1$ where the total gain begins to decrease at the rate of 12 dB/oct. Frequently, this requirement can not be satisfied when the pole frequencies $f_1$ and $f_2$ are relatively close of each other as in the case shown in FIG. 31A. Accordingly, the operation of the feedback amplifier can be stabilized by separating the pole frequencies $f_1$ and $f_2$ sufficiently.

Figure 31B:
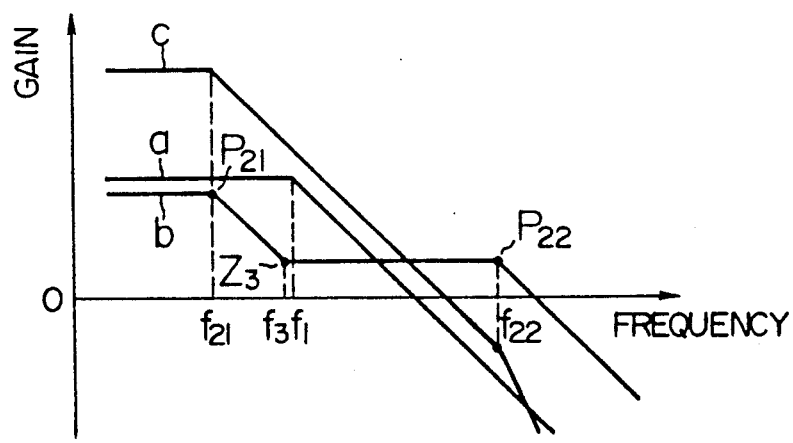

Under the application of feedback by the compensation circuit $C_i$, the circuit arrangement exhibits frequency characteristics as graphically shown in FIG. 31B. As is seen in FIG. 31B, the gain of the differential amplifier 21 remains unchanged but the gain of the output stage changes to have three bent points $P_{21}$, $Z_3$ and $P_{22}$. Frequencies $f_{21}$, $f_{22}$ and $f_2$ at the bent points $P_{21}$ and $P_{22}$ called pole and the bent point $Z_2$ called zero point are given as follows:

$$f_{21} = \frac{1}{2\pi(C_{Dr2} + C_{Lr2} - C_D R_D)}$$

$$f_{22} = \frac{C_{Dr2} + C_{Lr2} + C_D R_D}{2\pi C_L C_{Dr2} R_D}$$

$$f_3 = \frac{1}{2\pi C_D R_D}$$

As is clear from FIG. 31B, by setting the frequency $f_2$ near the pole frequency $f_1$ of the differential amplifier, in other words, by setting $C_D R_D \approx C_G r_1$, the total gain can be freed from bending at the pole frequency $f_1$. As a result, the total gain decreases at the rate of 6 dB/oct when the frequency exceeds $f_{21}$ but it does not decrease at the rate of 12 dB/oct until the frequency exceeds $f_{22}$. Thus, by making n sufficiently large in $C_D = n \, C_G r_1/r_2$ and $R_D = r_2/n$, the frequencies $f_{21}$ and $f_{22}$ can be separated sufficiently from each other to thereby stabilize the operation of the feedback amplifier.

Figure 33:
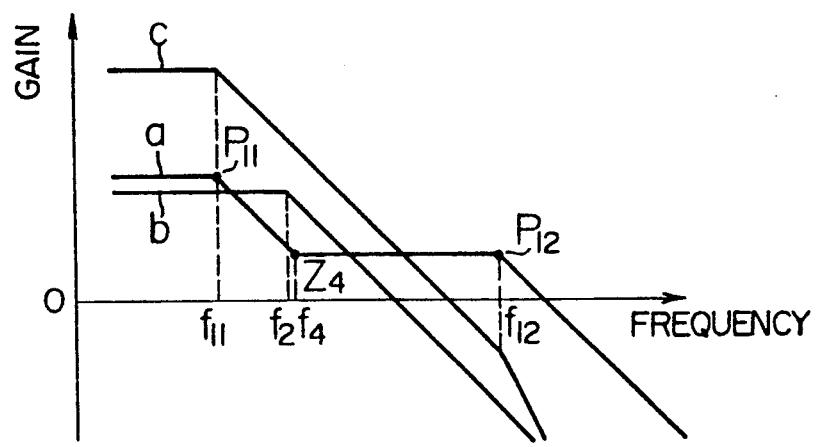
FIG. 33 is a graph showing frequency characteristics of the FIG. 32A embodiment.
Figure 32A:
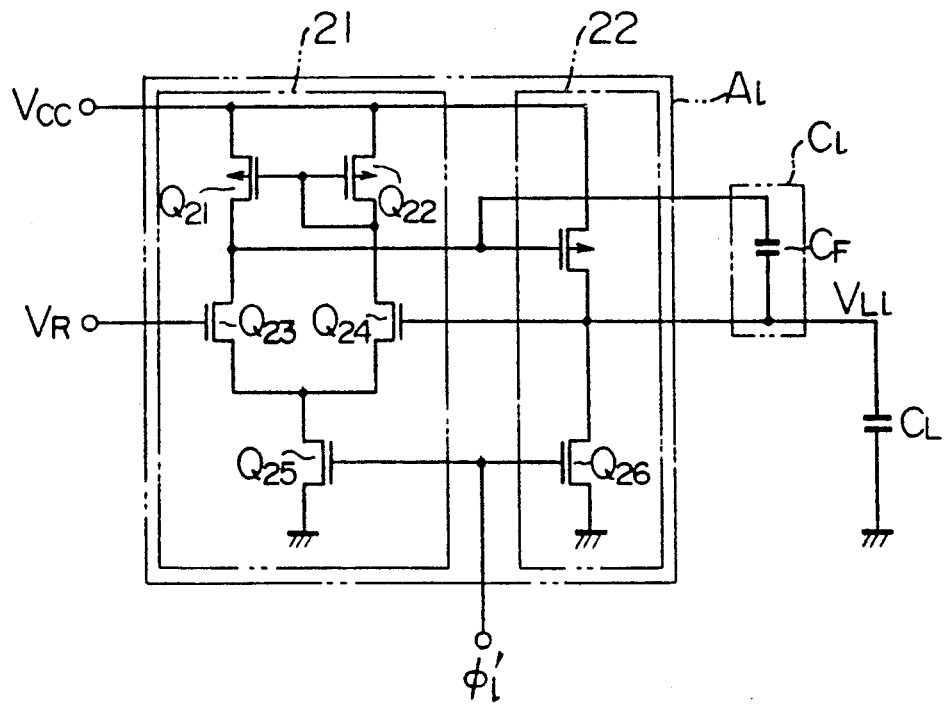
FIG. 32A is a circuit diagram of a second embodiment of the arrangement of feedback circuit and compensation circuit according to the invention.
Figure 32B:
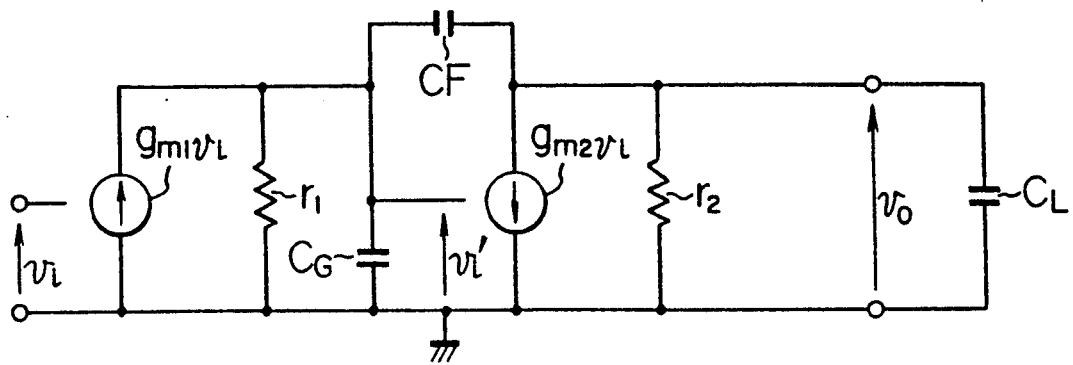
FIG. 32B is an equivalent circuit of the FIG. 32A embodiment.

FIG. 32A shows a second embodiment of the arrangement of feedback amplifier and compensation circuit. In this embodiment, a capacitor $C_F$ is inserted between the input and output of the output stage 22 for the purpose of compensation. Without the application of feedback, the circuit arrangement of FIG. 32A can be represented by a small signal equivalent circuit as shown in FIG. 32B. Under the application of feedback by the compensation circuit Ci, the circuit arrangement exhibits frequency characteristics as graphically shown in FIG. 33. As is seen in FIG. 33, in this embodiment, the gain of the differential amplifier changes to have three bent points $P_{11}$, $Z_4$ and $P_{12}$. As in the case of the previous FIG. 30A embodiment, $f_4 \approx f_2$ is set and pole frequencies $f_{11}$ and $f_{12}$ are separated from each other sufficiently, thereby stabilizing the operation of the feedback amplifier. This embodiment features that thanks to the capacitor CF for compensation inserted between the input and output of the amplifier stage, a so-called Miller effect takes place to increase the apparent capacitance. Therefore, even when the capacitor actually used has a relatively small capacitance, the compensation can be fulfilled. This leads to a reduction in area occupied by the capacitor.

Figure 34A:
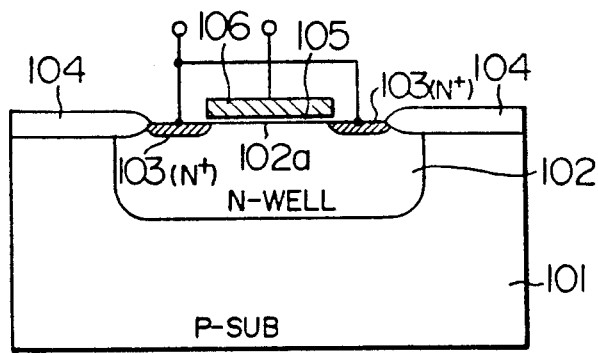
FIG. 34A is a diagram showing an embodiment of structure of a capacitor used in the compensation circuit.
Figure 34B:
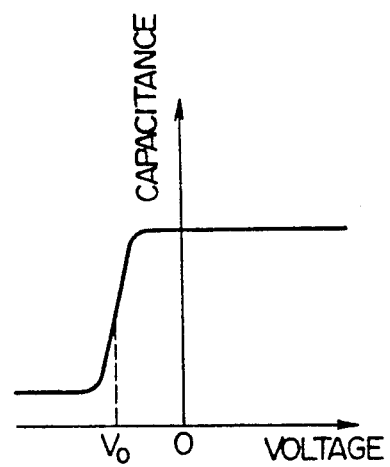
FIG. 34B is a graph showing characteristics of the FIG. 34A capacitor.
Figure 34C:
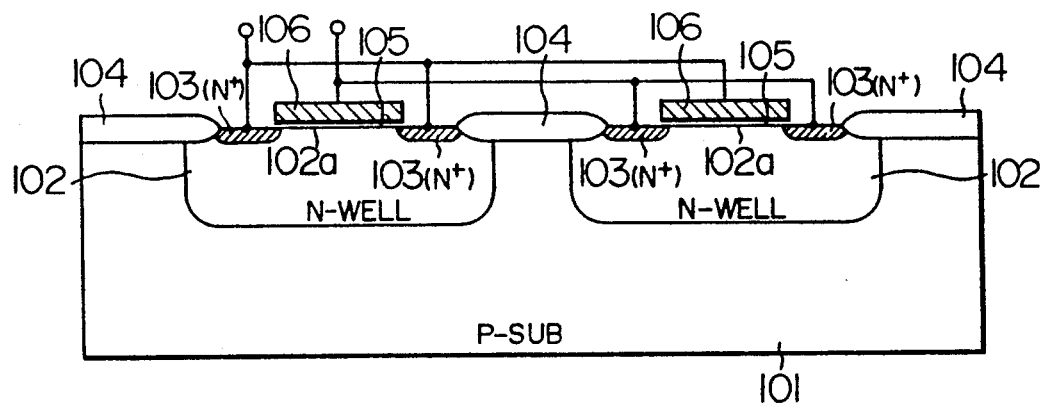
FIG. 34C is a diagram showing an example of interconnection of the capacitors shown in FIG. 34A.

The capacitor used in the compensation circuit shown in FIG. 30A or 32A is required to have a large capacitance (usually several of hundreds to several of thousands of pF) and small dependency on voltage. FIG. 34A shows an embodiment of a structure of the capacitor which is prepared through ordinary CMOS process. Referring to FIG. 34A, reference numeral 101 designates a P-type semiconductor substrate, 102 an N-type well, 103 an N+ diffusion layer, 104 a $SiO_2$ isolation region, 105 a gate insulating film and 106 a gate. Like ordinary MOS capacitors, the compensation capacitor is formed between the gate 106 and substrate surface 102a which sandwich the gate insulating film 105. This capacitor uses the thin gate insulating film as capacitor insulating film and hence it has a large capacitance to advantage even when its area is relatively small. However, this capacitor is different from the ordinary MOS capacitor in that it has a threshold voltage which is negative on account of the N-type well underlying the gate. To explain the negative threshold voltage, reference should be made to a graph of FIG. 34B where abscissa represents voltage applied to the capacitor (positive on the side of the gate) and ordinate represents capacitance. In this graph, the threshold voltage (flat band voltage) is defined as applied voltage $V_o$ at which the capacitance changes greatly and $V_o<0$ stands, indicating that the threshold voltage is negative. Accordingly, this capacitor has a feature that as far as voltage is applied in one direction is being applied to make the gate side positive, its capacitance remains almost unchanged. In case where the application of voltage is bidirectional, two capacitors, each having the structure shown in FIG. 34A, may be used which are connected in anti-parallel relationship as shown in FIG. 34C.

The procedure necessary for preparing the capacitor of this embodiment of FIG. 34A comprises a well formation step, an isolation region formation step, a gate insulating film formation step, a gate formation step, a diffusion layer formation step and a wiring step. All of the steps are included in the ordinary CMOS process and therefore, in the case of semiconductor apparatus manufactured through CMOS process, no additional step is required for preparation of the capacitor of the present embodiment.

It should be appreciated that in semiconductor apparatus to which the invention is applied, capacitance due to laminated layers can be utilized. For example, a DRAM is available having the laminated-layer capacitor as memory capacitor. In such a DRAM, the laminated-layer capacitor may also be used as compensation capacitor. The DRAM using the laminated-layer capacitor is described in, for example, IEEE Journal of Solid-State Circuits, Vol. SC-22, No. 3, pp. 661–666, Aug. 1980.

The reference voltage generator suitable for use in the voltage limiter circuit may obviously be used also with a voltage limiter circuit not applied with compensation. Obviously, the reference voltage generator may be practiced in the form of any one of the embodiments set forth in the description of group 1.

Output voltage $V_L$ of the voltage limiter is generated on the basis of reference voltage $V_R$. Accordingly, characteristics of the $V_L$ are subject to those of the $V_R$ and set as described. When the voltage limiter circuit is used in the semiconductor apparatus, dependency of the $V_L$ an external power supply voltage $V_{CC}$ is particularly important and therefore dependency of the $V_R$ on the $V_{CC}$ must particularly be taken into consideration in designing the voltage limiter circuit. Various manners of generating reference voltages having characteristics complying with various objects are disclosed in, for example, U.S. Pat. No. 4,100,437. Obviously, the circuits shown in this literature may be applied to the present invention.

In the embodiments described in connection with FIGS. 24 to 29, the reference voltage $V_R$ is directly applied to the driver circuit. The level of the voltage produced from the reference voltage generator is not always suited as internal power supply voltage used in the semiconductor apparatus. In such an event, voltage conversion is needed. Occasionally, in order to compensate irregularity in reference voltage due to manufacture process, fine adjustment of voltage or so-called trimming is required. Voltage conversion and trimming may be effected in the manner described in the aforementioned U.S. Pat. No. 4,100,437 but a manner described below is particularly suited for the semiconductor apparatus manufactured through MOS process.

Figure 35:
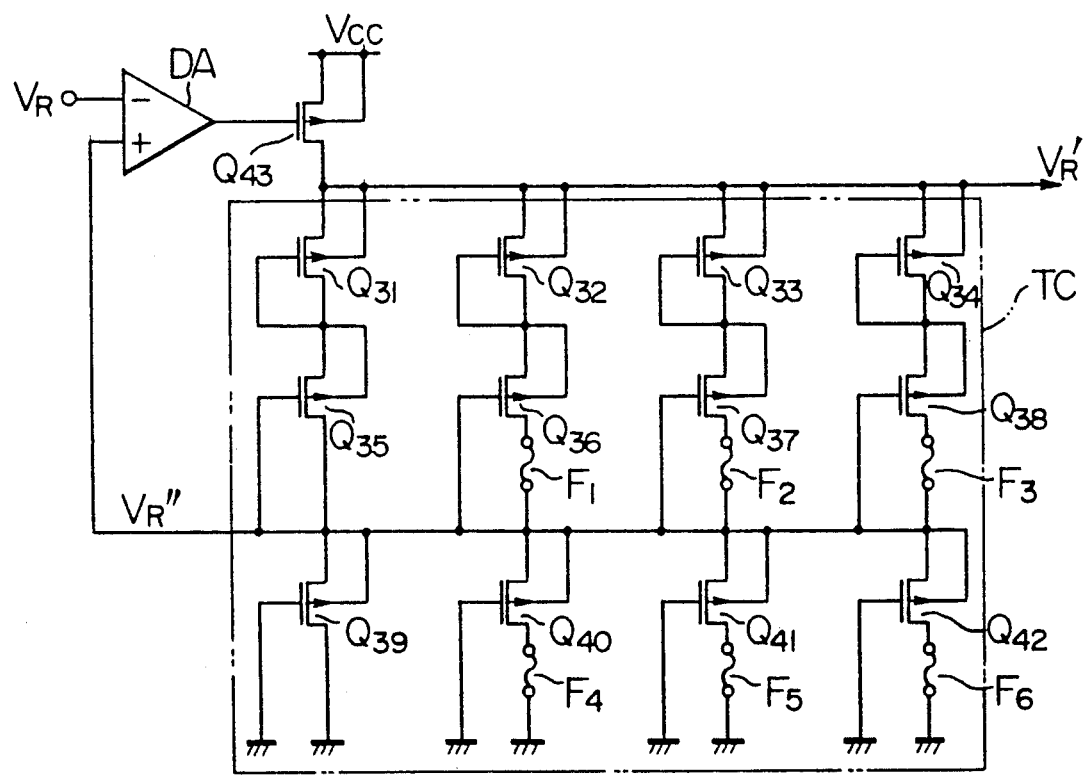
FIG. 35 is a circuit diagram of a first embodiment of a trimming circuit according to the invention.

FIG. 35 shows a first embodiment of a trimming circuit. Referring to FIG. 35, DA designates a differential amplifier, $Q_{31}$ to $Q_{43}$ P-channel MOS transistors and $F_1$ to $F_6$ fuses. The output voltage $V_R$ of the reference voltage generator is applied to this trimming circuit which in turn delivers an output voltage $V_R'$ applied to the driver circuit. The differential amplifier DA has one input terminal to which the $V_R$ is applied and the other input terminal to which a voltage $V_R''$, determined by dividing the $V_R'$ by the MOS transistors $Q_{31}$ to $Q_{42}$, is fed back. Assuming that the amplifier DA has a sufficiently large mu-factor, the output voltage $V_R'$ is given by $$V_R' = \frac{R_1 + R_2}{R_2} \cdot V_R$$

where $R_1$ is resistance of a resistor equivalent to a circuit comprised of $Q_{31}$ to $Q_{38}$ and $R_2$ is resistance of a resistor equivalent to a circuit comprised of $Q_{39}$ to $Q_{42}$. For adjustment of $V_R'$, the fuses are fused to change $R_1$ and $R_2$.

Figure 36:
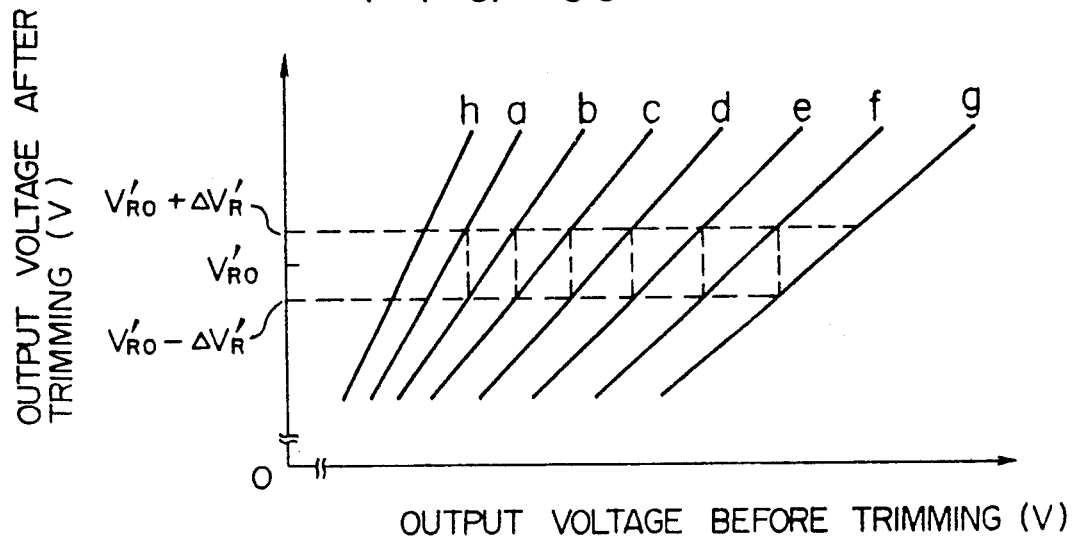
FIG. 36 is a graph useful to explain the manner of trimming.

Trimming can be carried out specifically in a manner described below with reference to FIG. 36. The relation between input voltage $V_R$ and output voltage $V_R'$ is graphically illustrated in FIG. 36. When no fuse is fused, a characteristic represented by d in FIG. 36 is obtained. As the $R_1$ is increased by fusing the fuses $F_1$, $F_2$ and $F_3$ sequentially, the $V_R'$ is increased as indicated by curves c, b and a. Conversely, as the $R_2$ is increased by fusing the fuses $F_4$, $F_5$ and $F_6$ sequentially, the $V_R'$ is decreased as indicated by curves e, f and g. Accordingly, the $V_R$ is first observed and thereafter by referring to FIG. 36, a fuse fusing method is selected which can provide a value of $V_R'$ closest to a target value $V_{Ro}'$. The goal is to confine the $V_R'$ within a range of $V_{Ro}' \pm \Delta V_R'$ even when the $V_R$ varies over a wide range. To reach this goal, circuit constants (channel width and channel length of each MOS transistor) are selected so that when $V_R' = V_{Ro}' + \Delta V_R'$ is held pursuant to a trimming curve (for example, curve a), $V_R' = V_{Ro}' - \Delta V_R'$ may be held pursuant to an adjacent trimming curve (for example, curve b).

Figure 37:
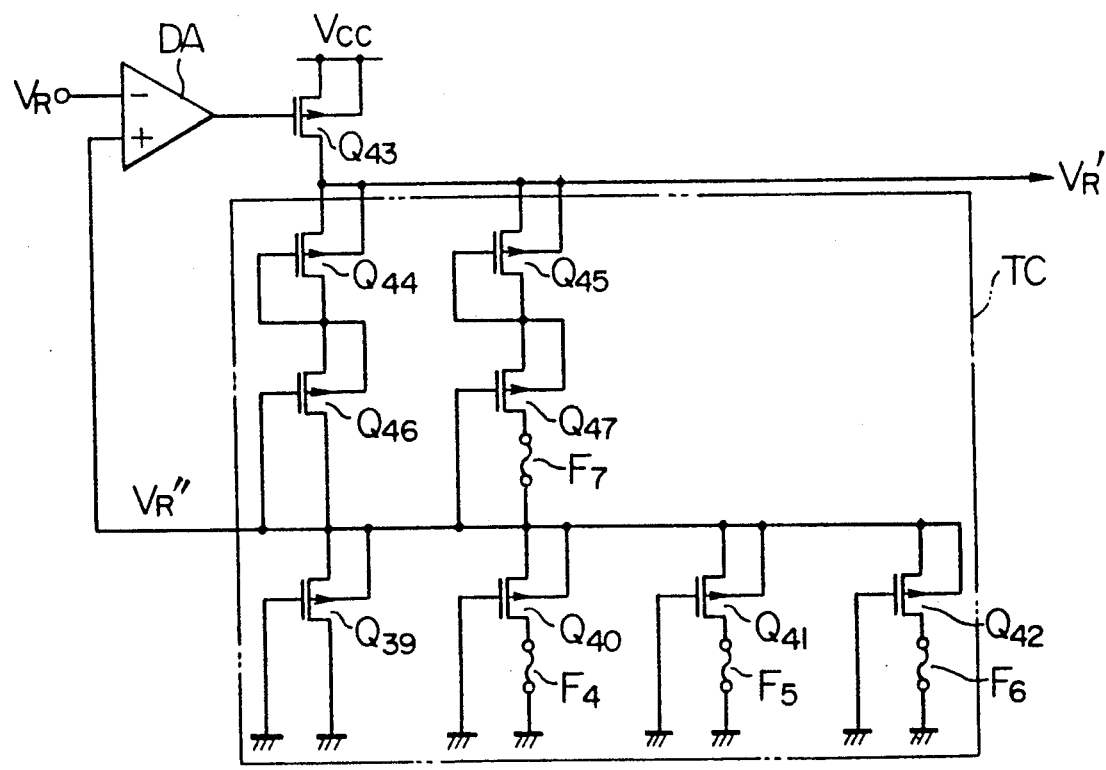
FIG. 37 is a circuit diagram of a second embodiment of the trimming circuit according to the invention.

FIG. 37 shows a second embodiment of the trimming circuit. As in the FIG. 35 embodiment, the output voltage $V_R'$ can be decreased by fusing fuses $F_4$, $F_5$ and $F_6$ sequentially. In this embodiment, the output voltage $V_R'$ is however increased in a manner different from that for the FIG. 35 embodiment. More specifically, the output voltage $V_R'$ can be increased by first fusing a fuse $F_7$ (circuit constants are selected precedently so that curve h in FIG. 36 can be set up with the fuse $F_7$ fused) and thereafter fusing the fuses $F_4$, $F_5$ and $F_6$ sequentially. As compared to the circuit of FIG. 35, the number of the fuses is smaller and advantageously area occupied by the fuses can be reduced in the FIG. 37 circuit.

In comparison with the circuit described in the aforementioned U.S. patent, the circuits of FIGS. 35 and 37 can advantageous by formed with a smaller occupation area through ordinary MOS process. To explain, in contrast to the circuit described in the U.S. patent wherein resistors are used as elements for dividing the output voltage $V_R'$, the circuits of FIGS. 35 and 37 use the MOS transistors for the same purpose. In order to reduce current consumption in the circuit, the element for voltage division must have a sufficiently large equivalent resistance (about several of hundreds of kΩ). The elements having a large equivalent resistance can be prepared through ordinary MOS process in a smaller area by MOS transistors than by resistors. With the MOS transistors used as the voltage division elements, however, characteristics of the $V_R'$ are expected to change as the threshold voltages of these MOS transistors change. This disadvantage can be obviated by making the channel width and channel length of each transistor large enough to suppress irregularity, connecting the back gate to the source to avoid the influence of the change of substrate voltage and selecting a method of fusing the fuses in expectation of irregularity in the threshold voltages.

Figure 38A:
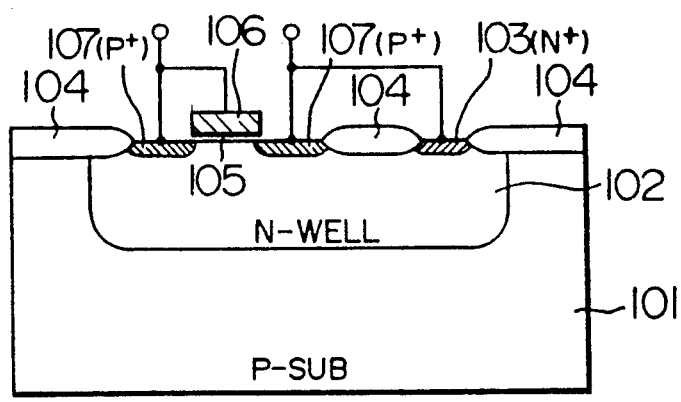
FIG. 38A is a diagram showing a first embodiment of structure of a MOS transistor used in the FIG. 35 embodiment.
Figure 38B:
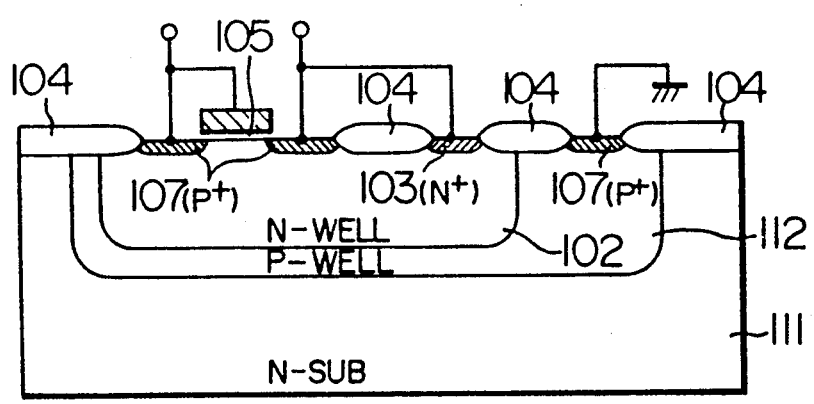
FIG. 38B is a diagram showing a second embodiment of structure of the MOS transistor.

Referring to FIGS. 38A and 38B, embodiments of a structure of the MOS transistor used in the trimming circuit will now be described. As described previously, the back gate of each transistor is preferably connected to the source of its own transistor to suppress the influence of the change of substrate potential. FIG. 38A shows a first embodiment of the MOS transistor structure. In this embodiment, for a P-type substrate as an example, a P-channel MOS transistor is formed. For an N-type substrate, an N-channel MOS transistor may be formed by inverting the conductivity type of all of the regions shown in FIG. 38A. FIG. 38B shows a second embodiment of the MOS transistor structure wherein the well has a two-layer structure, whereby by fixing potential of the outer well 112 to ground as exemplified herein, the MOS transistor can be more immune to the change of substrate potential.

To explain the fuses used in the trimming circuit, these fuses may be of, for example, polycrystalline silicon like fuses used for remedy for defects in semiconductor memory. Therefore, in an application to a semiconductor memory having a defect remedy circuit, no additional step is needed for preparation of fuses. The fuse may be fused by a laser beam or in an electrical manner. The use of a laser beam is advantageous in that no transistor is required for disconnection and the occupation area can be reduced correspondingly. The electrical fusing on the other hand can advantageously dispense with an expensive laser beam projector.

Figure 39A:
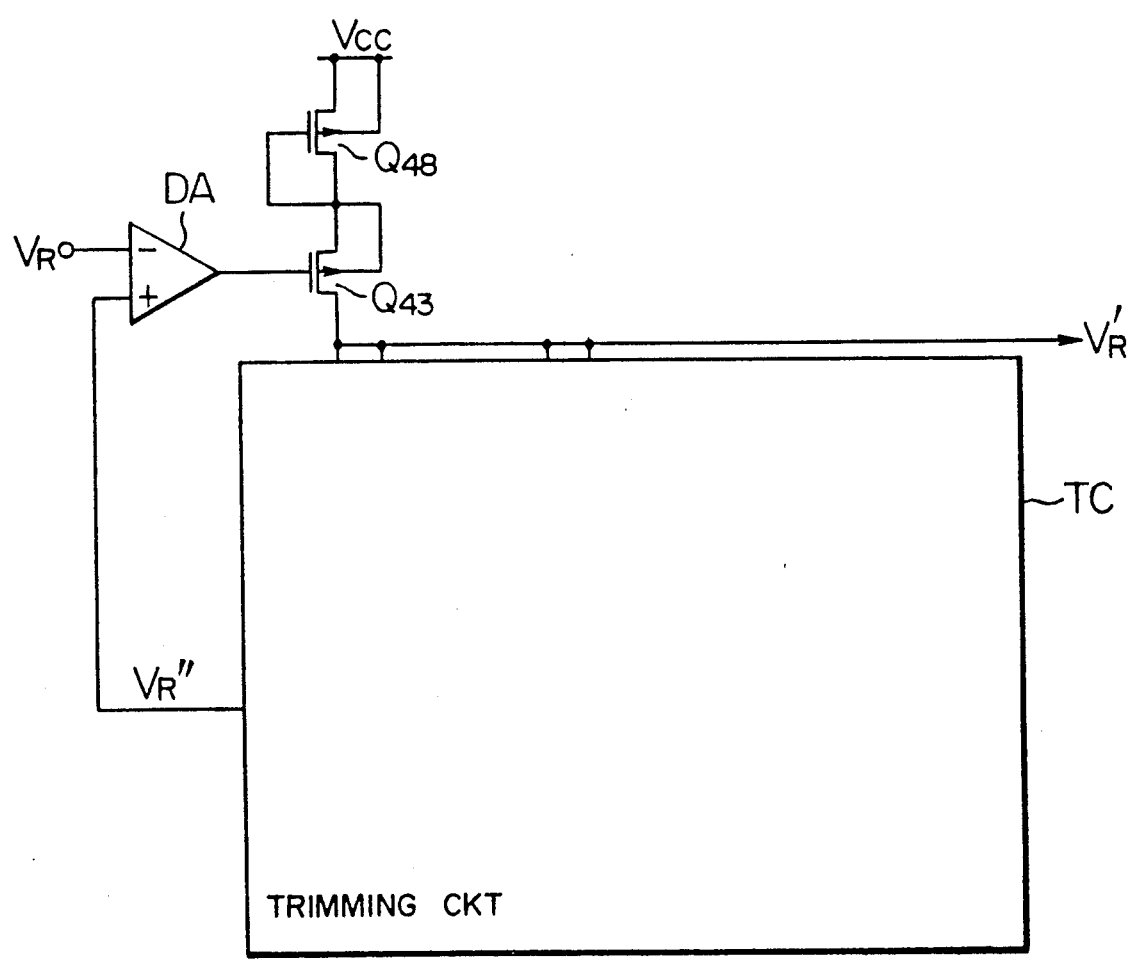
FIG. 39A is a circuit diagram of a third embodiment of the trimming circuit according to the invention.
Figure 39B:
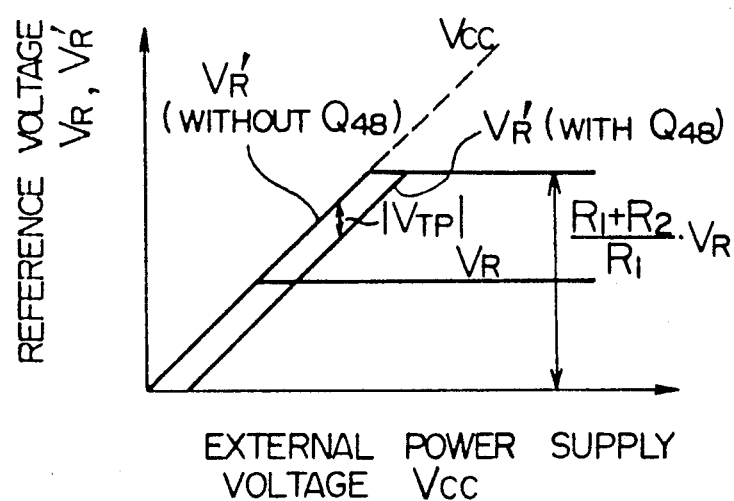
FIGS. 39B and 39C are graphs for explaining characteristics of the FIG. 39A embodiment.

FIG. 39A shows a third embodiment of the trimming circuit for conversion of $V_R$ to $V_R'$. Different from the circuits of FIGS. 35 and 37, this circuit of FIG. 39A additionally comprises a P-channel MOS transistor $Q_{48}$. With this construction, the maximum level of output voltage $V_R'$ can be limited to $V_{CC} - |V_{TP}|$ where $V_{TP}$ is threshold voltage of the P-channel MOS transistor. This will be seen from FIG. 39B graphically showing dependency of $V_R$ and $V_R'$ upon $V_{CC}$. In the circuit of FIG. 35 or 37, $V_R' \approx V_{CC}$ stands when $V_{CC}$ is low. Contrary to this, in the circuit of FIG. 39A, the added transistor $Q_{48}$ permits the output voltage $V_R'$ to decrease by $|V_{TP}|$, reaching $V_R' = V_{CC} - |V_{TP}|$ when $V_{CC}$ is low.

Figure 39C:
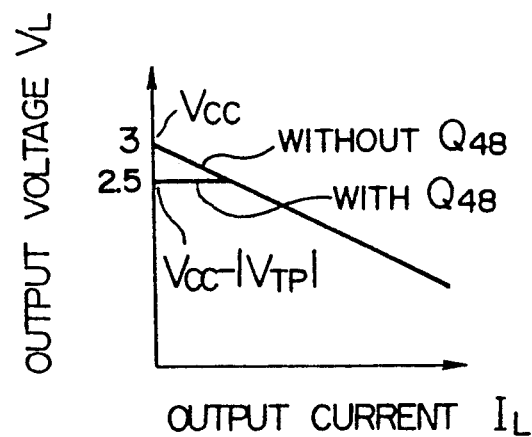

An advantage of this embodiment is that even when the $V_{CC}$ is remarkably decreased from a normal operation level of, for example, 5 V to a lower level of, for example, 3 V, good voltage stability of internal power supply voltage $V_L$ can be insured. This will be explained with reference to FIG. 39C. FIG. 39C shows an example of the relation between output voltage $V_L$ and output current $I_L$ in the circuit arrangement shown in FIG. 30A or 32A. When the circuit of FIG. 35 or 37 is used for generating the $V_R'$, $V_L \approx V_R' \approx V_{CC}$ is held for the $V_{CC}$ being low and hence the drain/source voltage of the output MOS transistor ($Q_{26}$ in FIG. 30A or 32A) of the circuit arrangement is almost zero, thus degrading current drivability. Consequently, as the output current (current consumption in the load) $I_L$ increases, the output voltage $V_L$ decreases. In contrast, when the circuit of FIG. 39A is used for generating the $V_R'$, $V_L \approx V_R' \approx V_{CC} - |V_{TP}|$ stands and hence the drain/source voltage of the output MOS transistor of the circuit arrangement approximately equals $|V_{TP}|$ which is 0.5 V in this example. Consequently, current drivability is relatively large and the amount of decrease of $V_L$ is small. In other words, by setting the $V_L$ to a slightly lower level in advance, the amount of change of the output voltage $V_L$ can be minimized. This permits the circuit in semiconductor apparatus operative with the inner power supply voltage $V_L$ to operate stably when the external power supply voltage $V_{CC}$ is low and increases the operation margin for the $V_{CC}$.

Preferably, the $Q_{48}$ of the FIG. 39A circuit has the same structure as that shown in FIG. 38A or FIG. 38B so as to suppress, like the MOS transistor in the trimming circuit of FIG. 35 or 37, the influence of the change of substrate potential.

Circuit layout and wiring for reference voltage $V_R$ and internal power supply voltage $V_C$ which are used when applying the present invention to actual semiconductor chips will now be described. The invention as applied to a DRAM standing for a semiconductor apparatus will be described for illustration purpose only but the invention may of course be applicable to other types of semiconductor apparatus. The layout and wiring to be described below are also effective for a voltage limiter circuit without compensation.

Figure 40:
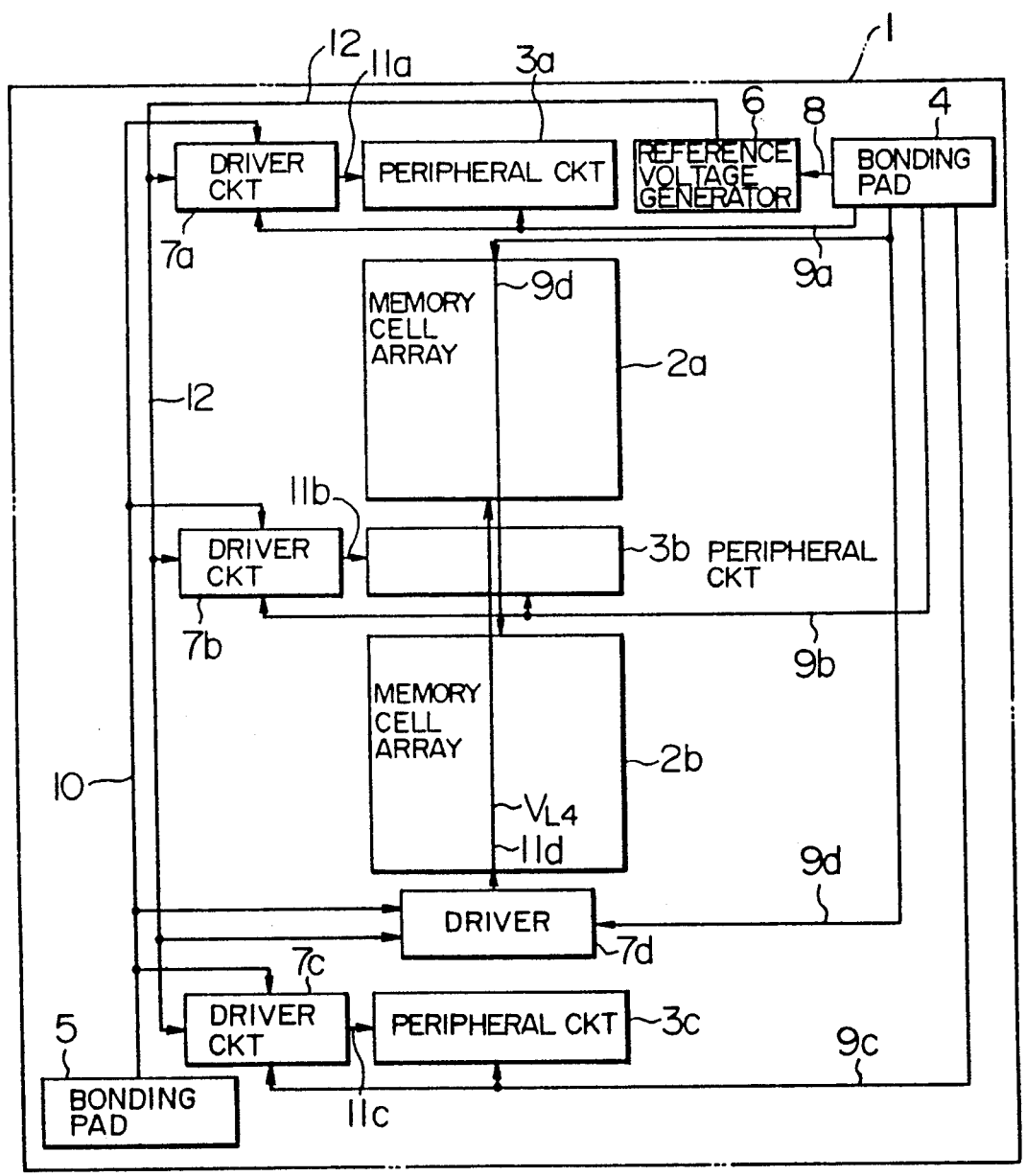
FIG. 40 is a schematic diagram of a first embodiment of a circuit layout and wiring according to the invention.

FIG. 40 shows a first embodiment of a circuit layout and wiring when a voltage limiter circuit is applied to a DRAM. Referring to FIG. 40, reference numeral 1 designates a semiconductor chip, 2a and 2b memory arrays each comprising fine MOS transistors, 3a, 3b and 3c peripheral circuits, 4 a bonding pad for ground, 5 a bonding pad for external power supply voltage $V_{CC}$, 6 a reference voltage generator, and 7a, 7b, 7c and 7d driver circuits. The reference voltage generator 6 and driver circuits 7a to 7d constitute the voltage limiter circuit. The driver circuits 7a, 7b and 7c generate internal power supply voltages $V_{L1}$, $V_{L2}$ and $V_{L3}$ for driving the peripheral circuits 3a, 3b and 3c, respectively, and the driver circuit 7d generates an internal power supply voltage $V_{L4}$ for driving the memory arrays 2a and 2b.

This embodiment features that the reference voltage generator 6 is separated from the driver circuits 7a to 7d, the reference voltage generator is disposed near the bonding pad for earth potential input, and the drivers are disposed near their load circuits, respectively. Therefore, the length of a ground wiring conductor 8 extending from the earth potential input bonding pad to the reference voltage generator and the lengths of internal power supply voltage wiring conductors 11a to 11d are all shortened and impedances of these conductors can be minimized. Thus, noise on the conductor 8 can be reduced so that ground level of the reference voltage generator can be stabilized and a stable reference voltage $V_R$ can be obtained. Further, since voltage drops in internal power supply voltages $V_{L1}$ to $V_{L4}$ due to impedances of the conductors 11a to 11d can be reduced, levels of the $V_{L1}$ to $V_{L4}$ can be stabilized to make the operation of the driver circuits stable.

Another feature of this embodiment resides in ground wiring. More specifically, the short ground wiring conductor 8 is dedicated to the reference voltage generator. Ground wiring conductors 9a to 9d are provided for the other circuits. In particular, each of the wiring conductors 9a to 9d extends from the ground bonding pad 4 so as to be connected in common to a corresponding driver circuit and a load circuit associated therewith but so as not to be distributed to the remaining driver circuits and load circuits associated therewith. Advantageously, this wiring can prevent a noise, due to a current flow on the ground wiring conductor caused when a particular circuit is operated, from adversely affecting other circuits. Especially, since a noise generated on the ground wiring conductor connected to the reference voltage generator causes levels of all internal power supply voltages $V_{L1}$ to $V_{L4}$ to change, it is desirable that at least the ground wiring conductor for the reference voltage generator should be separated from the other ground wiring conductors. It is also desirable that the ground wiring conductor for the memory arrays be separated from the other ground wiring conductors because when the sense amplifier in the DRAM is operated for amplification, a number of data lines (each having several of thousands of pF normally) are charged/discharged simultaneously to cause a large noise on the ground wiring conductor connected to the memory arrays.

Figure 41:
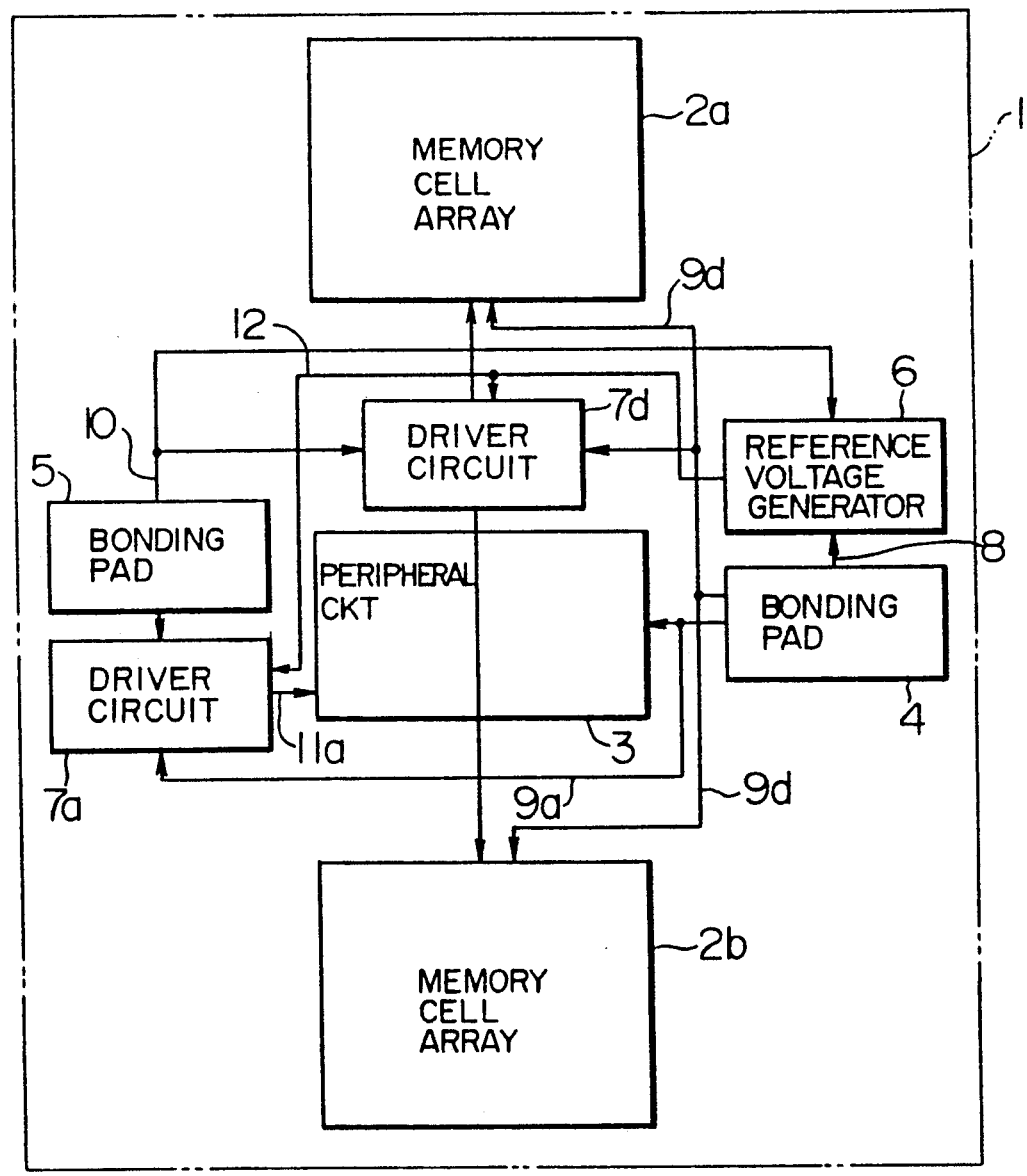
FIG. 41 is a schematic diagram of a second embodiment of the circuit layout and wiring according to the invention.

FIG. 41 shows a second embodiment of the circuit layout and wiring. In this embodiment, a peripheral circuit 3 is concentrated at the center of the chip, and a bonding pad 4 for ground and a bonding pad 5 for external power supply voltage $V_{CC}$ are also disposed centrally of the chip. As in the first embodiment, a reference voltage generator 6 is disposed near the ground potential input bonding pad, and driver circuits 7a and 7d are disposed near their load circuits, respectively.

As is clear from FIG. 41, this embodiment has an advantage of short length of wiring conductors. This feature makes this embodiment immune to the change of external power supply voltage $V_{CC}$ and the change of current flowing through load circuits. More particularly, in the first embodiment of FIG. 40, a wiring conductor 10 between the bonding pad for $V_{CC}$ and each driver circuit is long, having a large impedance and the level of the $V_{CC}$ decreases depending on current consumption in the load circuit. This decrease in level can of course be absorbed by each driver circuit but when the amount of decreased level is too large to absorb, a decrease in level of the internal power supply voltage $V_L$ is invited. Contrary to this, in the present embodiment, a wiring conductor 10 for external power supply voltage $V_{CC}$ has a small impedance and load current can be increased correspondingly. Further, this embodiment is immune to a decrease in $V_{CC}$.

In the embodiments of FIGS. 40 and 41, the noise on the ground wiring conductor is particularly considered because the reference voltage $V_R$ and internal power supply voltage $V_{Li}$ are generated relative to ground potential. Conversely, where the $V_R$ and $V_{Li}$ are generated relative to the external power supply voltage $V_{CC}$, noise on the wiring conductor for $V_{CC}$ should be thought much of. In this case, the reference voltage generator may preferably be disposed near the bonding pad for $V_{CC}$ and wiring conductors for $V_{CC}$ may preferably be distributed to individual circuits.

In the first and second embodiments of the circuit layout and wiring shown in FIGS. 40 and 41, the reference voltage $V_R$ is supplied from the reference voltage generator to the individual driver circuits by means of a wiring conductor 12 and preferably, this wiring conductor 12 is shielded to ensure that this conductor 12 can be protected from interference of noise generated from other circuits in the semiconductor chip to prevent the $V_R$ from being changed. Shielding can be realized through ordinary semiconductor manufacture process as will be described below.

Figure 42A:
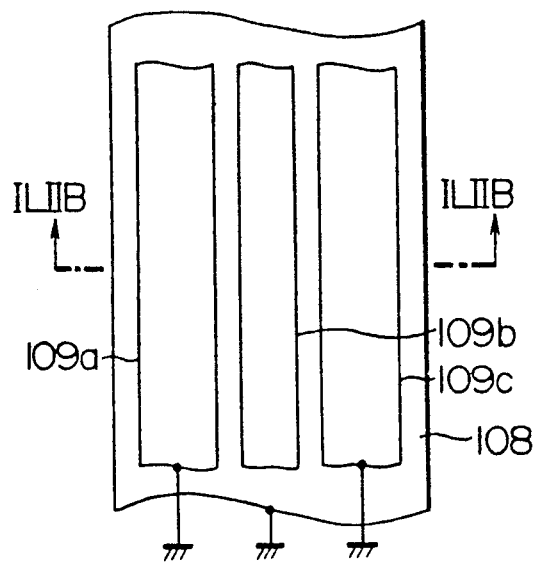
FIG. 42A is a diagram showing a first embodiment of shielding applicable to the embodiments of FIGS. 40 and 41.
Figure 42B:
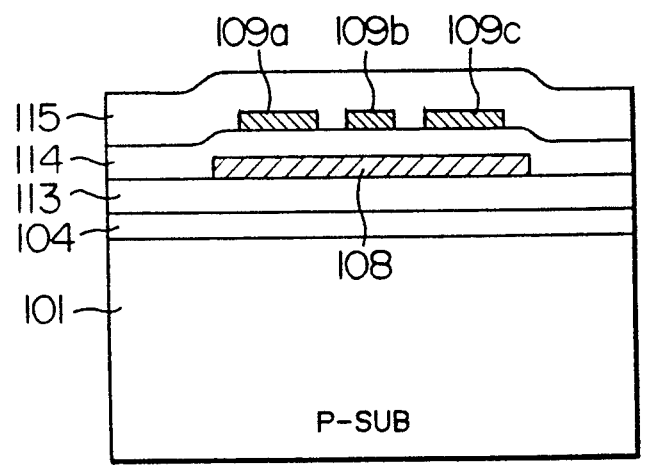
FIG. 42B is a sectional view taken on the line a—a' of FIG. 42A.

A first embodiment of shielding is shown in FIGS. 42A and 42B. Particularly, FIG. 42A is a plan view of this embodiment and FIG. 42B is a sectional view taken on the line a—a' of FIG. 42A. Referring to these figures, 101 designates a semiconductor substrate, 104 a $SiO_2$ layer, 108 a first wiring layer, 109a, 109b and 109c second wiring layers, 113 and 114 inter-layer insulating films and 115 a passivation film. The wiring layer 109b serves as wiring conductor for reference voltage $V_R$ and is surrounded by the wiring layers 108, 109a and 109c serving as wiring conductors for shielding which are fixed to invariable potential (ground herein). The wiring layer 108 underlying the wiring layer 109b is effective to prevent noise from interfering with the wiring layer 109b through capacitive coupling between wiring layer 109b and substrate 101. The left wiring layer 109a and the right wiring layer 109c are effective to prevent noise from interfering with the wiring layer 109b through capacitive coupling between wiring layer 109b and wiring conductors adjacent thereto (not shown).

Figure 42C:
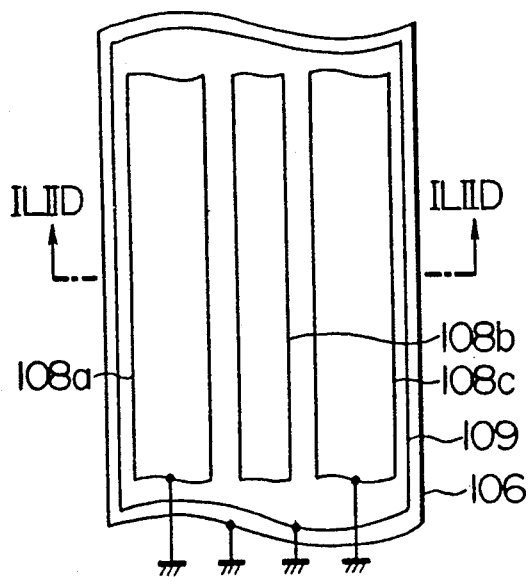
FIG. 42C is a diagram showing a second embodiment of the shielding.
Figure 42D:
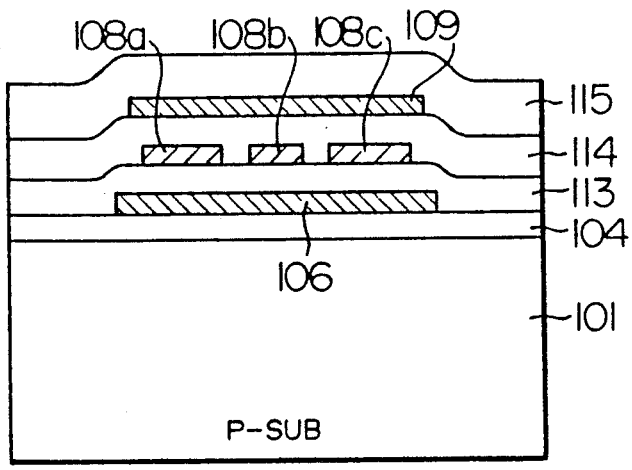
FIG. 42D is a sectional view taken on the line c—c' of FIG. 42C.

A second embodiment of shielding will be described with reference to FIGS. 42C and 42D. In this embodiment, a first wiring layer 108b serves as wiring conductor for $V_R$, and a left wiring layer 108a, a right wiring layer 108c, an underlying wiring layer 106 and an overlying wiring layer 109 serve as shielding wiring conductors. The overlying shielding wiring conductor is effective to prevent noise from interfering with the wiring layer 108b through capacitive coupling set up in the above space, thus promoting shielding effects.

Figure 42E:
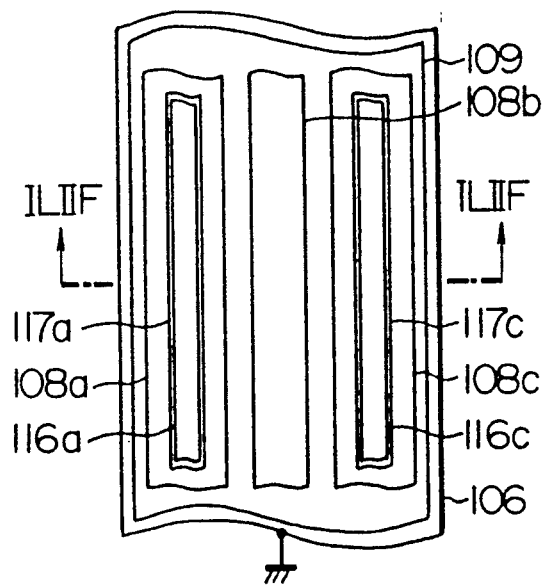
FIG. 42E is a diagram showing a third embodiment of the shielding.
Figure 42F:
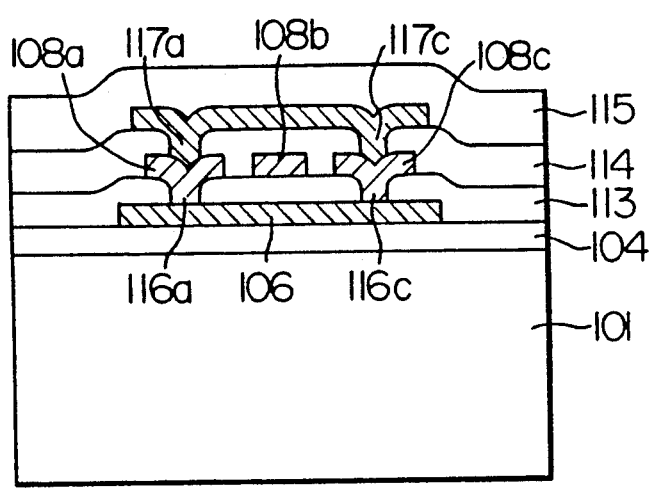
FIG. 42F is a sectional view taken on the line e—e' of FIG. 42E.

FIGS. 42E and 42F show a third embodiment of shielding. In this embodiment, the shielding wiring conductors are interconnected together through the medium of contact holes 116a and 116c and through holes 117a and 117c in order to provide complete shielding.

Figure 42G:
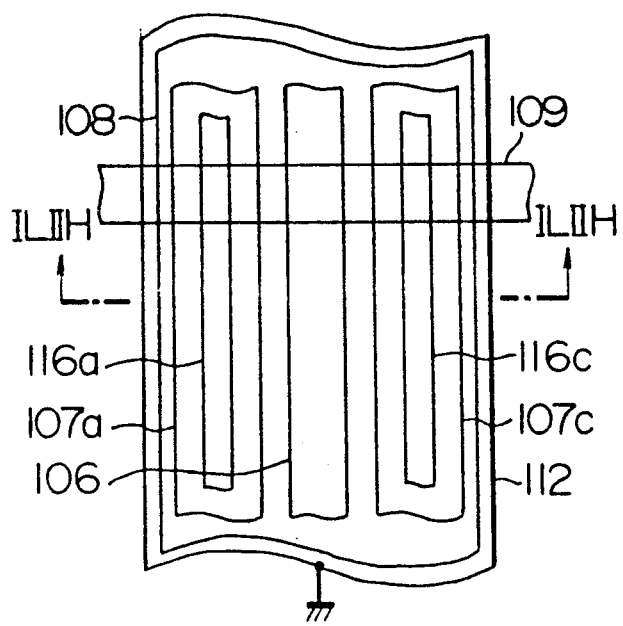
FIG. 42G is a diagram showing a fourth embodiment of the shielding.
Figure 42H:
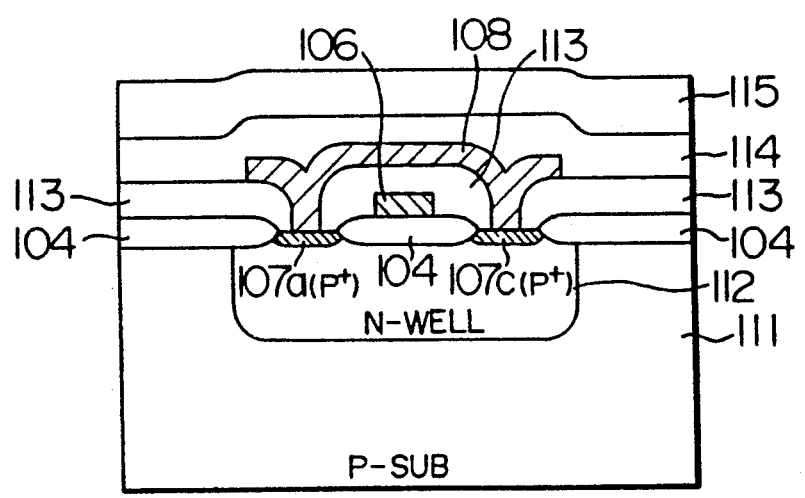
FIG. 42H is a sectional view taken on the line g—g' of FIG. 42G.

FIGS. 42G and 42H show a fourth embodiment of shielding. In this embodiment, a polycrystalline silicon layer 106 serves as wiring conductor for $V_R$. An underlying well 112 is connected to an overlying first wiring layer 108 through P-type diffusion layers 107a and 107c and contact holes 116a and 116c. Thus, the layer 106 is surrounded by the well 112, P-type diffusion layer 107a, contact hole 116a, first wiring layer 108, contact hole 116c and P-type diffusion layer 107c to complete shielding. This embodiment is advantageous in that a second wiring layer is not used for shielding but may be used for other purposes when laid as indicated at 109 in FIG. 42G. For example, this wiring layer may be used as a wiring conductor which intersects the wiring conductor for $V_R$.

The shielding structures in the foregoing embodiments create a parasitic capacitor between the $V_R$ wiring conductor and ground. This parasitic capacitor however sources positively as a so-called decoupling capacitor which can reduce impedance against high frequency of the $V_R$ wiring conductor to bypass high frequency noise. If capacitance of the thus created decoupling capacitor is insufficient, a capacitor may of course be added.

In the foregoing embodiments, potential at the shielding wiring layers is fixed to ground potential but it may be fixed to other stable potential. But fixing to ground potential is preferable because it is the simplest way of potential fixing and is effective to create the parasitic capacitor serving as decoupling capacitor. Especially, the shielding wiring layers may preferably be connected to the ground wiring conductors for the reference voltage generator (wiring conductor 8 shown in FIG. 40 or 41) in order to prevent interference of noise caused by the operation of other circuits. When the $V_R$ is generated relative to the $V_{CC}$ as described previously, potential at the shielding wiring layers may preferably be fixed to the $V_{CC}$.

Figure 43:
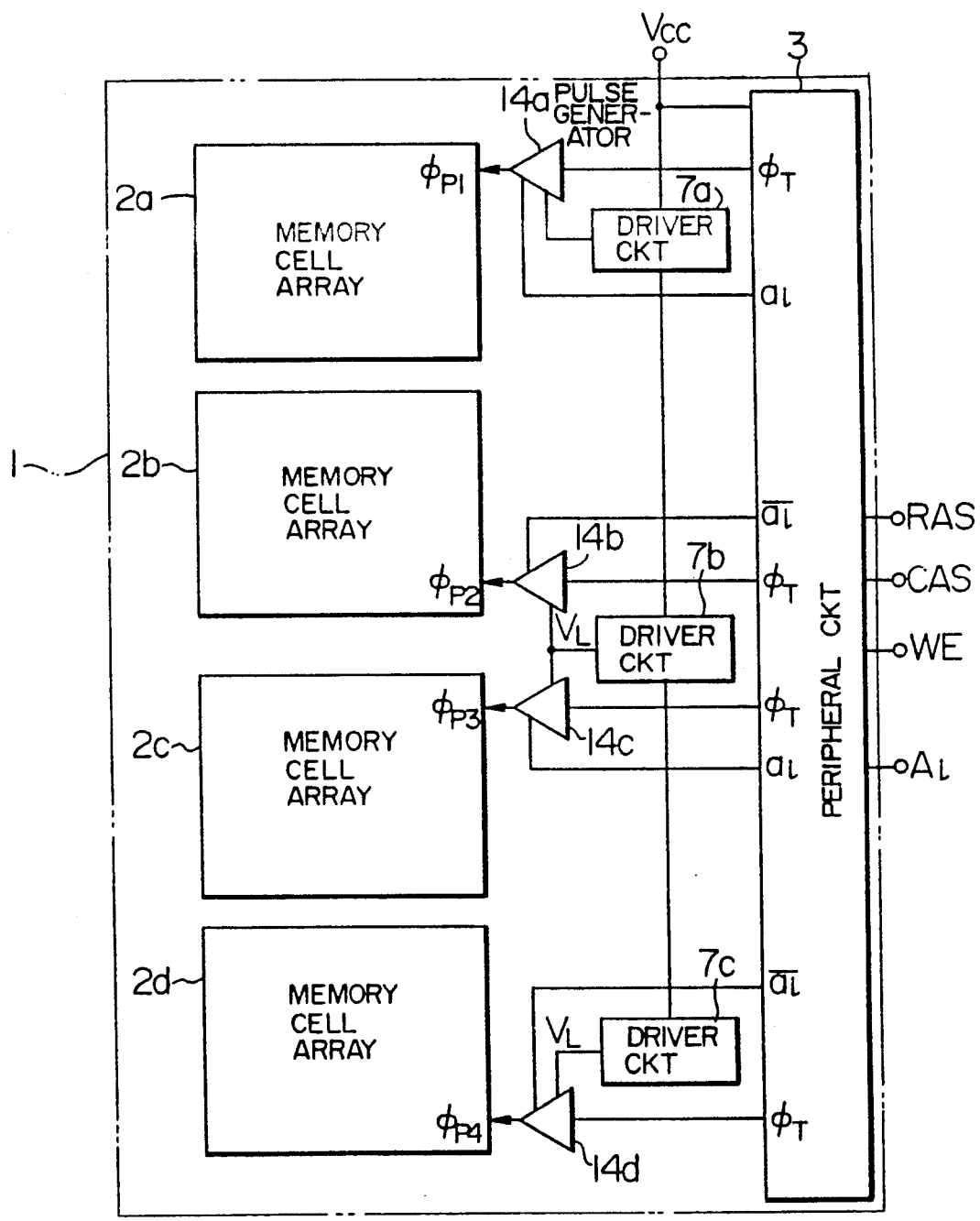
FIG. 43 is a schematic diagram of a third embodiment of the circuit layout and wiring according to the invention.
Figure 44:
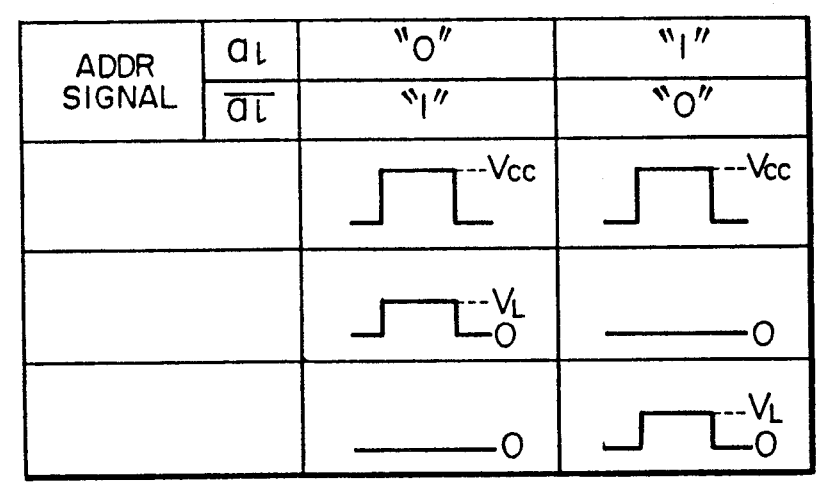

Referring now to FIG. 43, a third embodiment of the circuit layout and wiring will be described. In FIG. 43, reference numeral 1 designates a semiconductor memory chip, 3 a peripheral circuit, 7a, 7b and 7c driver circuits respectively adapted to generate internal power supply voltage $V_L$, 14a, 14b, 14c and 14d pulse generators using the output voltage of the driver circuits as power supply voltage to generate pulses $\phi_{P1}$, $\phi_{P2}$, $\phi_{P3}$ and $\phi_{P4}$, and 2a, 2b, 2c and 2d memory cell arrays each comprising fine MOS transistors and respectively driven by the pulses $\phi_{P1}$, $\phi_{P2}$, $\phi_{P3}$ and $\phi_{P4}$. The FIG. 43 circuit layout is illustrated with omission of the reference voltage generator. FIG. 44 shows operation timings in this embodiment.

In this embodiment, a single external power supply voltage $V_{CC}$ (for example 5 V) is applied to the semiconductor memory chip 1. Each of the driver circuits 7a, 7b and 7c lowers the $V_{CC}$ to produce an internal power supply voltage $V_L$ (for example, 3 V). The voltage $V_L$ is supplied to each of the pulse generators 14a, 14b, 14c and 14d. Some of the pulse generators are supplied with a timing pulse $\phi_T$ and an address signal $a_i$ and the remaining pulse generators are supplied with the timing pulse $\phi_T$ and an inverted address signal $\overline{a_i}$. The timing pulse $\phi_T$ and address signals $a_i$ and $\overline{a_i}$ are illustrated in FIG. 44.

The peripheral circuit 3 is responsive to an external address signal $A_i$ to generate the internal address signals $a_i$ and $\overline{a_i}$ and is also responsive to external control signals such as row address strobe signal $\overline{RAS}$, column address strobe signal $\overline{CAS}$ and write enable signal $\overline{WE}$ to generate the internal timing pulse $\phi_T$. The peripheral circuit having less influence upon the degree of integration of the chip is not required to use fine elements. The peripheral circuit is directly driven by the external power supply voltage $V_{CC}$ for the convenience of the external interface but obviously it may otherwise be driven by the internal power supply voltage.

The memory cell arrays are selected for operation by the address signal. In this embodiment, for $a_i=$"0" ($\overline{a_i}=$"1"), the arrays 2a and 2c are selected (with the arrays 2b and 2d unselected) and for $a_i=$"1" ($\overline{a_i}=$"0"), the arrays 2b and 2d are selected (with the arrays 2a and 2c unselected). Thus, as shown in FIG. 44, for $a_i=$"0", the pulse generators 14a and 14c respond to the timing pulse $\phi_T$ to deliver the pulses $\phi_{P1}$ and $\phi_{P3}$ which in turn drive the arrays 2a and 2c and conversely, for $a_i=$"1", the pulse generators 14b and 14d respond to the timing pulse $\phi_T$ to deliver the pulses $\phi_{P2}$ and $\phi_{P4}$ which in turn drive the arrays 2f and 2d.

Figure 1A:
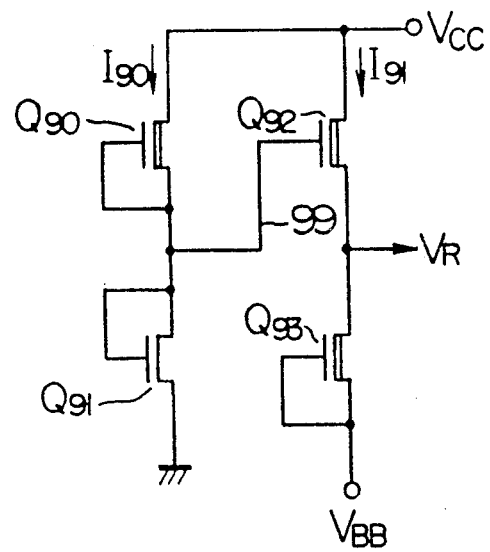
FIG. 1A is a circuit diagram of a prior art reference voltage generator.
Figure 1B:
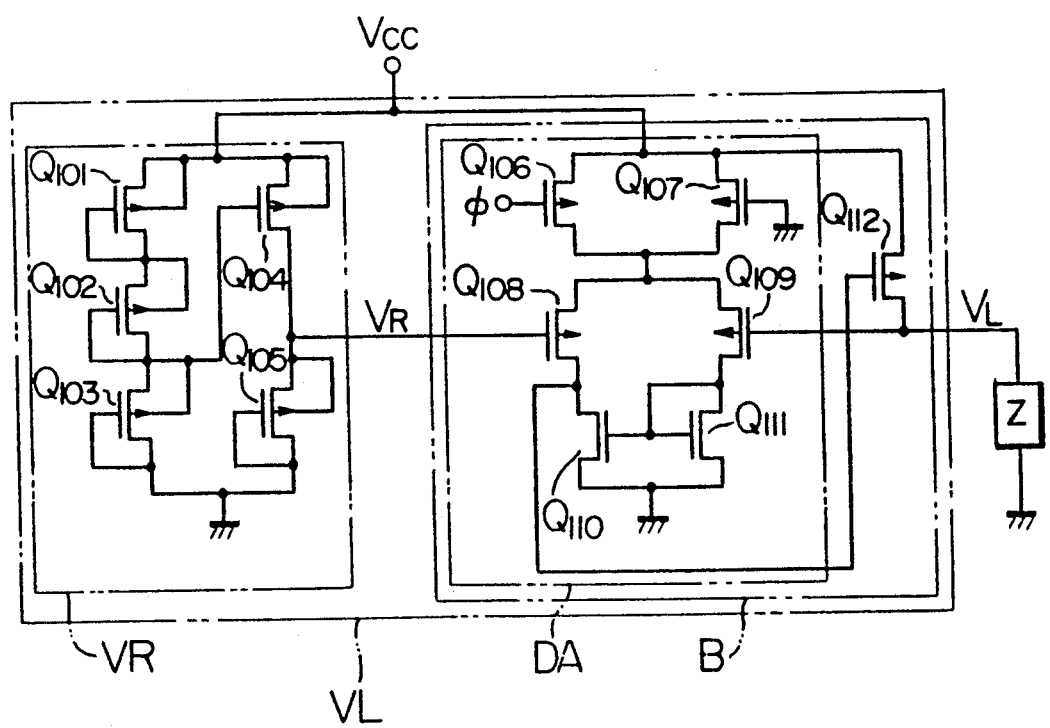
FIG. 1B is a circuit diagram of a prior art voltage limiter circuit.
Figure 2:
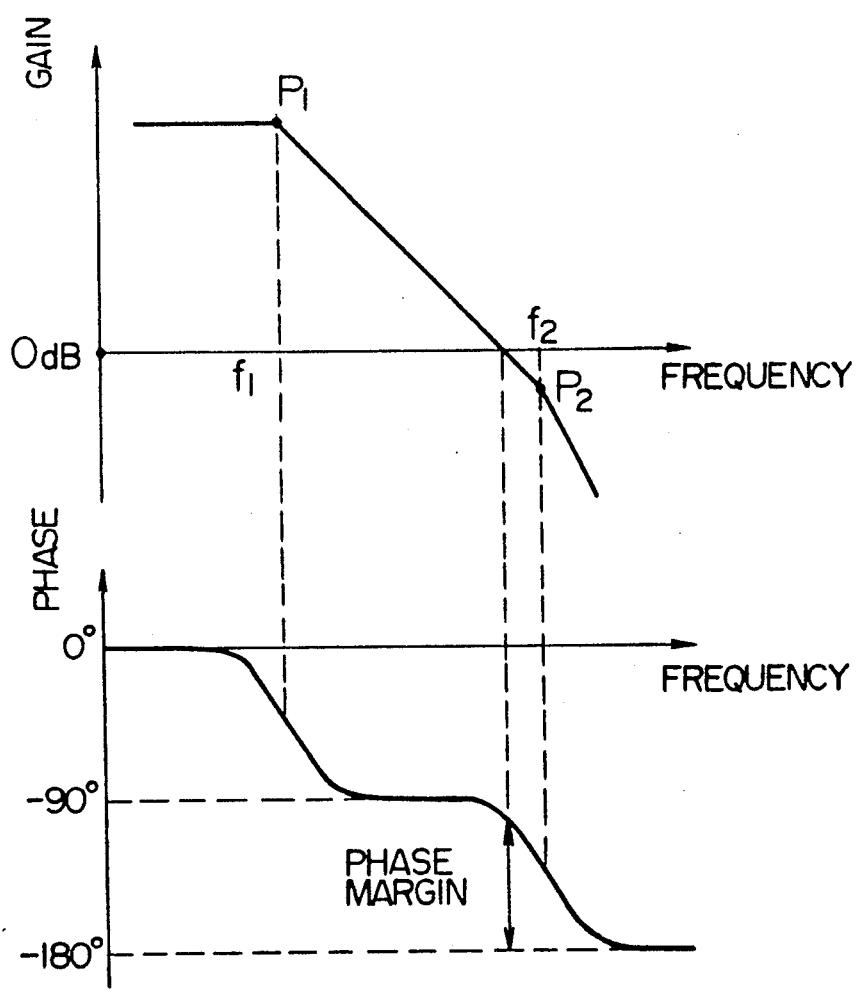
FIGS. 2 to 6 are diagrams useful to explain problems encountered in the prior arts.
Figure 3:
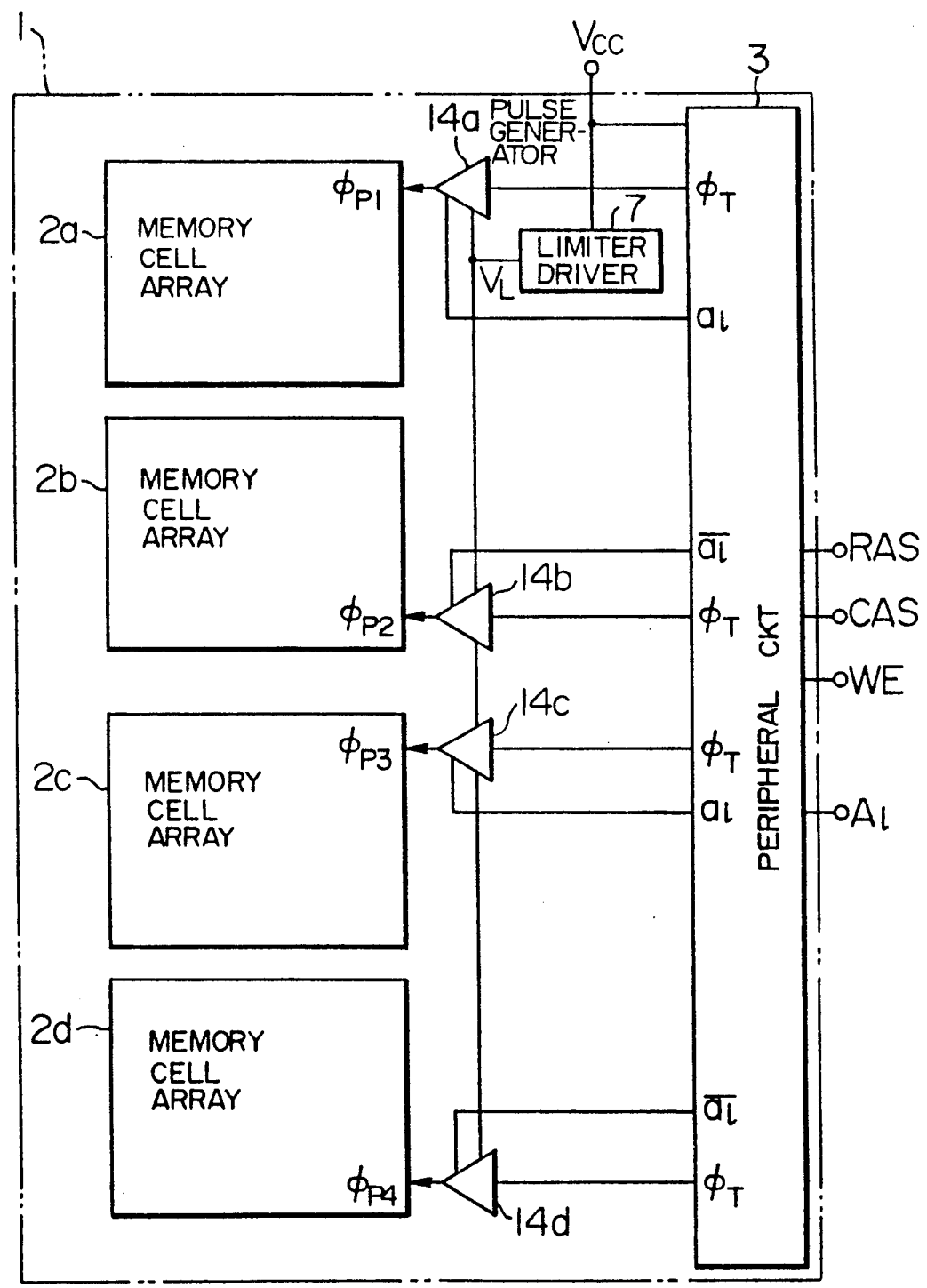
Figure 4:
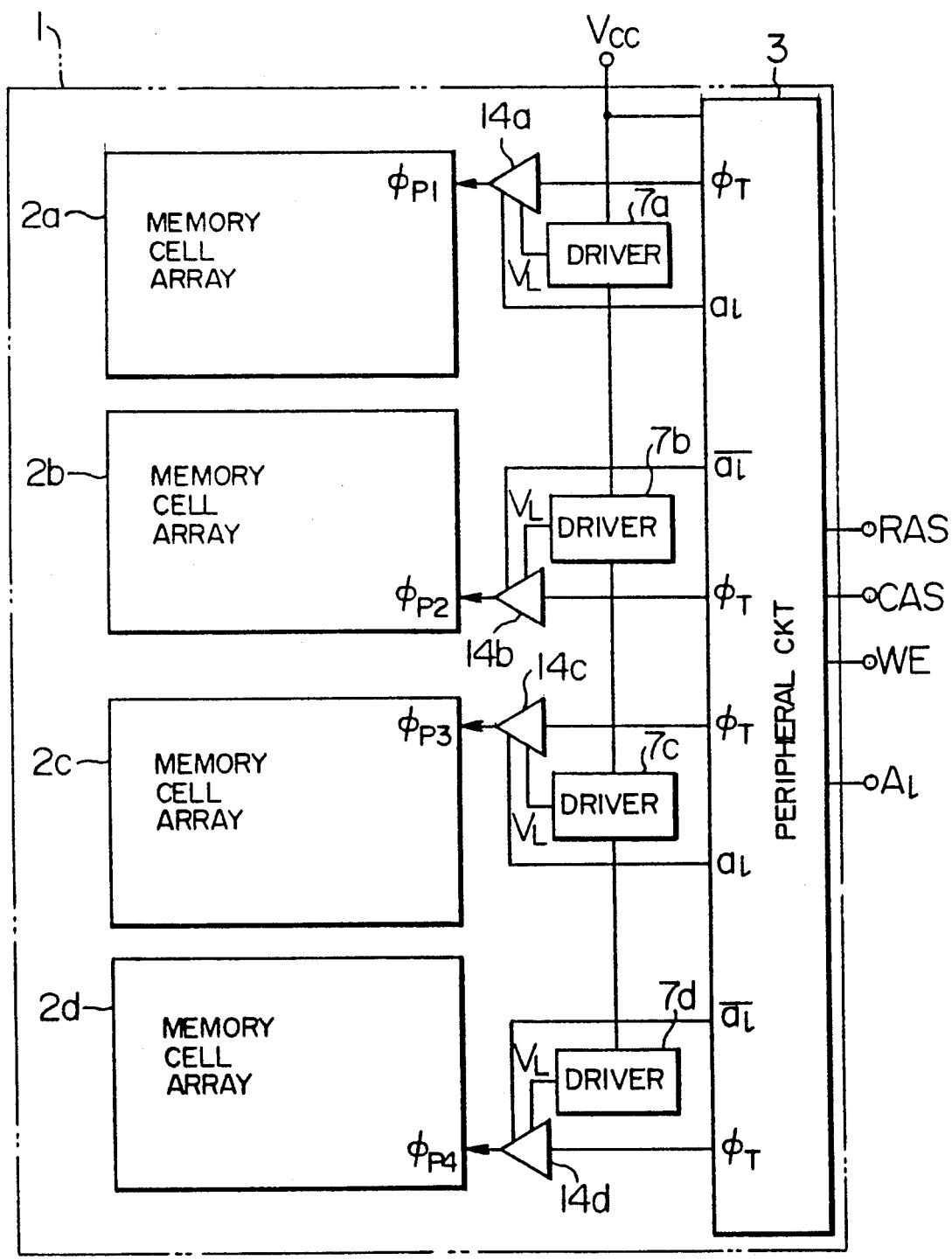
Figure 5:
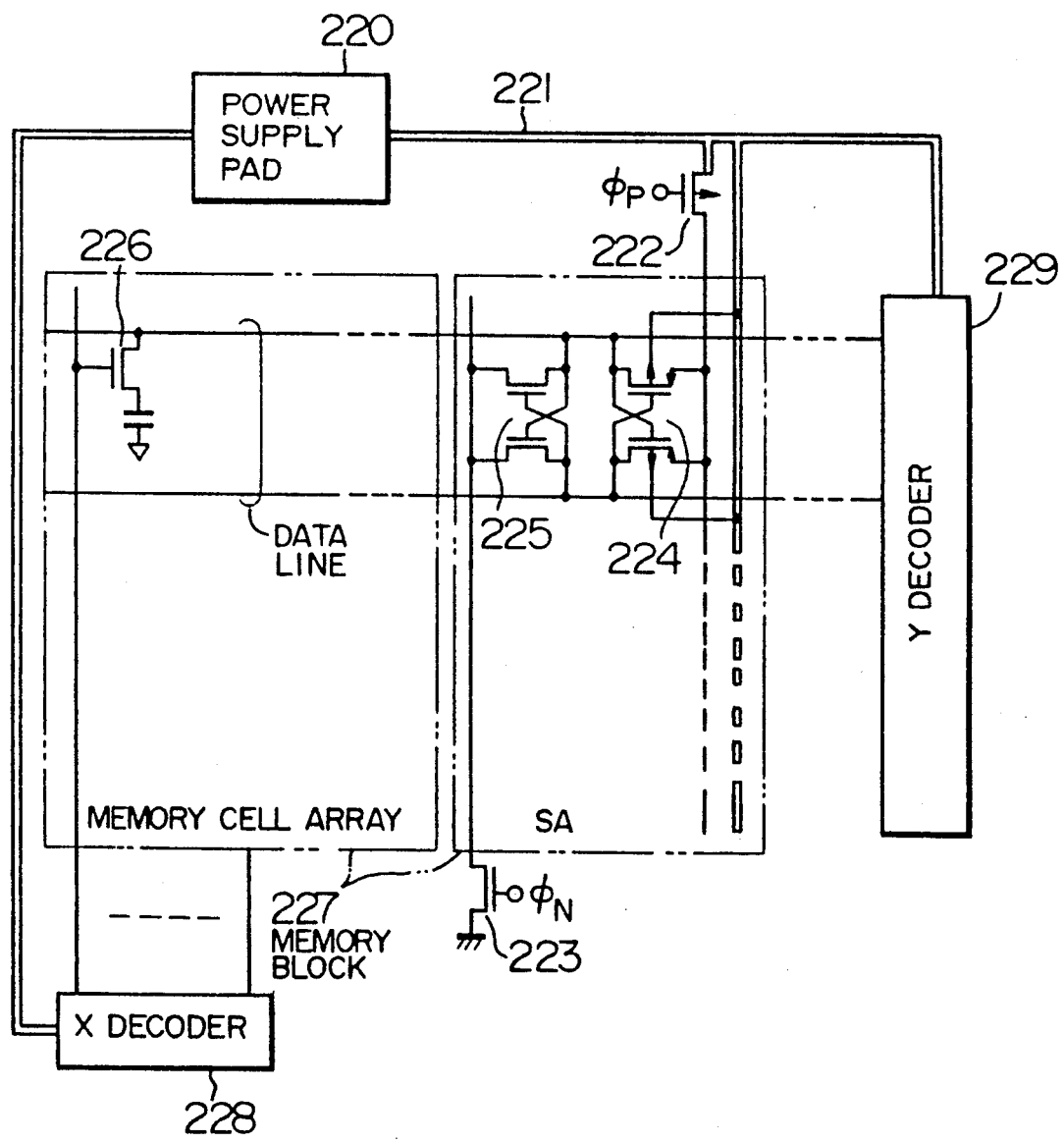

This embodiment features that each driver circuit is disposed near each pulse generator and the pulse generators 14b and 14c commonly use the driver circuit 7b. Therefore, in comparison with the layout of FIG. 3, the length of the wiring conductor can be reduced and impedance associated with the wiring conductor can be reduced, thereby suppressing the level of generated noise. In comparison with the layout of FIG. 4, the number of the driver circuits and be reduced by one to decrease chip occupation area and power consumption. Further, since the pulse generators 14b and 14c are not operated simultaneously, the driver circuit 7b is required to drive only one pulse generator and there is no need of doubling current drivability of this driver circuit.

Figure 45A:
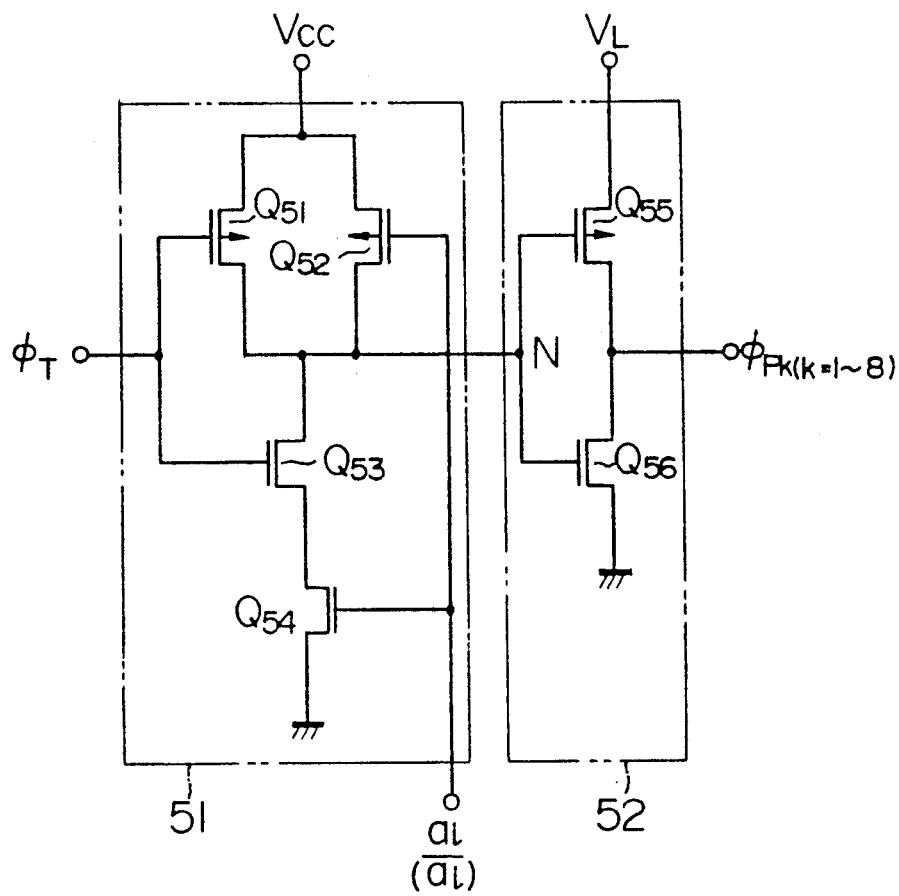
FIG. 45A is a circuit diagram of an embodiment of a pulse generator used in the FIG. 43 embodiment.
Figure 45B:
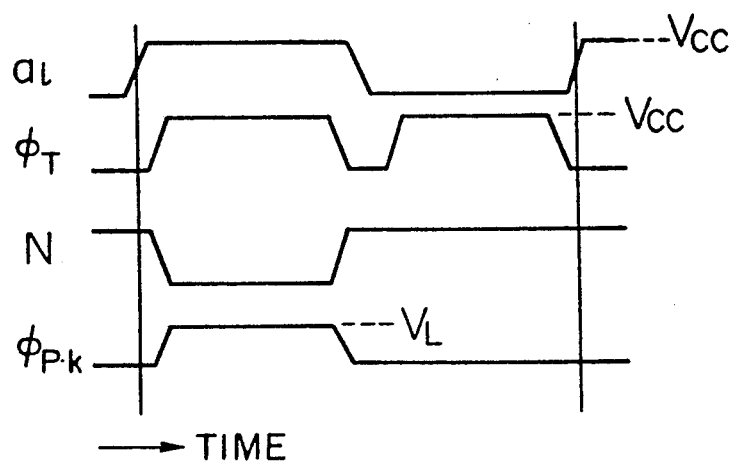
FIG. 45B is a time chart for explaining the operation of the FIG. 45A circuit.

FIG. 45 shows an embodiment of each of the pulse generators 14a to 14d. Referring to FIG. 45, reference numeral 51 designates a two-input NAND circuit including P-channel MOS transistors $Q_{51}$ and $Q_{52}$ and N-channel MOS transistors $Q_{53}$ and $Q_{54}$, and 52 an inverter including a P-channel MOS transistor $Q_{55}$ and an N-channel MOS transistor $Q_{56}$. The NAND circuit 51 fed with the power supply voltage $V_{CC}$ receives the timing pulse $P_T$ and address signal $a_i$ (or $\overline{a_i}$), and the inverter 52 is fed with the power supply voltage $V_L$. The pulse generator operates in accordance with a time chart as shown in FIG. 45B. When the $a_i$ is "1" (potential $V_{CC}$), the pulse $\phi_{Pk}$ having an amplitude of internal power supply voltage $V_L$ is delivered under the application of the $\phi_T$. The NAND circuit is fed for operation with the external power supply voltage $V_{CC}$ but it may otherwise be fed for operation with the internal power supply voltage $V_L$.

Figure 46:
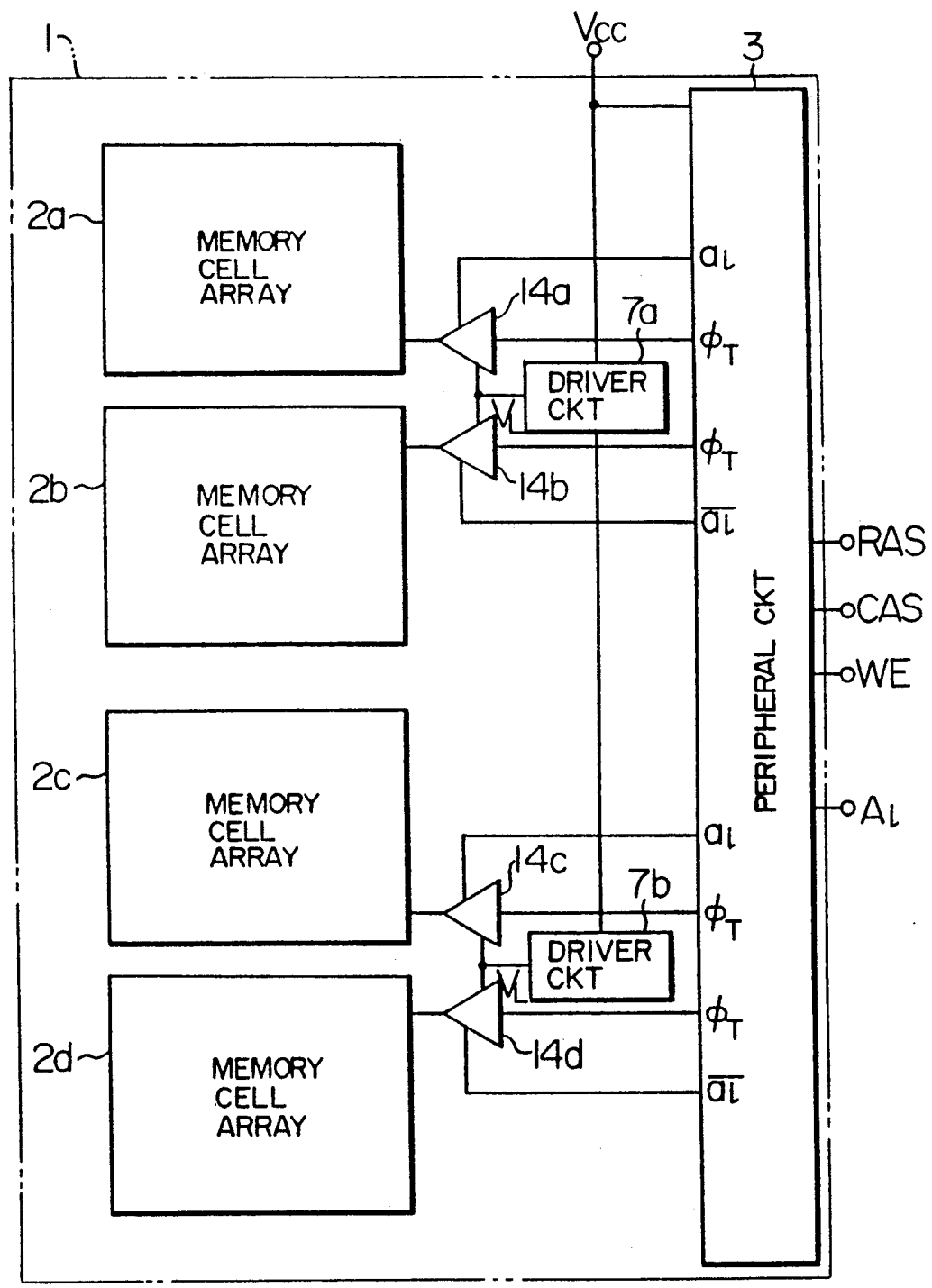
FIG. 46 is a schematic diagram of a fourth embodiment of the circuit layout and wiring according to the invention.

FIG. 46 shows a fourth embodiment of the circuit layout and wiring. As compared to the FIG. 43 embodiment, the number of the driver circuit is reduced by one. Address signals $a_i$ and $\overline{a_i}$, timing pulse $\phi_T$ and pulse $\phi_{P1}$ to $\phi_{P4}$ are the same as those explained in connection with the FIG. 43 embodiment.

In this embodiment, pulse generators 14a and 14b commonly use a driver circuit 7a, and pulse generators 14c and 14d commonly use a driver circuit 7b. Therefore, in comparison with the FIG. 43 embodiment, the number of the driver circuits can be reduced by one to decrease chip occupation area and power consumption. In this embodiment, the operation timing shown in FIG. 44 is applicable so that simultaneous operation of the pulse generators 14a and 14b as well as the pulse generators 14c and 14d may be avoided. Therefore, each of the driver circuits 7a and 7b is required to drive only one pulse generator and there is no need of doubling current drivability of each driver circuit.

Figure 47:
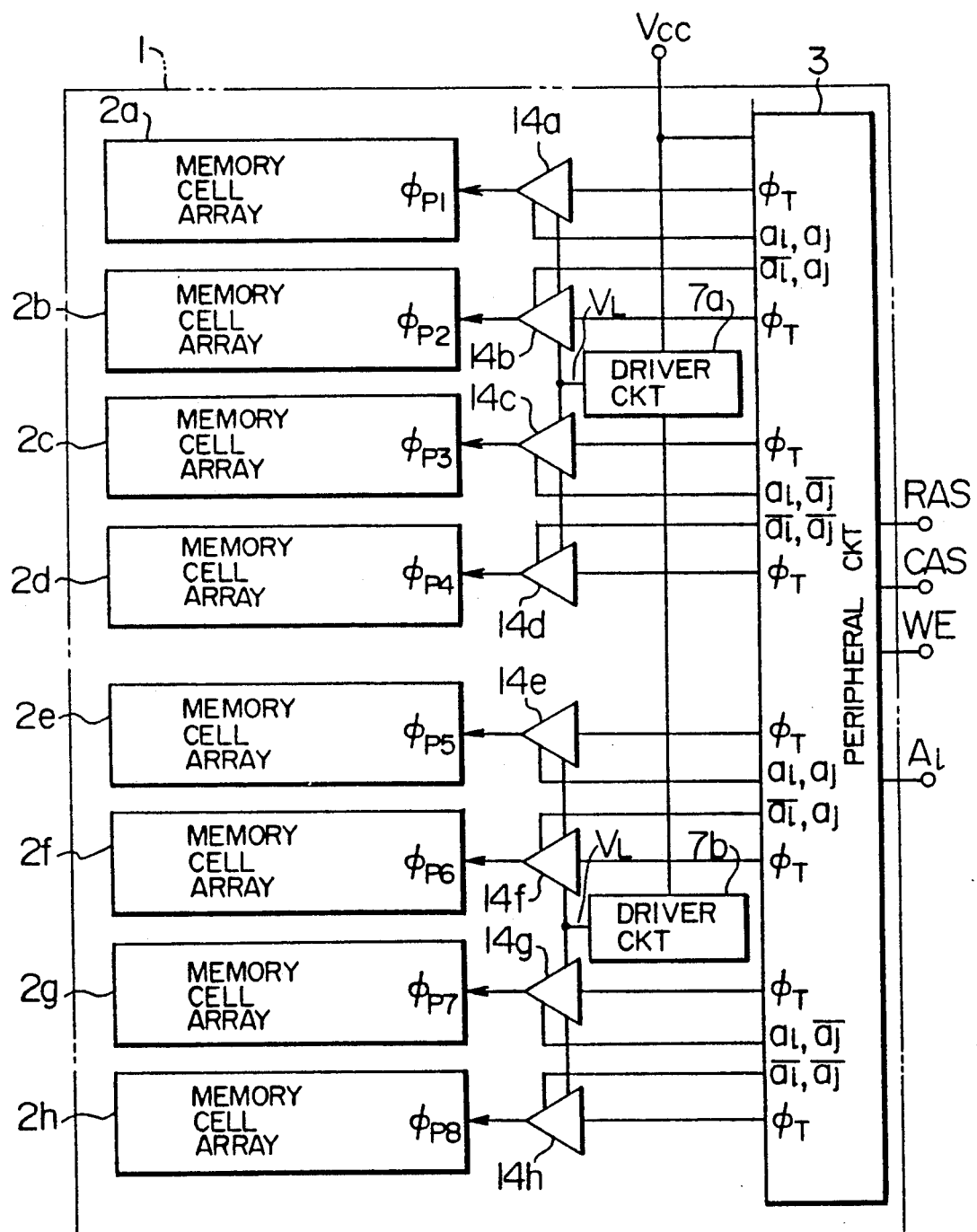
FIG. 47 is a schematic diagram of a fifth embodiment of the circuit layout and wiring according to the invention.

FIG. 47 shows a fifth embodiment of the circuit layout and wiring wherein eight memory cell arrays are provided. Referring to FIG. 47, reference numeral 1 designates a semiconductor chip, 3 a peripheral circuit, 2a to 2h memory cell arrays, 7a and 7b driver circuits, and 14a to 14h pulse generators. In this embodiment, two of the eight arrays are selected simultaneously by two address signals ai and aj and only the selected arrays are operated. More particularly, for $a_i a_j=$"00", the arrays 2a and 2e are selected; for $a_i a_j=$"01", the arrays 2b and 2f are selected; for $a_i a_j=$"10", the arrays 2c and 2g are selected; and for $a_i a_j=$"11", the arrays 2d and 2h are selected. Accordingly, only pulses $\phi_{Pk}$, when k=1 to 8, for the selected arrays are delivered. More particularly, as shown in FIG. 48, for address signals $a_i a_j=$"00", pulses $\phi_{P1}$ and $\phi_{P5}$ delivered; for $a_i a_j=$"01", pulses $\phi_{P2}$ and $\phi_{P6}$ are delivered; for $a_i a_j=$"10", pulses $\phi_{P3}$ and $\phi_{P7}$ are delivered; and for $a_i a_j=$"11", pulses $\phi_{P4}$ and $\phi_{P8}$ are delivered. The pulse $\phi_{Pk}$, where k=1 to 8, is delivered in timed relationship with the timing pulse $\phi_T$ and its amplitude equals the internal power supply voltage $V_L$.

In this embodiment, the eight pulse generators for driving the memory cell arrays are driver by the two driver circuits 7a and 7b of which one is used in common for 4 pulse generators and the other is used in common for the remaining 4 pulse generators. With this construction, the number of the driver circuits can be reduced greatly and occupation area and power consumption can be reduced.

Figure 49:
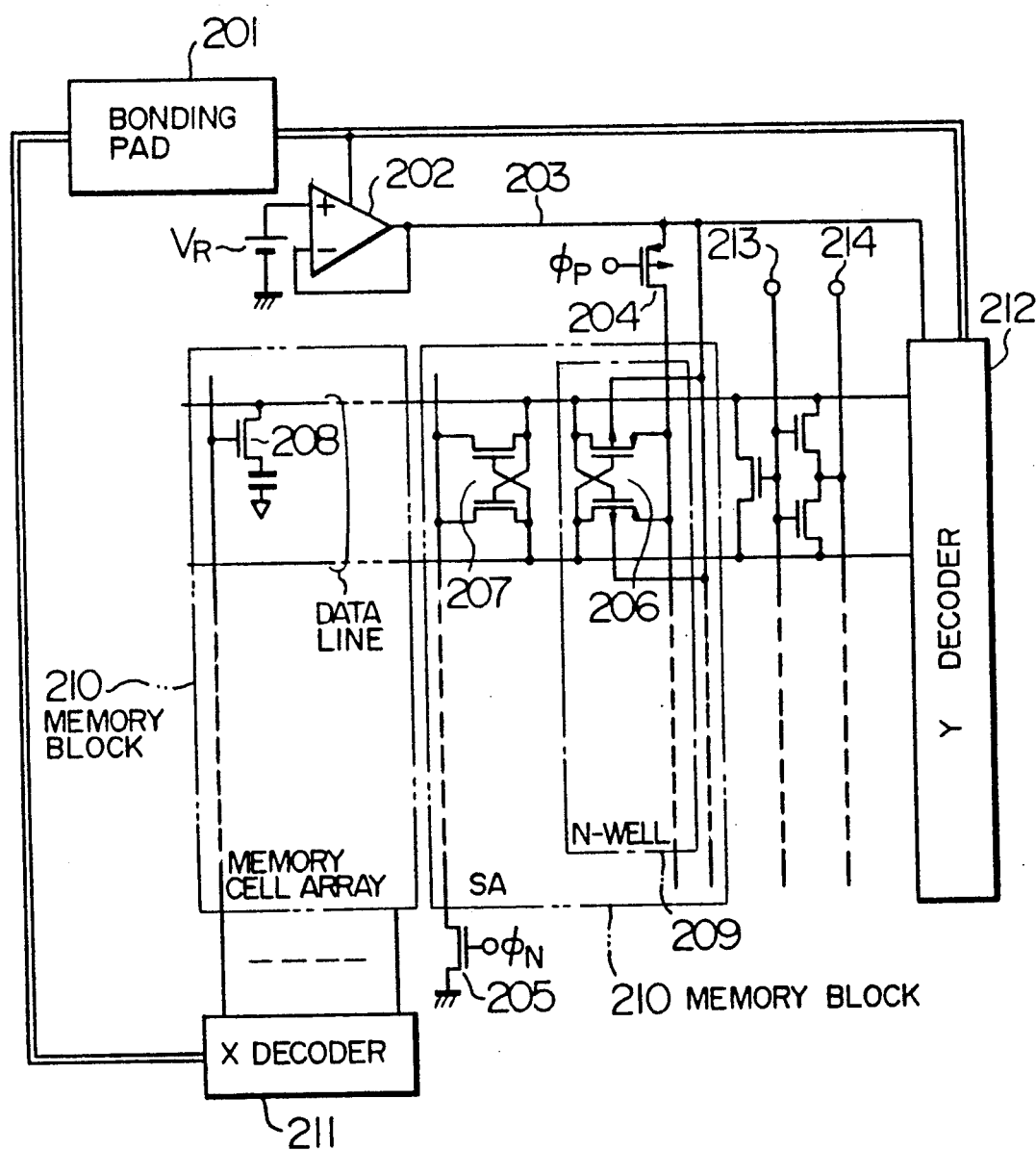
FIG. 49 is a circuit diagram of a third embodiment of the application arrangement according to the invention.

Referring now to FIG. 49, a third embodiment of the DRAM to which the invention is applied will be described. In FIG. 49, reference numeral 201 designates a bonding pad used for supply of a power supply voltage ($V_{CC}$) and connected to an external power supply, 202 a differential amplifier, 203 a line for supply of a power supply voltage ($V_L$) dropped internally, 204 a MOS transistor for starting a P-channel MOS sense amplifier 206, 205 a MOS transistor for starting and N-channel MOS sense amplifier 207, 208 a memory cell, 209 an N-type well of the P-channel MOS sense amplifier, 210 a memory block including a memory cell array and the sense amplifier, 211 an X decoder, 212 a Y decoder, 213 a short/pre-charge signal line and 214 a line for supply of a power supply voltage $V_L/2$. The power supply voltage $V_{CC}$ is used to feed the peripheral circuit including the X decoder, Y decoder and a gate protection and signal generating circuit. In this embodiment, the internally dropped power supply voltage $V_L$ is used for the source power supply of the P-channel MOS sense amplifier connected to the sense amplifier starting MOS transistor 204, for the back gate (well) of the P-channel MOS transistor and for part of the Y decoder.

When in a so-called CMOS circuit such as sense amplifier a P-type substrate is used, a P-channel MOS transistor is typically formed in an N-type well. In this case, it is preferable that potential at the N well (back gate of the P-channel MOS transistor) equal not the external power supply voltage $V_{CC}$ but the operating voltage supplied to the source of the P-channel MOS transistor, for the reasons described below.

Figure 6:
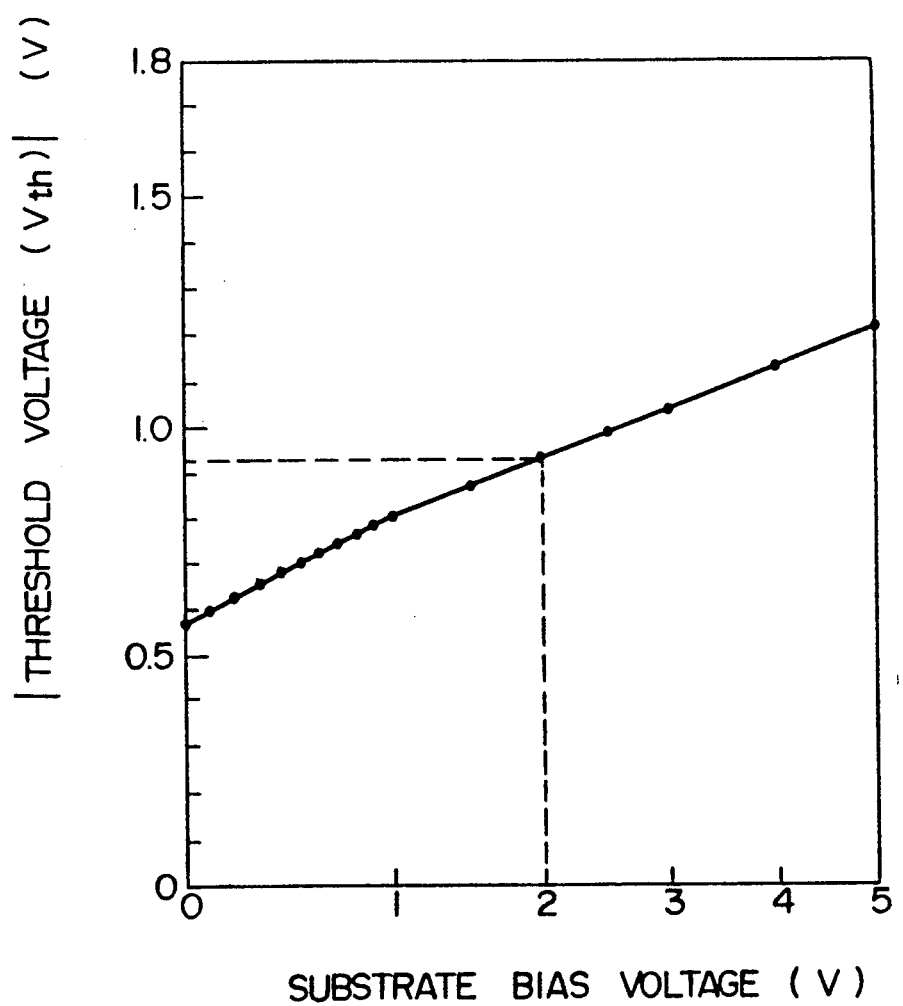
Figure 51:
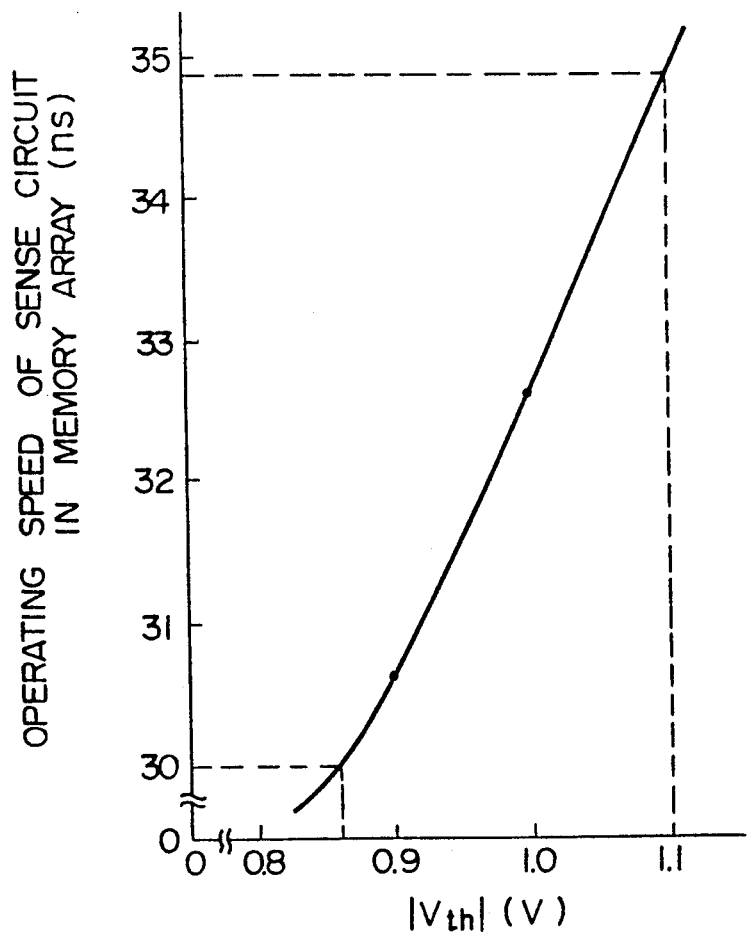
FIG. 51 is a graph showing characteristics of the FIG. 49 embodiment.

For example, assuming that $V_{CC}=5$ V and $V_{L1}=3$ V, the pre-charge level for data line is 1.5 V and hence a back gate bias of 1.5 V is applied to the P-channel MOS transistor before start of the sense amplifier but a back gate bias of 0 V is applied after start of the sense amplifier. Then, it will be determined from FIG. 6 that the threshold voltage (absolute value) is about 0.86 V before start of the sense amplifier and about 0.57 V after start of the sense amplifier. However, if the N-well voltage is set to the $V_{CC}$ equalling 5 V, the threshold voltage is 1.1 V before start of the sense amplifier and 0.92 V after start of the sense amplifier, indicating that these values are for layer than those determined with the N-well voltage being $V_{L1}$. FIG. 51 is a graph where the operating speed of the sense circuit in the DRAM is plotted with respect to the threshold voltage of the P-channel MOS transistor. As will be seen from FIG. 51, an increase of 0.1 V in the threshold voltage corresponds to a delay of about 2 ns, and therefore by setting the N-well voltage to the $V_{L1}$ equalling 3 V, the operating speed can be increased by about 5 ns or more. In the ultra high integration age, the trend of decreasing the operating voltage and increasing the concentration of the substrate (well) to promote the back gate bias effect in CMOSLSI circuits is predominant and therefore the effects of the present invention are of great significance.

Figure 50:
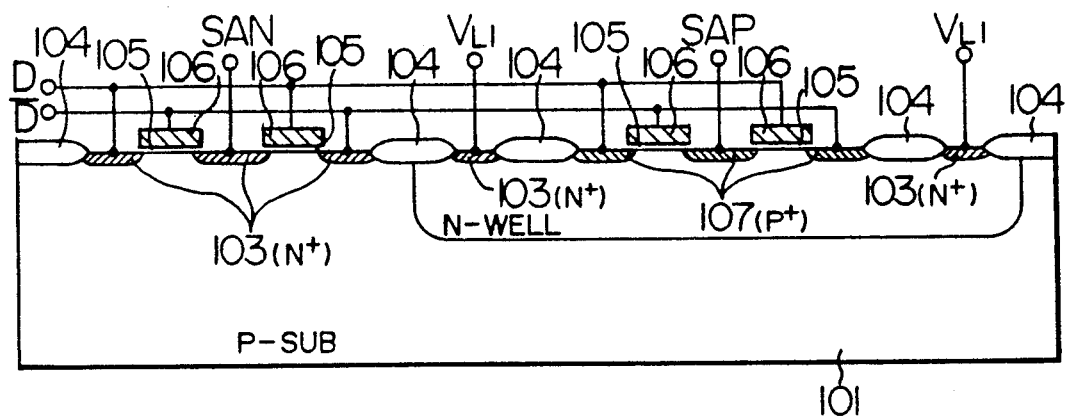
FIG. 50 is a diagram showing an embodiment of structure of a MOS transistor used in the FIG. 49 embodiment.

When the N-well voltage is set to be equal to the internal power supply voltage $V_L$ supplied to the P-channel MOS transistor, the N-well voltage is expected to change by being affected by capacitive coupling. However, in an embodiment of a structure of the P-channel MOS transistor shown in FIG. 50, the data line is pre-charged to $V_L/2$ and therefore an increased drain voltage and a decreased drain voltage are paired when the P-channel MOS transistor operates, thus minimizing noise. Accordingly, a problem of latch up due to the change of the N-well voltages does not occur.

The FIG. 49 embodiment has been described by way of example of the sense amplifier but teachings of the invention may also be applied to other types of CMOS circuits. The invention is applicable to, in addition to the DRAM, CMOSLSI circuits having two or more kinds of operating voltages. Even if in the foregoing embodiments the conductivity type and potential relationship are inverted, the invention will obviously be valid.

As described above, according to the invention, even when the voltage limiter circuit is required to drive various types of loads and the type and size of the load change depending on operation modes, compensation optimized for the type of load and the operation mode can be insured to stabilize the operation of the voltage limiter.

When a plurality of load circuits using the internal voltage as power supply are provided in the semiconductor chip, the length of the wiring conductor extending from each driver circuit to each load circuit can be decreased to suppress noise level. The number of the driver circuits can be reduced without increasing drivability of each driver circuit and hence occupation area and power consumption can be reduced.

In the CMOS circuit using the internally dropped operating voltage, the back gate (well) voltage of the transistor formed in the well is set to be equal to the dropped voltage so as to increase the operating speed of the circuit, thereby ensuring high reliability and high operating speed of large scale ultra high integrated circuits.

Group 3

In the memory LSI circuits, inspection of the internal voltage from the outside is necessary. For example, in the event that in a memory LSI circuit having a voltage limiter, the internal voltage value generated by the voltage limiter deviates from a design value, the operating margin of internal circuit is narrowed and the internal circuits operate erroneously. If the internal voltage value can not be known in inspection of the memory LSI circuit using a memory tester, the above problem is difficult to check.

By connecting the memory tester to a pad provided at an internal voltage terminal, the internal voltage value can be known from the outside. This method has however the following problems.

Firstly, the wiring conductor between the pad and memory tester is affected by noise to bring errors into measured values.

Secondly, the voltage value changes depending on input impedance of the memory tester.

Thirdly, the memory tester measures analog voltages and measurement is time-consuming as compared to measurement of digital signals.

In view of the above, a semiconductor circuit to be described hereinafter is so designed as to facilitate inspection of the internal voltage from the outside using the memory tester. Specifically, the semiconductor inspection circuit adapted for this purpose comprises means for comparing a voltage designated from the outside with an internal voltage and means for delivering results of comparison.

By comparing the externally designated voltage with the internal voltage and delivering results of comparison, a signal delivered to the outside takes the form of a digital signal. Thus, as compared to the aforementioned direct delivery of the internal voltage from the internal voltage terminal, the delivered signal is immune to the noise and input impedance of tester and besides the semiconductor inspection circuit can facilitate the inspection by the memory tester.

The inspection circuit will be described as applied to a DRAM but it may be applied to other types of semiconductor apparatus.

FIG. 52 shows a first embodiment of the inspection circuit applied to a DRAM having a voltage limiter. Referring to FIG. 52, reference numeral 1 designates a semiconductor memory chip, 2 a memory cell array of the DRAM, 3 a peripheral circuit of the DRAM, 4 a voltage limiter, 5 a comparator, 6 a multiplexer and output buffer, and 8 a test enable signal generating circuit. The voltage limiter 4 generates from an external voltage $V_{CC}$ an internal voltage $V_L$ lower than the $V_{CC}$. The peripheral circuit 3 of the DRAM is driven by the external voltage $V_{CC}$ but the memory cell array 2 is driven by the internal voltage $V_L$.

In this embodiment, the internal voltage $V_L$ can be inspected in a manner described below.

The comparator 5 compares the $V_L$ with a comparison voltage $V_S$. In this embodiment, the $V_S$ is applied through a terminal which is also used as data input terminal (pin) $D_{in}$ of the DRAM but it may be applied through a dedicated terminal or through another terminal which is, for example, one of address terminals. An output signal C of the comparator is delivered to a terminal $D_{out}$ through the multiplexer and output buffer 6. In this embodiment, the output signal C is delivered to the terminal also serving as data output terminal $D_{out}$ of the DRAM but it may be delivered to a dedicated terminal.

The comparison output signal C assumes high level when $V_L > V_S$ stands but low level when $V_L < V_S$ stands. Therefore, by observing the signal at the terminal $D_{out}$ while changing the comparison voltage $V_S$ applied to the terminal $D_{in}$, the internal voltage $V_L$ can be known.

For example, it is assumed that the $V_L$ is stipulated to be higher than $V_{Lmin}$ and lower than $V_{Lmax}$ within a range of the external voltage $V_{CC}$ which is $$V_{CCmin} \leq V_{CC} \leq V_{CCmax} \qquad (23)$$

To inspect this condition, the signal at the terminal $D_{out}$ keeping high level is first checked when the $V_{CC}$ is changed from $V_{CCmin}$ to $V_{CCmax}$ under the application of $V_{Lmin}$ to the terminal $D_{in}$ and subsequently, the signal at the terminal $D_{out}$ keeping low level is checked when the $V_{CC}$ is changed from $V_{CCmin}$ to $V_{CCmax}$ under the application of $V_{Lmax}$ to the terminal $D_{in}$.

This embodiment features that the output signal at the terminal $D_{out}$ is a digital signal assuming one of high and low levels. Therefore, as compared to the direct delivery of analog voltage, errors due to noise and input impedance of the memory tester can be mitigated and inspection by the memory tester can be facilitated.

A test enable signal TE indicates whether the mode is for $V_L$ inspection or read/write. This signal is used for enabling the comparator 5 and switching the multiplexer and output buffer 6. In this embodiment, the signal TE is generated from the circuit 8 but it may be inputted through a dedicated terminal. The test enable signal generating circuit 8 is responsive to a row address strobe signal $\overline{RAS}$, a column address strobe signal $\overline{CAS}$ and a write enable signal $\overline{WE}$ which are applied to the DRAM to generate the TE in accordance with a combination of timings for application of these signals.

Application timings will be described with reference to FIGS. 53A and 53B.

Figure 53A:
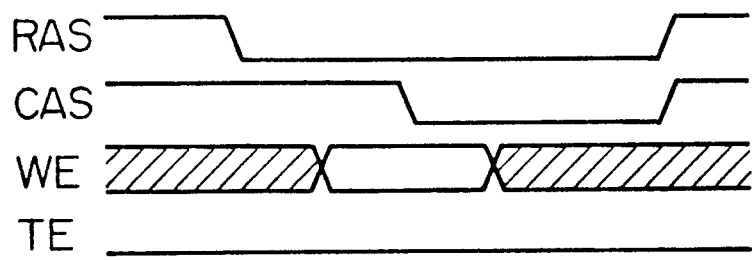
FIGS. 53A and 53B are diagrams useful in explaining the operation of the FIG. 52 embodiment.
Figure 53B:
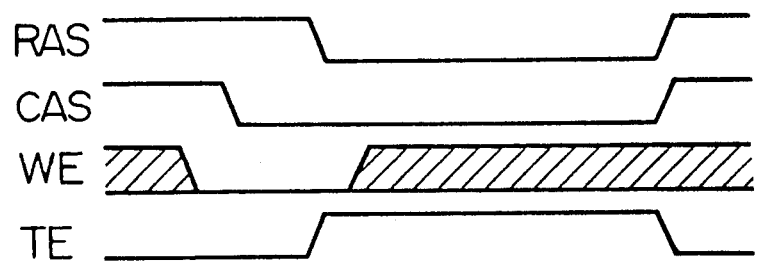

In the DRAM, during normal read/write mode, the application of the $\overline{RAS}$ precedes the application of the $\overline{CAS}$ as shown in FIG. 53A. Conversely, when the $\overline{CAS}$ is applied earlier than the $\overline{RAS}$ and at that time the $\overline{WE}$ assumes the low level, the circuit 8 determines that a $V_L$ inspection mode is designated and operates to generate the TE. It should be noted that methods of designating special operation modes in accordance with combinations of timings for application of the $\overline{RAS}$, $\overline{CAS}$ and $\overline{WE}$ are discussed in, for example, ISSCC Digest of Technical Papers, pp. 18-19, Feb. 1987 or ISSCC Digest of Technical Papers, pp. 286-287, Feb. 1987.

To supplement the explanation of the manner of inputting/outputting the signals $V_S$, C and TE exclusively used for $V_L$ inspection, terminals dedicated to these signals may be provided as described previously but more preferably, as in the FIG. 52 embodiment, the $V_S$ is applied from the existing input terminal $D_{in}$, the C is delivered to the existing output terminal $D_{out}$, and the TE is generated in accordance with a combination of timings for application of the $\overline{RAS}$, $\overline{CAS}$ and $\overline{WE}$. This design is advantageous in that the $V_L$ inspection can be carried out using only the existing terminals of the DRAM and therefore not only wafers but also assembled packages can be subjected to the $V_L$ inspection.

Figure 54:
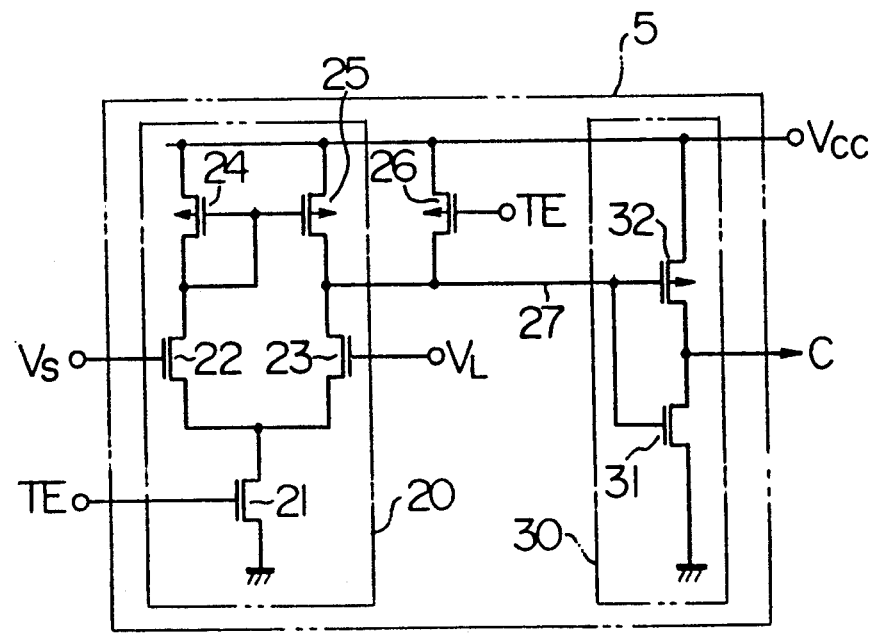
FIG. 54 is a circuit diagram of an embodiment of a comparator used in the FIG. 52 embodiment.

FIG. 54 shows an embodiment of the comparator 5.

Referring to FIG. 54, the comparator 5 comprises a differential amplifier 20 for receiving the $V_L$ and $V_S$ and delivering an output signal to a node 27, and an inverter 30 for receiving the signal on the node 27 and delivering the C. The differential amplifier 20 includes N-channel MOS transistors 21, 22 and 23 and P-channel MOS transistors 24 and 25. The inverter 30 includes an N-channel MOS transistor 31 and a P-channel MOS transistor 32, When the $V_L$ is higher than the $V_S$, the node 27 assumes the low level and the output signal C assumes the high level. Conversely, when the $V_L$ is lower than the $V_S$, the node 27 is high and the C is low.

Conceivably, the comparator may be constructed of only the differential amplifier but preferably, as in this embodiment, the inverter is added which amplifies the output signal of the differential amplifier, thereby permitting the output signal C to soundly take the high level nearly equalling $V_{CC}$ and the low level nearly equalling 0 V.

In this comparator, because of the application of the TE to the gate of the MOS transistor 21, current is permitted to flow through the differential amplifier only when the $V_L$ inspection mode is designated by making the TE high and consequently an increase in power consumption in normal operation mode can be prevented. A P-channel MOS transistor 26 is turned on in normal operation mode to maintain the node 27 at the high level.

Figure 55:
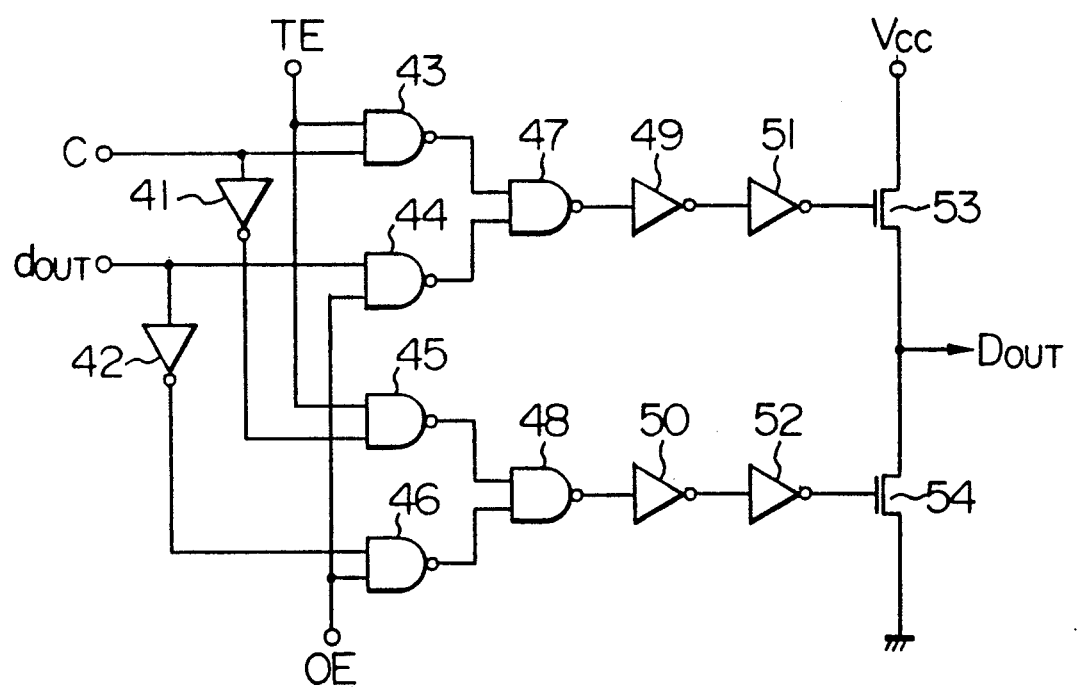
FIG. 55 is a circuit diagram of an embodiment of a multiplexer and output buffer used in the FIG. 52 embodiment.

FIG. 55 shows an embodiment of the multiplexer and output buffer. Referring to FIG. 55 reference numerals 41 and 42 and 49 to 52 designate inverters, 43 to 48 NAND gates, and 53 and 54 N-channel MOS transistors. The circuit is operable to select one of the data output signal $d_{out}$ of DRAM and the output signal C of comparator and deliver the selected signal to the output terminal $D_{out}$. The test enable signal TE described previously cooperates with a DRAM output enable signal OE to determine which output signal is to be selected. In the $V_L$ inspection mode, the TE is high and the OE is low to select and deliver the output signal C but in the read mode, the TE is low and the OE is high to select and deliver the data output signal $d_{out}$. In the write mode or standby status, both the TE and OE are low and the output terminal $D_{out}$ assumes high impedance.

Figure 56:
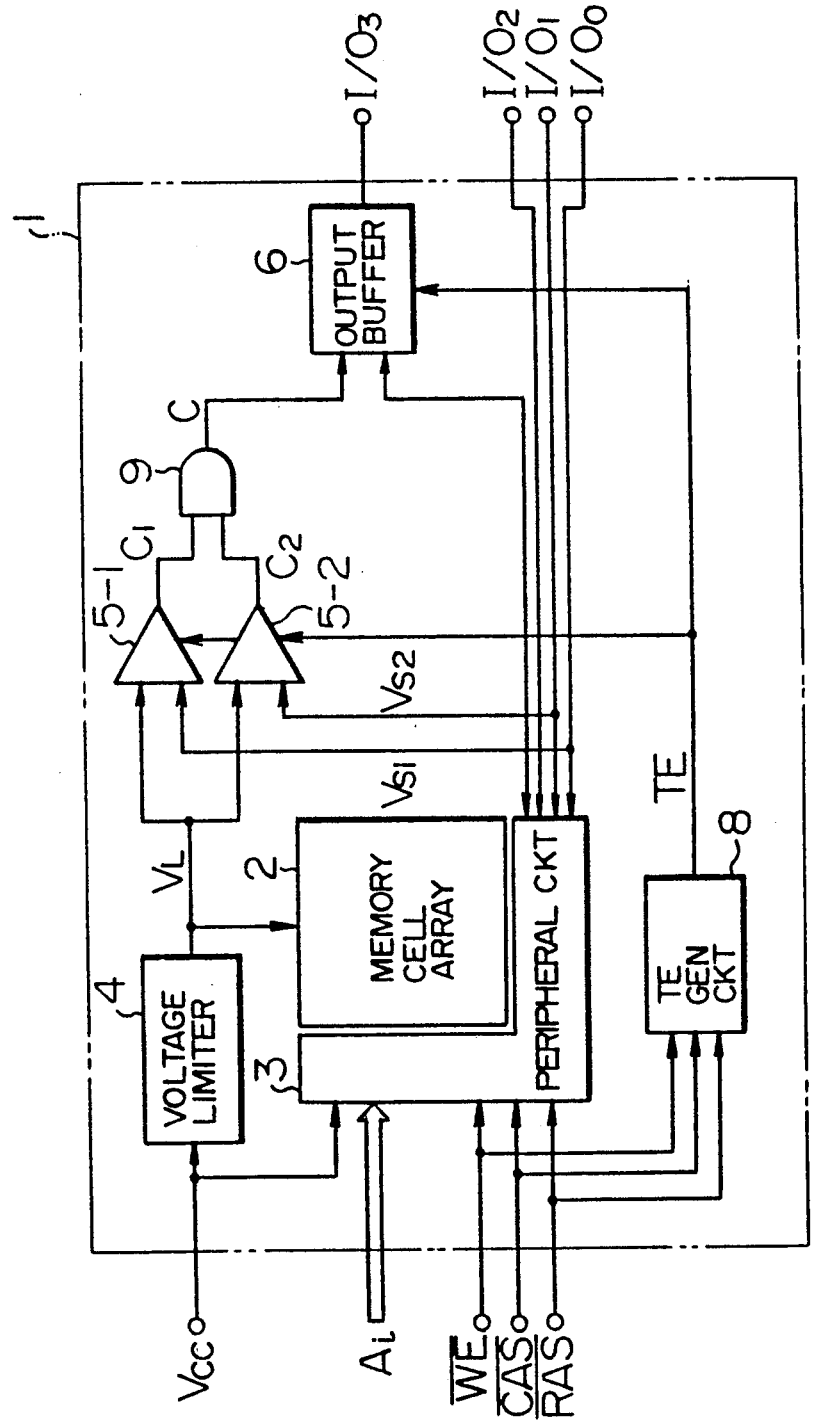
FIG. 56 is a block diagram of a second embodiment of the inspection circuit according to the invention.

FIG. 56 shows a second embodiment of the inspection circuit. This embodiment differs from the FIG. 52 embodiment in that two comparators 5-1 and 5-2 are provided and comparison voltages $V_{S1}$ and $V_{S2}$ are applied to the comparators 5-1 and 5-2, respectively.

The comparator 5-1 compares the internal voltage $V_L$ with the comparison voltage $V_{S1}$ and the comparator 5-2 compares the $V_L$ with the $V_{S2}$. A comparison output signal $C_1$ is high level when $V_L > V_{S1}$ and is low level when $V_L > V_{S1}$. A comparison output signal $C_2$ is low level when $V_L > V_{S2}$ and is high level when $V_L < V_{S2}$. The output signals $C_1$ and $C_2$ are ANDed at an AND gate to provide the output signal C.

This embodiment is applied to a so-called x 4-bit structure DRAM wherein data input terminals play the part of data output terminals and 4 bits are read/written simultaneously. Accordingly, three of the four data input/output terminals $I/O_0$ to $I/O_3$ are also utilized for application of the comparison voltages $V_{S1}$ and $V_{S2}$ and delivery of the comparison result output signal C. If this embodiment is applied to the x 1-bit structure DRAM described in connection with the FIG. 52 embodiment, the terminal $D_{out}$ may exemplarily be utilized for delivery of the C and the terminal $D_{in}$ and an address terminal may exemplarily be utilized for application of the $V_{S1}$ and $V_{S2}$.

Advantageously, in accordance with this embodiment, the $V_L$ can be checked as to whether it falls within a certain range through one inspection. For example, it is assumed that the $V_L$ is stipulated to be higher than $V_{Lmin}$ and lower than $V_{Lmax}$. To inspect this condition, $V_{S1} = V_{Lmin}$ and $V_{S2} = V_{Lmax}$ are set. Then, the output signal C is permitted to assume the high level only when $V_{Lmin} < V_L < V_{Lmax}$ stands.

Figure 57:
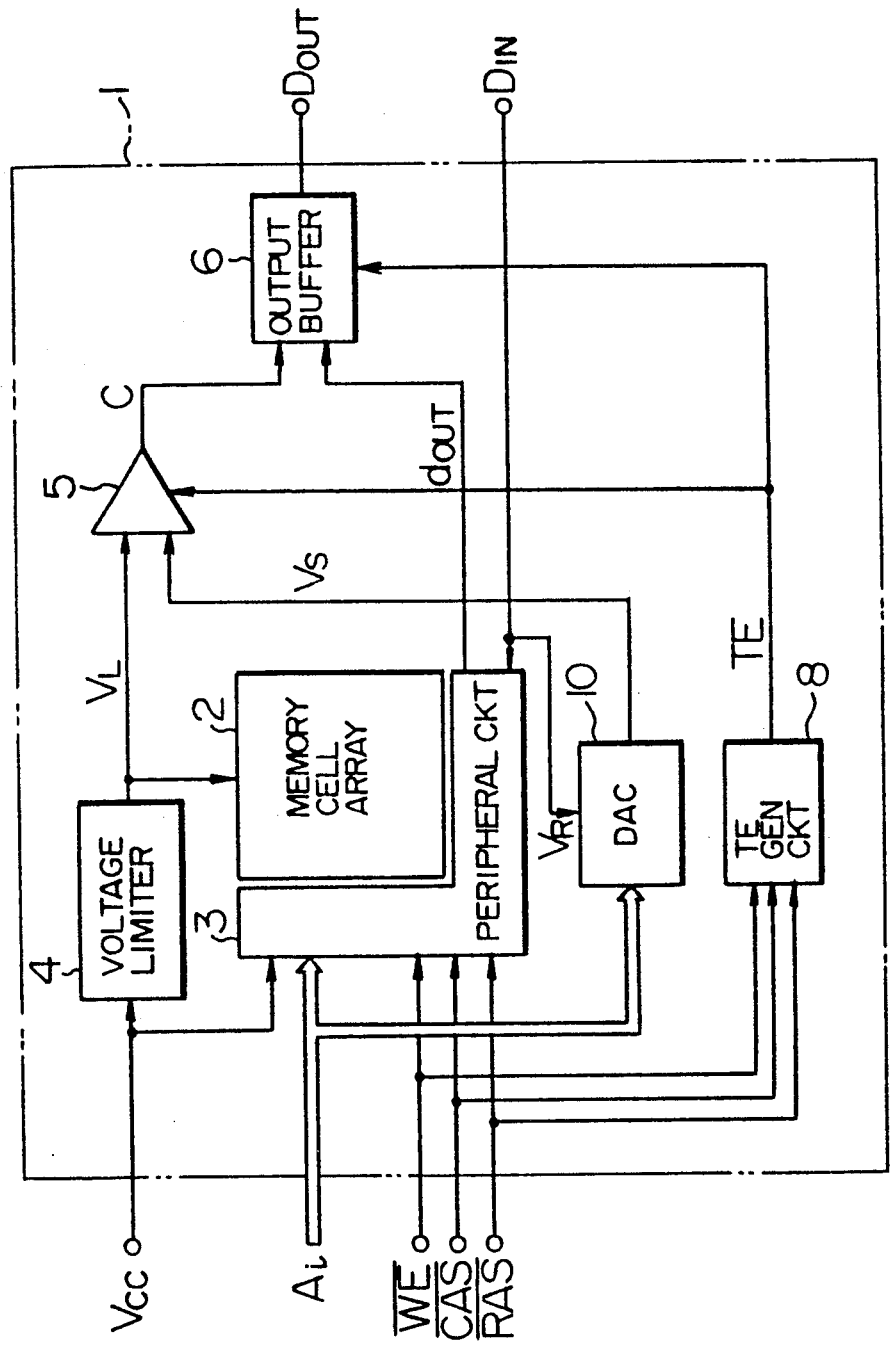
FIG. 57 is a block diagram of a third embodiment of the inspection circuit according to the invention.

FIG. 57 shows a third embodiment of the inspection circuit.

This embodiment differs from the embodiments of FIGS. 52 and 56 in that digital signals for designation of the comparison voltage $V_S$ are converted at a DA converter into an analog signal standing for the comparison voltage $V_S$. In this embodiment, the digital signals $S_0$ to $S_3$ are applied through an address terminal $A_i$ which is used, in essentiality, for application of address signals.

The inputted digital signals are converted at the DA converter 10 into the analog voltage $V_S$. As the reference voltage applied to the DA converter, the $V_{CC}$ may be used but more preferably a dedicated voltage $V_R$ is used to permit measurement of dependency of the internal voltage $V_L$ upon the $V_{CC}$. In this embodiment, the reference voltage $V_R$ is applied through the DRAM data input terminal $D_{in}$ which is used, in essentiality, for application of DRAM data.

This embodiment features that both the input and output signals are digital and therefore test by the memory tester can be facilitated, as compared to the embodiments of FIGS. 52 and 56. Although only one comparison voltage $V_S$ is used in this embodiment, the number of comparison voltage is not limited to one and obviously two comparison voltages may be used as in the FIG. 56 embodiment.

Figure 58B:
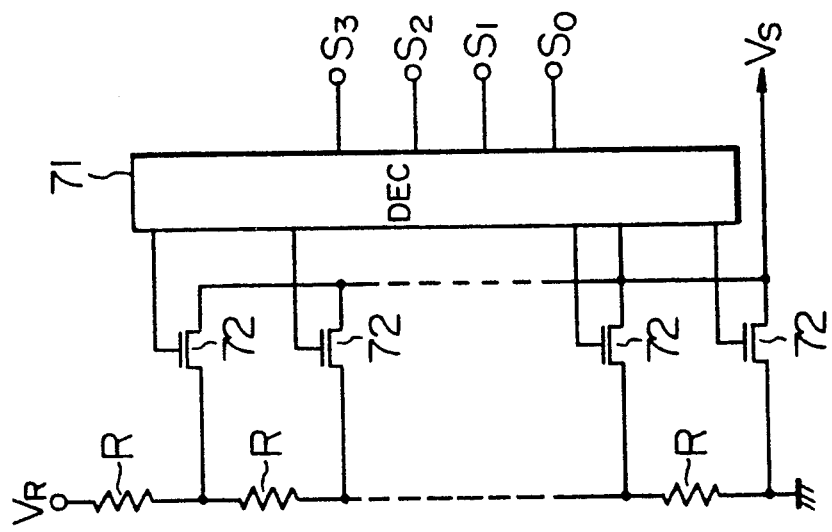
FIG. 58B is a circuit diagram of another embodiment of the DA converter.
Figure 58A:
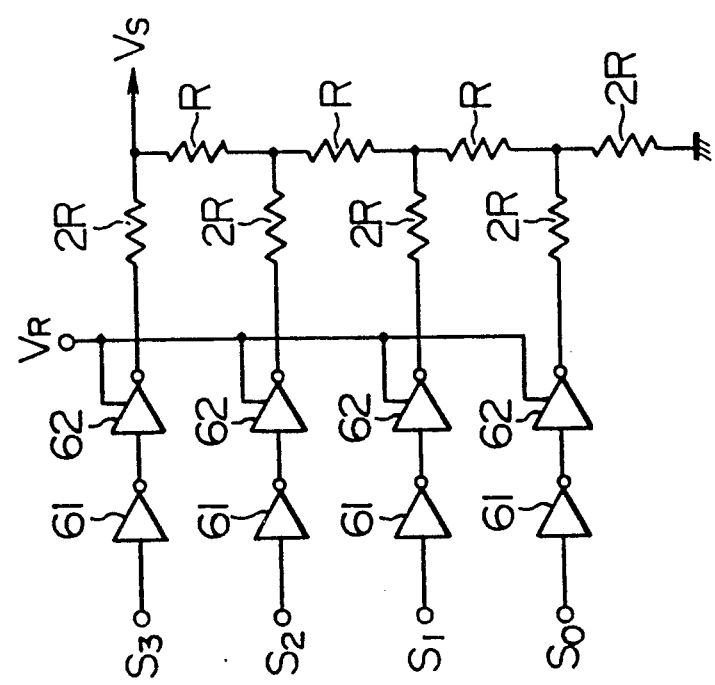
FIG. 58A is a circuit diagram of an embodiment of a DA converter used in the FIG. 57 embodiment.

FIG. 58A shows an embodiment of the DA converter used in the FIG. 57 embodiment. Referring to FIG. 58A, 61 and 62 designate inverters, and R and 2R resistors. The inverters 62 are fed with the reference voltage $V_R$. When the digital bit signals $S_0$ to $S_3$ are applied through the input terminals, the output voltage of each inverter 62 takes $V_R$ or 0 V in accordance with the input digital bit signals and the output voltage $V_S$ of the DA converter is given by $$V_S = \frac{V_R}{16}(8S_3 + 4S_2 + 2S_1 + 1S_0) \tag{24}$$

on the assumption that the output impedance of each inverter 62 is sufficiently smaller than the resistance of the resistors R and 2R.

FIG. 58B shows another embodiment of the DA converter. Referring to FIG. 58B, 71 designates a decoder, 72 MOS transistors and R resistors. In this embodiment, reference voltage $V_R$ is divided by the resistors R to generate divisional voltages given by $$V_i = \frac{i}{16} V_R (i = 0 \sim 15) \tag{25}$$

and one of the divisional voltages is selected to provide the output signal $V_S$. This selection is effected by analog signals $T_0$ to $T_{15}$ decoded from the input digital bit signals $S_0$ to $S_3$ by means of the decoder 71. This circuit features that for the impedance of the load (input impedance of the comparator 5 in FIG. 57) being sufficiently large (the FIG. 54 circuit meets this condition), the output voltage $V_S$ is not affected by on-resistance of each MOS transistor 72.

Both of the DA converters shown in FIGS. 58A and 58B are of 4 bits. Needless to say, the number of bits is determined depending on accuracy of setting of the internal voltage $V_L$ and may be increased or decreased as necessary.

Figure 60:
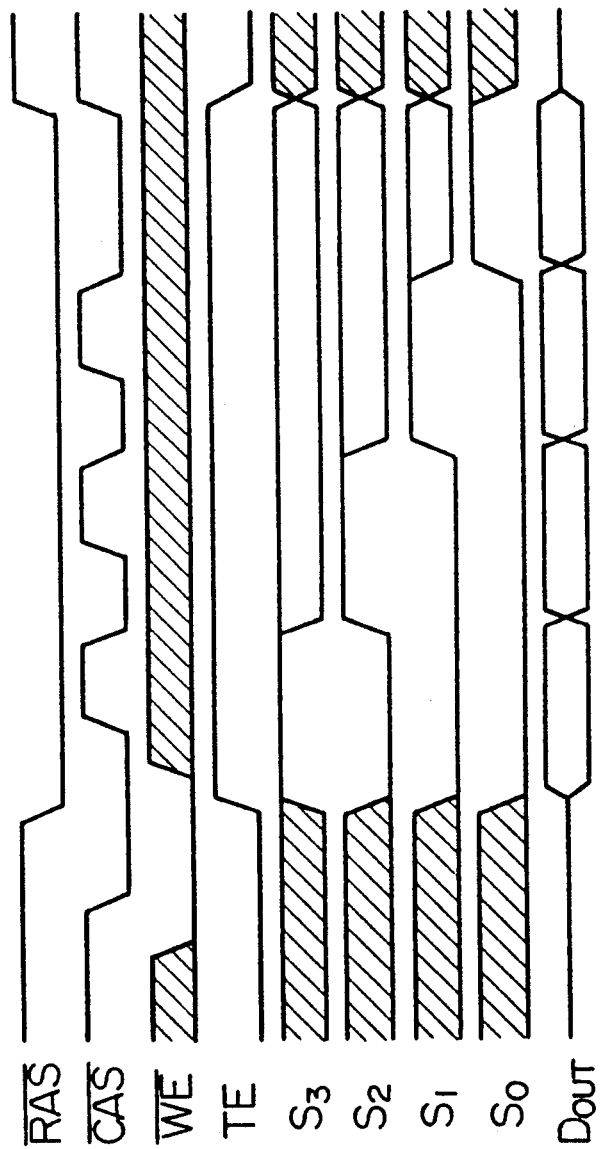
FIG. 60 is a timing chart for explaining the operation of the FIG. 59 embodiment.

FIG. 59 shows a fourth embodiment of the inspection circuit. This embodiment features that the internal voltage $V_L$ is subjected to AD conversion so as to be delivered as digital signal. In this embodiment, a register 80 is provided which stores the digital bit signals $S_0$ to $S_3$. The operation of the FIG. 59 circuit will be described with reference to a timing chart as shown in FIG. 60.

As in the foregoing embodiments, the test enable signal TE is generated in accordance with a combination of timings for application of the $\overline{RAS}$, $\overline{CAS}$ and $\overline{WE}$. At the beginning of the signal TE, the contents of the register 80 is set such that only the most significant bit $S_3$ is "1" and the other bits are "0". At that time, the comparison voltage $V_S$ equals $V_R/2$. Then, the internal voltage $V_L$ is compared with this $V_S$. If $V_L > V_R/2$ and C=1, the most significant bit $S_3$ is kept being "1" but if $V_L < V_R/2$ and C=0, the S is reset to "0".

Subsequently, the bit $S_2$ in the register is set to "1". The comparison voltage $V_S$ equals $V_R/4$ or $3 V_R/4$. Then, the internal voltage $V_L$ is compared with this $V_S$. If C=1, the $S_2$ is kept being "1" and if C=0, the S is reset to "0". Through similar procedures, the bit signals $S_1$ and $S_0$ are sequentially determined.

The above operation is carried out in synchronism with the clock signal. In this embodiment, the $\overline{CAS}$ is used as the clock signal. More particularly, the $\overline{CAS}$ assumes the low level earlier than the $\overline{RAS}$ to designate the $V_L$ inspection mode. This causes the TE to assume the high level. Subsequently, the $\overline{CAS}$ is raised while keeping the $\overline{RAS}$ low so that the above DA conversion may be carried out. Since results of comparison are sequentially delivered to the output terminal $D_{out}$, results of AD conversion can be known by observing the signal at the terminal $D_{out}$.

In accordance with the present embodiment, results of inspection of the internal voltage can be delivered as digital signals to the outside and inspection of the internal voltage can be effected easily from the outside by using the memory tester.

As has been described, the present invention can improve the actual layout of ultra large scale semiconductor integrated circuits and can stabilize characteristics and operation of these circuits.

It is further understood by those skilled in the art that the foregoing description is a preferred embodiment of the disclosed device and that various changes and modifications may be made in the invention without departing from the spirit and scope thereof.

We claim:

1. A semiconductor device having a complementary type metal insulating film semiconductor integrated circuit at least part of which uses a first power supply voltage generated in said semiconductor device, the first power supply voltage being smaller in absolute value than an externally supplied second power supply voltage, said circuit comprising a first MOS transistor of a first conductivity type having a source terminal connected to said first power supply voltage, said first MOS transistor i) being formed in a well area in said semiconductor device to which said first power supply voltage is applied and ii) having a drain terminal connected to at least a drain of a second MOS transistor of a second conductivity type different from the first conductivity type, the second MOS transistor being formed in said semiconductor device outside said well area and having a source terminal connected to a predetermined operating potential.

2. The semiconductor device according to claim 1 further comprising a memory cell array having a plurality of data lines and sense amplifiers, each of said plurality of sense amplifiers comprising at least a pair of said first MOS transistors and at least a pair of said second MOS transistors.

3. The semiconductor device according to claim 2, wherein a precharge voltage of said plurality of data lines of said memory cell array is substantially equal to half said first power supply voltage.

4. The semiconductor device according to claim 2, further comprising a decoder for selecting a memory cell in said memory cell array, said decoder being supplied with said first power supply voltage.

5. The semiconductor device according to claim 4 wherein said decoder is further supplied with said externally supplied second power supply voltage.

6. The semiconductor device according to claim 2, wherein said memory cell array comprises a folded bit line system.

7. The semiconductor device according to claim 2, wherein at least one memory cell of said memory cell array comprises one transistor and one capacitor.

8. The semiconductor device according to claim 1, wherein said first power supply voltage is generated by an internal voltage drop means comprising a differential amplifier.

9. The semiconductor device according to claim 1 wherein said first MOS transistor includes a gate terminal connected to said gate terminal of said second MOS transistor.

10. A semiconductor device comprising:
a first pair of MOS transistors of a first conductivity type, each of the pair having a source terminal connected to a first power supply voltage, a drain terminal, and a gate terminal, and each being formed in a well area of said semiconductor device to which said first power supply voltage is applied, said first power supply voltage being of a magnitude less than that of an externally supplied second supply voltage, the gate terminals and the drain terminals of said first pair of MOS transistors being connected in a cross-coupled configuration; and,
a second pair of MOS transistors of a second conductivity type formed in said semiconductor device outside said well area, each of said second pair having a drain terminal, a gate terminal, and a source terminal connected to a predetermined operating potential, the gate terminals and the drain terminals of said second pair of MOS transistors being connected in a cross-coupled configuration, the drain terminal of one of said second pair of MOS transistors being connected to the drain terminal of one of said first pair of MOS transistors, and the drain terminal of the other of said second pair of MOS transistors being connected to the drain terminal of the other of said first pair of MOS transistors.

11. The semiconductor device according to claim 10 wherein said first pair of MOS transistors comprise P-channel MOS transistors and said second pair of MOS transistors comprise N-channel MOS transistors.

12. The semiconductor device according to claim 11 wherein said well area comprises and N-type well area of the P-channel MOS transistors.

13. The semiconductor device according to claim 9 further comprising means for generating the first supply voltage in the device at magnitude less than the magnitude of the second supply voltage.

14. The semiconductor device according to claim 13 wherein said first pair of MOS transistors comprise P-channel MOS transistors and said second pair of MOS transistors comprise N-channel MOS transistors.

15. The semiconductor device according to claim 14 wherein said well area comprises an N-type well area of the P-channel MOS transistors.

16. A semiconductor apparatus comprising:
a well area formed in said semiconductor apparatus, the well area being of a first conductivity type, the well area being supplied with a first voltage, the first voltage being of a magnitude less than that of a second voltage supplied externally;
a first pair of MOS transistors of a second conductivity type including a first MOS transistor and a second MOS transistor, each of the first pair having a source terminal connected to the first voltage, a drain terminal and a gate terminal, and each being formed in said well area of said semiconductor apparatus, the gate terminal of the first MOS transistor being connected to the drain terminal of the second MOS transistor and the gate terminal of the second MOS transistor being connected to the drain terminal of the first MOS transistor; and,
a second pair of MOS transistors of said first conductivity type including a third MOS transistor and a fourth MOS transistor, each of the second pair having a source terminal connected to a predetermined potential, a drain terminal and a gate terminal, and each being formed in said semiconductor apparatus outside said well area, the gate terminal of the third MOS transistor being connected to the drain terminals of the fourth and second MOS transistors and the gate terminal of the fourth MOS transistor being connected to the drain terminals of the third and first MOS transistors.

17. The semiconductor apparatus according to claim 16 wherein said first pair of MOS transistors comprise P-channel MOS transistors and said second pair of MOS transistors comprise N-channel MOS transistors.

18. The semiconductor apparatus according to claim 17 wherein said well area comprises an N-type well area of the P-channel MOS transistors.

19. The semiconductor apparatus according to claim 16 further comprising means for generating the first voltage from the second voltage.

20. The semiconductor apparatus according to claim 19 wherein said first pair of MOS transistors comprise P-channel MOS transistors and said second pair of MOS transistors comprise N-channel MOS transistors.

21. The semiconductor apparatus according to claim 20 wherein said well area comprises an N-type well area of the P-channel MOS transistors.

* * * * *

UNITED STATES PATENT AND TRADEMARK OFFICE
CERTIFICATE OF CORRECTION

PATENT NO. : 5,179,539
DATED : Jan. 12, 1993
INVENTOR(S) : Masashi Horiguchi, et al It is certified that error appears in the above-indentified patent and that said Letters Patent is hereby corrected as shown below:

The drawing sheet, consisting of Fig. 44, should be deleted to be replaced with the drawing sheet, consisting of Fig. 44, as shown on the attached page.

Signed and Sealed this

Third Day of May, 1994

*Attest:*

BRUCE LEHMAN

*Attesting Officer*     *Commissioner of Patents and Trademarks*

FIG. 44

| ADDR SIGNAL | $a_i$ | "0" | "1" |
|---|---|---|---|
| | $\overline{a_i}$ | "1" | "0" |
| $\phi_t$ | | ⊓ --Vcc | ⊓ --Vcc |
| $\phi_p{}^1, \phi_p{}^3$ | | ⊓ --V_L  0 | ——— 0 |
| $\phi_p{}^2, \phi_p{}^4$ | | ——— 0 | ⊓ --V_L  0 |